(12) United States Patent
Lee et al.

(10) Patent No.: US 10,685,960 B2
(45) Date of Patent: Jun. 16, 2020

(54) INTEGRATED CIRCUIT DEVICE

(71) Applicant: Samsung Electronics Co., Ltd., Suwon-si, Gyeonggi-do (KR)

(72) Inventors: Min-seong Lee, Hwaseong-si (KR); Ju-youn Kim, Suwon-si (KR); Ji-hoon Yoon, Seoul (KR); Il-ryong Kim, Seongnam-si (KR); Kyoung-hwan Yeo, Seoul (KR); Jae-yup Chung, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/168,046

(22) Filed: Oct. 23, 2018

(65) Prior Publication Data

US 2019/0312034 A1    Oct. 10, 2019

(30) Foreign Application Priority Data

Apr. 10, 2018  (KR) .......................... 10-2018-0041718

(51) Int. Cl.
*H01L 27/092* (2006.01)
*H01L 29/78* (2006.01)
*H01L 29/66* (2006.01)
*H01L 29/51* (2006.01)
*H01L 29/06* (2006.01)
(Continued)

(52) U.S. Cl.
CPC .. *H01L 27/0924* (2013.01); *H01L 21/823821* (2013.01); *H01L 21/823878* (2013.01); *H01L 29/0649* (2013.01); *H01L 29/4966* (2013.01); *H01L 29/517* (2013.01); *H01L 29/6656* (2013.01); *H01L 29/66545* (2013.01); *H01L 29/7851* (2013.01)

(58) Field of Classification Search
CPC ............ H01L 27/0924; H01L 29/7851; H01L 29/66545; H01L 29/517; H01L 29/0649; H01L 21/823878; H01L 21/823821; H01L 29/6656; H01L 29/4966; H01L 21/823481
See application file for complete search history.

(56) References Cited

U.S. PATENT DOCUMENTS 8,878,309 B1 * 11/2014  Hong .............. H01L 21/823481
257/401
9,337,190 B2    5/2016  Fung
(Continued)

*Primary Examiner* — Victor A Mandala
(74) *Attorney, Agent, or Firm* — Harness, Dickey & Pierce, P.L.C.

(57) ABSTRACT

An integrated circuit device includes a first fin separation insulating portion over the first device region; a pair of first fin-type active regions apart from each other with the first fin separation insulating portion therebetween and collinearly extending in a first horizontal direction; a first dummy gate structure vertically overlapping the first fin separation insulating portion; a second fin separation insulating portion apart from the first fin separation insulating portion and arranged over the second device region; and a plurality of second fin-type active regions apart from each other with the second fin separation insulating portion therebetween in the second device region and collinearly extending in the first horizontal direction, wherein a vertical level of a lowermost surface of the second fin separation insulating portion is equal to or lower than a vertical level of a lowermost surface of the first fin separation insulating portion.

20 Claims, 63 Drawing Sheets

US 10,685,960 B2

Page 2

(51) Int. Cl.
*H01L 21/8238* (2006.01)
*H01L 29/49* (2006.01)

(56) References Cited

U.S. PATENT DOCUMENTS

| | | | |
|---|---|---|---|
| 9,412,616 B1* | 8/2016 | Xie | H01L 21/76224 |
| 9,865,704 B2 | 1/2018 | Xie et al. | |
| 10,115,722 B2* | 10/2018 | Oh | H01L 21/823821 |
| 10,128,143 B2* | 11/2018 | Tanabe | C08K 5/56 |
| 2015/0054089 A1* | 2/2015 | Hong | H01L 21/762 |
| | | | 257/401 |
| 2016/0254180 A1* | 9/2016 | Liu | H01L 27/0924 |
| | | | 257/369 |
| 2017/0062475 A1 | 3/2017 | Song et al. | |
| 2017/0200651 A1* | 7/2017 | Lee | H01L 21/823481 |
| 2017/0338229 A1 | 11/2017 | Oh et al. | |
| 2018/0006035 A1 | 1/2018 | Yuan et al. | |
| 2019/0221469 A1* | 7/2019 | Hsu | H01L 21/76224 |
| 2019/0312130 A1* | 10/2019 | Lee | H01L 21/823481 |

* cited by examiner

X2 - X2'

X2 - X2'

X2 - X2'

X1 – X1'

X2 – X2'

INTEGRATED CIRCUIT DEVICE

CROSS-REFERENCE TO RELATED APPLICATION

This application claims the benefit of Korean Patent Application No. 10-2018-0041718, filed on Apr. 10, 2018, in the Korean Intellectual Property Office, the disclosure of which is incorporated herein in its entirety by reference.

BACKGROUND

Inventive concepts relate to an integrated circuit device, and more particularly, to an integrated circuit device including a fin field-effect transistor.

Recently, as down-scaling of integrated circuit devices rapidly progresses, the necessity for obtaining not only high operation speed but also operational accuracy in integrated circuit devices has increased. Accordingly, various studies for providing an integrated circuit device having an optimized structure capable of implementing an integrated circuit device including a transistor providing improved performance have been conducted.

SUMMARY

Inventive concepts provides an integrated circuit device having a structure in which improved performance may be provided according to each channel type in transistors even though the area of a device region is reduced according to down-scaling of the integrated circuit device.

According to some example embodiments of inventive concepts, there is provided an integrated circuit device including a substrate comprising a first device region and a second device region, a first fin separation insulating portion over the first device region, a pair of first fin-type active regions spaced apart from each other in the first device region, with the first fin separation insulating portion therebetween, a first element of the pair of first fin-type active regions collinearly extending in a first horizontal direction with a second element of the pair of first fin-type active regions, a first dummy gate structure covering an upper surface of the first fin separation insulating portion to vertically overlap the first fin separation insulating portion, and extending in a second horizontal direction over the first device region, the second horizontal direction crossing the first horizontal direction, a second fin separation insulating portion spaced apart from the first fin separation insulating portion and arranged over the second device region, and collinearly extending with the first dummy gate structure in the second horizontal direction, and a plurality of second fin-type active regions spaced apart from each other in the second device region with the second fin separation insulating portion therebetween, the plurality of second fin-type active regions collinearly extending in the first horizontal direction. A vertical level of a lowermost surface of the second fin separation insulating portion is equal to or lower than a vertical level of a lowermost surface of the first fin separation insulating portion.

According to some example embodiments of inventive concepts, there is provided an integrated circuit device including a substrate comprising a first device region and a second device region, a first fin separation insulating portion in the first device region, a pair of first fin-type active regions apart from each other in the first device region with the first fin separation insulating portion therebetween, one element of the pair of first fin-type active regions collinearly extending in a first horizontal direction with the other element of the pair of first fin-type active regions, a plurality of dummy gate structures extending parallel to each other in a second horizontal direction over the first fin separation insulating portion, the second horizontal direction crossing the first horizontal direction, at least one second fin separation insulating portion spaced apart from the first fin separation insulating portion and arranged over the second device region, and a plurality of second fin-type active regions apart from each other in the second device region with the at least one second fin separation insulating portion therebetween and collinearly extending in the first horizontal direction. A vertical level of a lowermost surface of the at least one second fin separation insulating portion is equal to or lower than a vertical level of a lowermost surface of the first fin separation insulating portion.

According to some example embodiments of inventive concepts, there is provided an integrated circuit device including a substrate comprising a first device region and a second device region spaced apart from each other, a device isolation region between the first device region and the second device region, a first fin separation insulating portion over the first device region, a plurality of pairs of first fin-type active regions in the first device region, each of the plurality of pairs of first fin-type active regions including a first member and a second member, each of the plurality of pairs of first fin-type active regions vertically protruding from the substrate at the first device region, and each of the plurality of pairs of first fin-type active regions having the first member apart from second member with the first fin separation insulating portion therebetween, each of the plurality of pairs having the first member collinearly extending with the second member in a first horizontal direction, a plurality of second fin separation insulating portions extending in a second horizontal direction over the second device region and spaced apart from each other, wherein the second horizontal direction crosses the first horizontal direction, and a plurality of second fin-type active regions vertically protruding from the substrate at the second device region and arranged in a straight line extending in the first horizontal direction across the plurality of second fin separation insulating portions. A vertical level of a lowermost surface of the plurality of second fin separation insulating portions is equal to or lower than a vertical level of a lowermost surface of the first fin separation insulating portion.

BRIEF DESCRIPTION OF THE DRAWINGS

Embodiments of inventive concepts will be more clearly understood from the following detailed description taken in conjunction with the accompanying drawings in which:

FIGS. 7A to 17D are cross-sectional views according to a process sequence, for explaining a method of manufacturing an integrated circuit device, according to some example embodiments, in which each of FIGS. 7A, 8A, 9A, 10A, 11A, 12A, 13A, 14A, 15A, 16A, FIG. 17D is a cross-sectional view according to a process sequence of a portion corresponding to a cross-section taken along line Y2-Y2' of FIG. 1;

DETAILED DESCRIPTION OF EXAMPLE EMBODIMENTS

Figure 1:
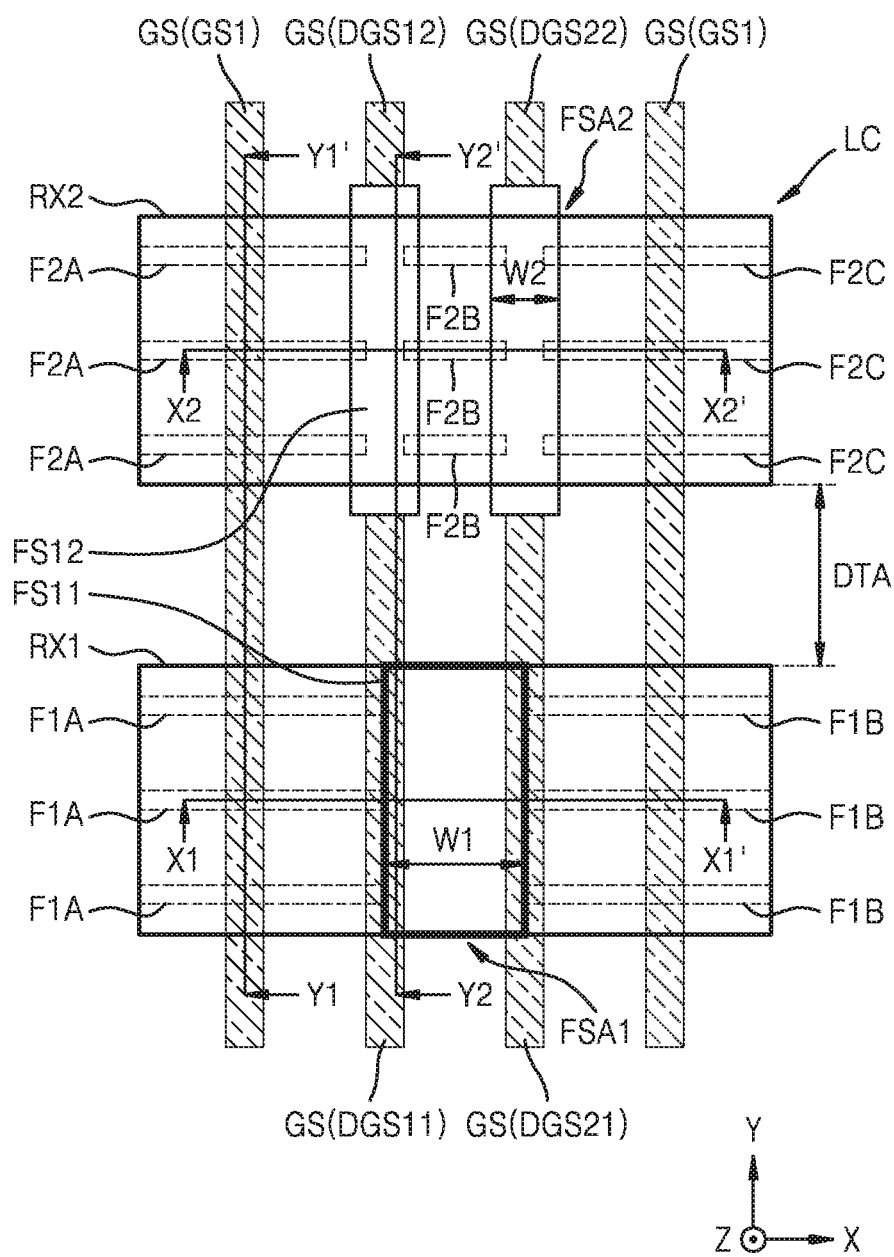
FIG. 1 is a plan layout diagram for explaining an integrated circuit device according to some example embodiments.

Hereinafter, example embodiments will be described in detail with reference to the accompanying drawings. In the drawings, like elements are denoted by like reference numerals, and a repeated description thereof is omitted below.

Figure 2A:
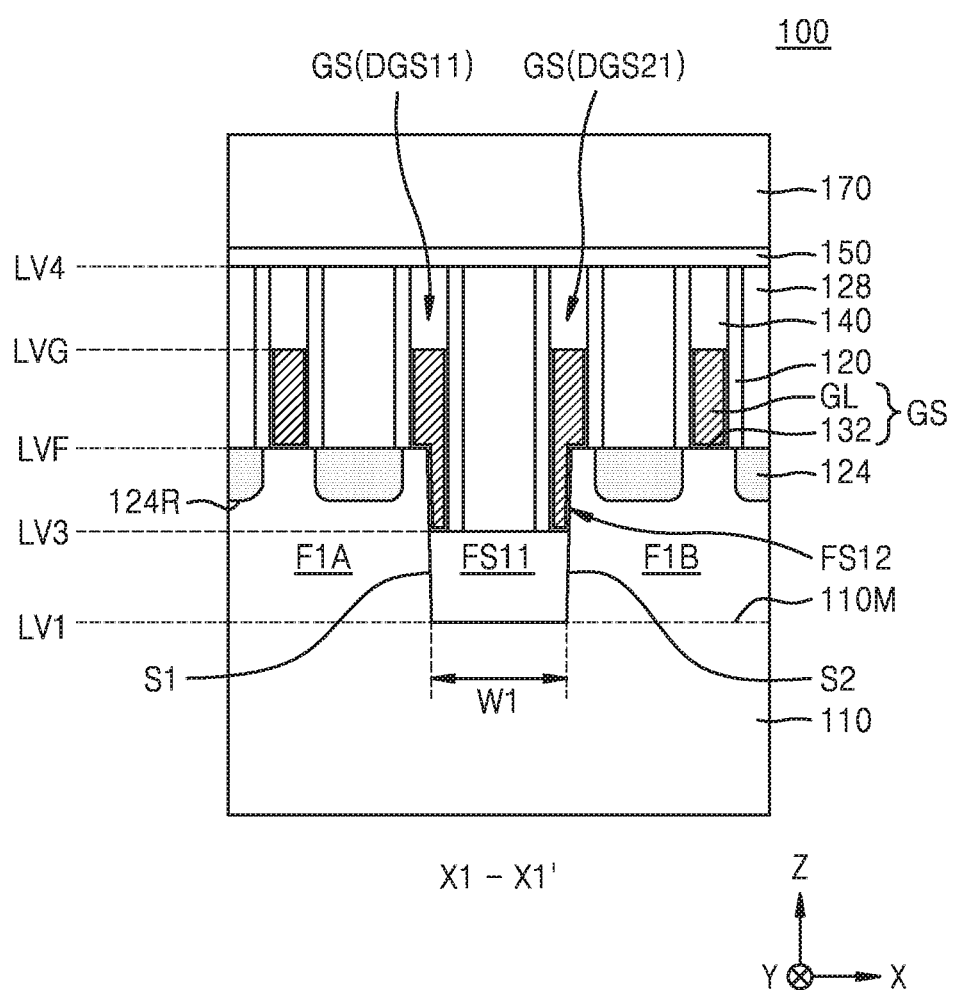
FIG. 2A is a cross-sectional view taken along line X1-X1' of FIG. 1.
Figure 2B:
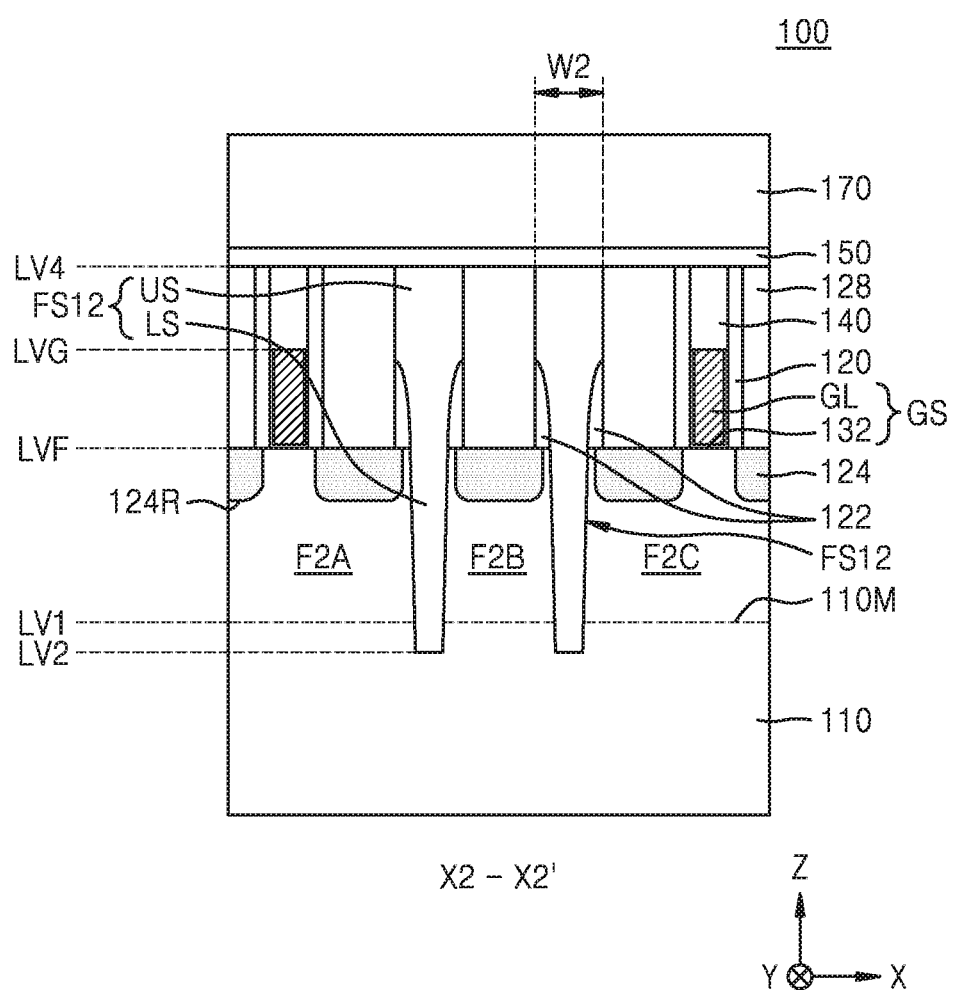
FIG. 2B is a cross-sectional view taken along line X2-X2' of FIG. 1.
Figure 2C:
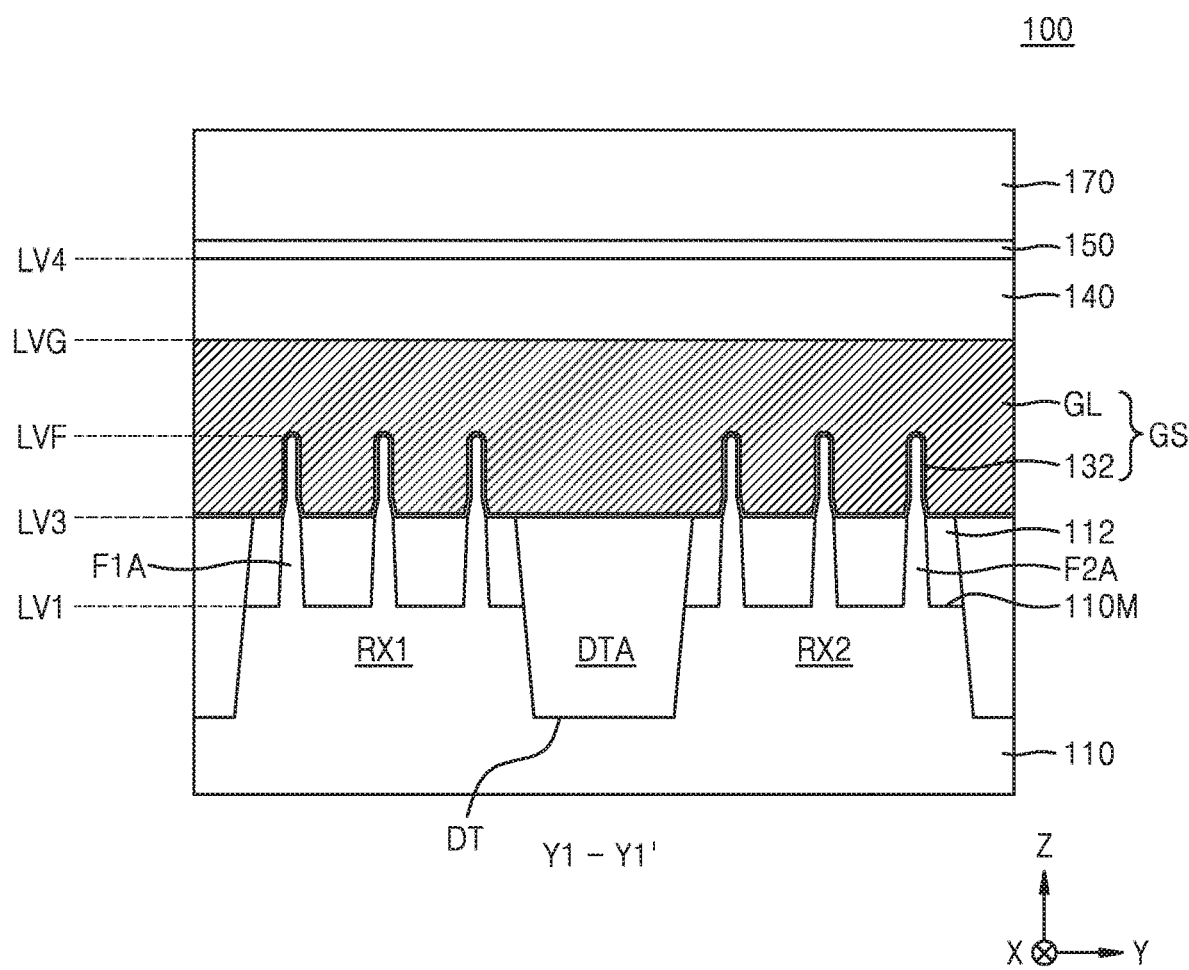
FIG. 2C is a cross-sectional view taken along line Y1-Y1' of FIG. 1.
Figure 2D:
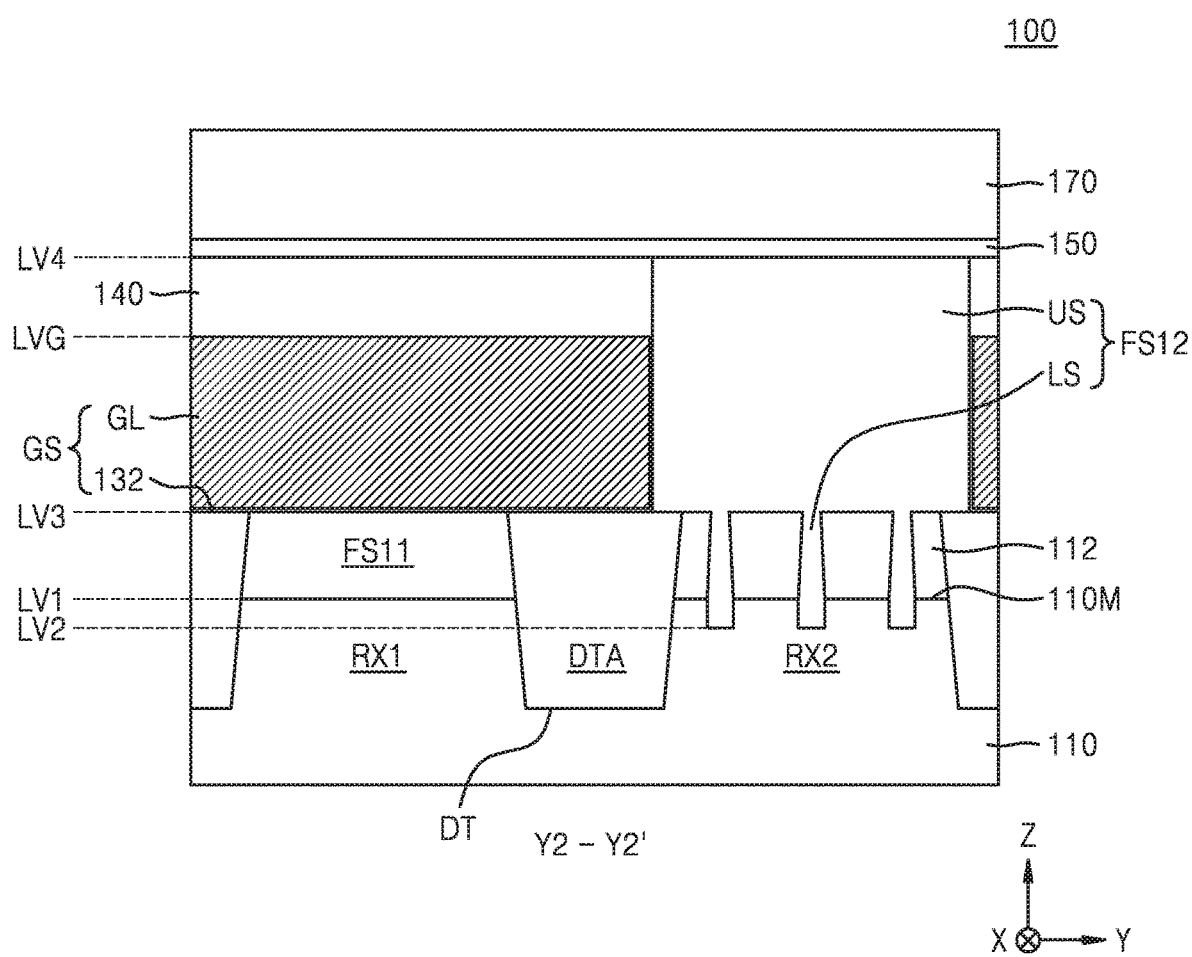
FIG. 2D is a cross-sectional view taken along line Y2-Y2' of FIG. 1.

FIGS. 1 to 2D are diagrams for explaining an integrated circuit device 100 according to some example embodiments. FIG. 1 is a plan layout diagram illustrating major components of the integrated circuit device 100, FIG. 2A is a cross-sectional view taken along line X1-X1' of FIG. 1, FIG. 2B is a cross-sectional view taken along line X2-X2' of FIG. 1, FIG. 2C is a cross-sectional view taken along line Y1-Y1' of FIG. 1, and FIG. 2D is a cross-sectional view taken along line Y2-Y2' of FIG. 1. The integrated circuit device 100 may configure a logic cell including a fin field-effect transistor (FinFET).

Referring to FIGS. 1 to 2D, the integrated circuit device 100 includes a logic cell LC on a substrate 110.

The substrate 110 may have a main surface 110M extending in a horizontal direction (an X-Y plane direction) at a vertical level LV1. The substrate 110 may include a semiconductor such as Si or Ge, or a compound semiconductor such as SiGe, SiC, GaAs, InAs, or InP; however, inventive concepts are not limited thereto. The substrate 110 may include a conductive region, for example, a well doped with impurities, and/or a structure doped with impurities.

The logic cell LC may include a first device region RX1 and a second device region RX2. In the first device region RX1, there are a plurality of first fin-type active regions F1A and F1B vertically protruding from the substrate 110. In the second device region RX2, there are a plurality of second fin-type active regions F2A, F2B, and F2C vertically protruding from the substrate 110. Between the first device region RX1 and the second device region RX2, there may be a deep trench DT in the substrate 110, and in the deep trench DT, there may be a device isolation region DTA. The plurality of first fin-type active regions F1A and F1B and the plurality of second fin-type active regions F2A, F2B, and F2C may extend parallel to each other in a width direction (X direction) of the logic cell LC.

On the first device region RX1 and the second device region RX2, there may be a device isolation film 112 between each of the plurality of first fin-type active regions F1A and F1B and between each of the plurality of second fin-type active regions F2A, F2B, and F2C. The device isolation film 112 may cover both side walls of each of the plurality of first fin-type active regions F1A and F1B and both side walls of each of the plurality of second fin-type active regions F2A, F2B, and F2C. The plurality of first fin-type active regions F1A and F1B and the plurality of second fin-type active regions F2A, F2B, and F2C may protrude above the device isolation film 112.

A first fin separation insulating portion FS11 may be arranged over the first device region RX1. In some example embodiments, the first fin separation insulating portion FS11 may be a portion of the device isolation film 112. The first fin separation insulating portion FS11 may have a first width W1 in the X direction.

In some example embodiments, the device isolation film 112, the device isolation area DTA and the first fin separation insulating portion FS11 may include the same insulating material as one another. For example, the device isolation film 112, the device isolation area DTA and the first fin separation insulating portion FS11 may each include a silicon oxide film, but inventive concepts are not limited thereto.

In the first device region RX1, the plurality of first fin-type active regions F1A and F1B may include a pair of first fin-type active regions F1A and F1B apart from each other with the first fin separation insulating portion FS11 therebetween and collinearly extending in the X direction.

A plurality of second fin separation insulating portions FS12 spaced apart from each other may be arranged over the second device region RX2. The plurality of second fin separation insulating portions FS12 may extend long over the second device region RX2 in a height direction (Y direction) of the logic cell LC. The plurality of second fin separation insulating portions FS12 may each have a second width W2 in the X direction, which is less than the first width W1. In the X direction, the second width W2 may be greater than a maximum width of a gate structure GS. Although FIG. 1 illustrates the plurality of second fin separation insulating portions FS12 having substantially identical widths in the X direction, inventive concepts are not limited thereto. The plurality of second fin separation insulating portions FS12 may have different widths from each other. Although FIG. 1 illustrates the plurality of second fin separation insulating portions FS12 having substantially identical lengths in the Y direction, inventive concepts are not limited thereto. In some example embodiments, the plurality of second fin separation insulating portions FS12 may have different lengths from each other in the Y direction.

In the second device region RX2, the plurality of second fin-type active regions F2A, F2B, and F2C may include three second fin-type active regions F2A, F2B, and F2C arranged in a straight line, e.g. collinearly extending in the X direction across the plurality of second fin separation insulating portions FS12. From among the three second fin-type active regions F2A, F2B, and F2C, one pair of neighboring second fin-type active regions F2A and F2B and one pair of neighboring second fin-type active regions F2B and F2C may each be spaced apart from each other with one second fin separation insulating portion FS12 therebetween. On the second device region RX2, the plurality of second fin separation insulating portions FS12 may each extend between a pair of second fin-type active regions F2A and F2B or a pair of second fin-type active regions F2B and F2C.

The second fin separation insulating portion FS12 may include an upper insulating portion US and a lower insulating portion LS integrally connected to each other. The upper insulating portion US may extend long over the second device region RX2 in the Y direction. The lower insulating portion LS may protrude from the upper insulating portion US toward the substrate 110. The lower insulating portion LS of the second fin separation insulating portion FS12 may be between a pair of second fin-type active regions F2A and F2B or between a pair of second fin-type active regions F2B and F2C.

The first fin separation insulating portion FS11 and the second fin separation insulating portion FS12 may be spaced apart from each other with the device isolation region DTA therebetween and may face each other. The first fin separation insulating portion FS11 may include a first side wall S1 and a second side wall S2 facing opposite sides to each other in the X direction. On the first device region RX1, the first side wall S1 of the first fin separation insulating portion FS11 may contact one first fin-type active region F1A from among the pair of first fin-type active regions F1A and F1B, and the second side wall S2 of the first fin separation insulating portion FS11 may contact the other first fin-type active region F1B from among the pair of first fin-type active regions F1A and F1B.

A vertical length (a length in the Z direction) of each of the plurality of second fin separation insulating portions FS12 may be greater than a vertical length of the first fin separation insulating portion FS11. A lowermost surface vertical level of the first fin separation insulating portion FS11 may be substantially the same as the vertical level LV1 of the main surface 110M of the substrate 110. However, inventive concepts are not limited thereto. In some example embodiments, the lowermost surface vertical level of the first fin separation insulating portion FS11 may be lower or higher than the vertical level LV1 of the main surface 110M of the substrate 110. The term "vertical level" used herein refers to a length in a vertical direction, for example, direction ±Z, with respect to the main surface 110M of the substrate 110.

A lowermost surface vertical level LV2 of the second fin separation insulating portion FS12 may be lower than the lowermost surface vertical level LV1 of the first fin separation insulating portion FS11 and may be lower than a lowermost surface vertical level of the plurality of second fin-type active regions F2A, F2B, and F2C. An uppermost surface vertical level LV3 of the first fin separation insulating portion FS11 and an uppermost surface vertical level LV4 of the second fin separation insulating portion FS12 may be different from each other. In some example embodiments, the uppermost surface vertical level LV4 of the second fin separation insulating portion FS12 may be higher than the uppermost surface vertical level LV3 of the first fin separation insulating portion FS11. The uppermost surface vertical level LV3 of the first fin separation insulating portion FS11 may be substantially the same as an uppermost surface vertical level of the device isolation film 112. The uppermost surface vertical level LV3 of the first fin separation insulating portion FS11 may be lower than an uppermost surface vertical level LVF of a pair of first fin-type active regions F1A and F1B, and the uppermost surface vertical level LV4 of the second fin separation insulating portion FS12 may be higher than the uppermost surface vertical level LVF of the pair of first fin-type active regions F1A and F1B.

A plurality of gate structures GS may extend long over the substrate 110 in the Y direction. The plurality of gate structures GS may respectively have identical widths in the X direction and may be arranged at regular pitches in the X direction. The uppermost surface vertical level LV4 of the second fin separation insulating portion FS12 may be higher than an uppermost surface vertical level LVG of the plurality of gate structures GS.

The plurality of gate structures GS may include a normal gate structure GS1 extending long, or extending along, over the first device region RX1, the device isolation region DTA, and the second device region RX2 in the Y direction. The second fin separation insulating portion FS12 may extend parallel to the normal gate structure GS1 over the first device region RX1, the device isolation region DTA, and the second device region RX2.

On the first device region RX1 and the second device region RX2, the normal gate structure GS1 of the plurality of gate structures GS may cover an upper surface and both side walls of each of the plurality of first fin-type active regions F1A and F1B and the plurality of second fin-type active regions F2A, F2B, and F2C and an upper surface of the device isolation film 112. In the first device region RX1 and the second device region RX2, there may be a plurality of MOS transistors along a plurality of normal gate structures GS1. The plurality of MOS transistors may be or include three-dimensional MOS transistors in which a channel is formed at an upper surface and both side walls of each of the plurality of first fin-type active regions F1A and F1B and the plurality of second fin-type active regions F2A, F2B, and F2C. In some example embodiments, the first device region RX1 may be an NMOS transistor region, and the plurality of first fin-type active regions F1A and F1B may include an N-type channel region. The second device region RX2 may be a PMOS transistor region, and the plurality of second fin-type active regions F2A, F2B, and F2C may include a P-type channel region. However, inventive concepts are not limited thereto, and various modifications and changes may be made therein. For example, the first device region RX1 may be a PMOS transistor region, and the second device region RX2 may be an NMOS transistor region.

The plurality of gate structures GS may include one pair of dummy gate structures DGS11 and DGS12 and one pair of dummy gate structures DGS21 and DGS22 each apart from each other in the Y direction with the second fin separation insulating portion FS12 therebetween. The pair of dummy gate structures DGS11 and DGS12 and the pair of dummy gate structures DGS21 and DGS22 may each collinearly extend along with the second fin separation insulating portion FS12 in the Y direction. Over the first device region RX1, a plurality of dummy gate structures DGS11 and DGS21 may cover an upper surface of the first fin separation insulating portion FS11 and may vertically overlap the first fin separation insulating portion FS11. The plurality of dummy gate structures DGS11 and DGS21 covering the upper surface of the first fin separation insulating portion FS11 may include a portion vertically overlapping the first fin separation insulating portion FS11 and a portion vertically overlapping one of the pair of first fin-type active regions F1A and F1B. A vertical length (a length in the Z direction) of the portion vertically overlapping the first fin separation insulating portion FS11 may be greater than that of the portion vertically overlapping one of the pair of first fin-type active regions F1A and F1B. The plurality of second fin separation insulating portions FS12 may each contact one dummy gate structure DGS11 or DGS21 selected from the plurality of dummy gate structures DGS11 and DGS21. In the plurality of gate structures GS, the normal gate structure GS1 and the dummy gate structures DGS11, DGS12, DGS21, and DGS22 may include the same material as each other. In some example embodiments, the normal gate structure GS1 and the dummy gate structures DGS11, DGS12, DGS21, and DGS22 may include the same metal as each other and may have substantially the same stack structure as each other. However, the dummy gate structures DGS11, DGS12, DGS21, and DGS22 may maintain an electric floating state during an operation of the integrated circuit device 100.

The plurality of gate structures GS may each have a stack structure of a gate insulating film 132 and a gate line GL. The gate insulating film 132 may cover a bottom surface and both side walls of the gate line GL. The gate insulating film 132 may include a silicon oxide film, a high k dielectric film, or a combination thereof. The high k dielectric film may include a material having a dielectric constant that is greater than that of a silicon oxide film. The high k dielectric film may include a metal oxide or a metal oxynitride. There may be an interface film (not shown) between first fin-type active regions F1A and F1B in the first device region RX1 and the gate insulating film 132 and between second fin-type active regions F2A, F2B, and F2C in the second device region RX2 and the gate insulating film 132. The interface film may include an oxide film, a nitride film, or an oxynitride film.

A plurality of gate lines GL may have a structure in which a metal nitride layer, a metal layer, a conductive capping layer, and a gap-fill metal film are stacked in this stated order. The metal nitride layer and the metal layer may include at least one metal selected from Ti, Ta, W, Ru, Nb, Mo, and Hf. The gap-fill metal film may include a W film and/or an Al film. The plurality of gate lines GL may each include a work function metal containing layer. The work function metal containing layer may include at least one metal selected from Ti, W, Ru, Nb, Mo, Hf, Ni, Co, Pt, Yb, Tb, Dy, Er, and Pd. In some example embodiments, the plurality of gate lines GL may each include a stack structure of TiAlC/TiN/W, a stack structure of TiN/TaN/TiAlC/TiN/W, or a stack structure of TiN/TaN/TiN/TiAlC/TiN/W, but inventive concepts are not limited thereto.

An upper surface of each of the plurality of gate structures GS may be covered by a gate insulating capping layer 140. The gate insulating capping layer 140 may include a silicon nitride film.

A plurality of first insulating spacers 120 may cover both side walls of each of the plurality of gate structures GS. The plurality of first insulating spacers 120 may extend long in a line shape in the Y direction, together with the plurality of gate structures GS. A plurality of second insulating spacers 122 may cover both side walls of each of the plurality of second fin separation insulating portions FS12. The plurality of second insulating spacers 122 may extend long in a line shape in the Y direction, together with the plurality of second fin separation insulating portions FS12. The plurality of first insulating spacers 120 and the plurality of second insulating spacers 122 may include a silicon nitride, a SiOCN film, a SiCN film, or a combination thereof.

A vertical length (e.g. a length in the Z direction) of the plurality of second insulating spacers 122 may be less than that of the plurality of first insulating spacers 120. A vertical level of an uppermost surface of the plurality of second insulating spacers 122 may be lower than that of an uppermost surface of the plurality of first insulating spacers 120.

In the first device region RX1 and the second device region RX2, there may be a plurality of recesses 124R in the plurality of first fin-type active regions F1A and F1B and the plurality of second fin-type active regions F2A, F2B, and F2C. The plurality of recesses 124R may be filled with a plurality of source/drain regions 124. The plurality of source/drain regions 124 may include a semiconductor layer grown epitaxially from a surface of each of the plurality of first fin-type active regions F1A and F1B and the plurality of second fin-type active regions F2A, F2B, and F2C included in inner walls of the plurality of recesses 124R. In some example embodiments, the plurality of source/drain regions 124 may include a plurality of epitaxially grown SiGe layers, an epitaxially grown Si layer, and/or an epitaxially grown SiC layer. In some example embodiments, the plurality of source/drain regions 124 on the first device region RX1 may include an epitaxially grown Si layer, or an epitaxially grown SiC layer. In some example embodiments, the plurality of source/drain regions 124 on the second device region RX2 may include a plurality of epitaxially grown SiGe layers.

An inter-gate insulating film 128 may be in each of between the plurality of gate structures GS, between two neighboring second fin separation insulating portion FS12, and between the gate structure GS and the second fin separation insulating portion FS12. The plurality of source/drain regions 124 may be covered by the inter-gate insulating film 128. The inter-gate insulating film 128 may include a portion that contacts an upper surface of the first fin separation insulating portion FS11. The inter-gate insulating film 128 may include a silicon oxide film.

An upper insulating capping layer 150 may extend parallel to the main surface 110M of the substrate 110 to cover a plurality of gate insulating capping layers 140, the plurality of first insulating spacers 120, the plurality of second fin separation insulating portions FS12, and the inter-gate insulating film 128. The upper insulating capping layer 150 may include a silicon oxide film, a silicon nitride film, a polysilicon film, or a combination thereof. An interlayer insulation film 170 may be on the upper insulating capping layer 150. The interlayer insulation film 170 may include a silicon oxide film, a silicon nitride film, or a combination thereof.

Although FIGS. 2A to 2D illustrate the first fin separation insulating portion FS11 and the plurality of second fin separation insulating portions FS12 each having a bottom surface that includes a planar surface, inventive concepts are not limited thereto. In some example embodiments, a bottom surface of each of the first fin separation insulating portion FS11 and the plurality of second fin separation insulating portions FS12 may include a curved surface included in a portion of a circle or a portion of an oval. In some example embodiments, a bottom surface of each of the first fin separation insulating portion FS11 and the plurality of second fin separation insulating portions FS12 may include a non-planar surface having a point sharply protruding toward the substrate 110.

In some example embodiments, each of the first fin separation insulating portion FS11 and the plurality of second fin separation insulating portions FS12 may include a single insulating film or a complex insulating film which is a combination of a plurality of insulating films. Although an insulating film included in the first fin separation insulating portion FS11 and the plurality of second fin separation insulating portions FS12 may include a silicon oxide film, a silicon nitride film, a SiOCN film, a SiCN film, or a combination thereof, inventive concepts are not limited thereto. In some example embodiments, at least some of the first fin separation insulating portion FS11 and the plurality of second fin separation insulating portions FS12 may include an air gap.

The integrated circuit device 100 illustrated in FIGS. 1 to 2D includes a first fin separation region FSA1 including the first fin separation insulating portion FS11 on the first device region RX1, and includes a second fin separation region FSA2 including the plurality of second fin separation insulating portions FS12 on the second device region RX2. When the integrated circuit device 100 includes transistors having different types of channels from each other between the first device region RX1 and the second device region RX2, the integrated circuit device 100 may include fin separation regions having different structures from each other between the first device region RX1 and the second device region RX2, and thus, carrier mobility may independently improve according to a conductive type of each channel region in the first device region RX1 and the second device region RX2 including channel regions of different conductive types from each other. As describe above, the first fin separation region FSA1 or the second fin separation region FSA2 may be provided by using an improved combination of the first fin separation insulating portion FS11 and the plurality of second fin separation insulating portions FS12 according to a channel type of transistors included in each of the first device region RX1 and the second device region RX2 of the integrated circuit device 100. Thus, while a stable isolation region may be provided between transistors included in the integrated circuit device 100, improved performance may be provided according to a channel type of each of the transistors, and reliability of an integrated circuit device may be improved.

Figure 3:
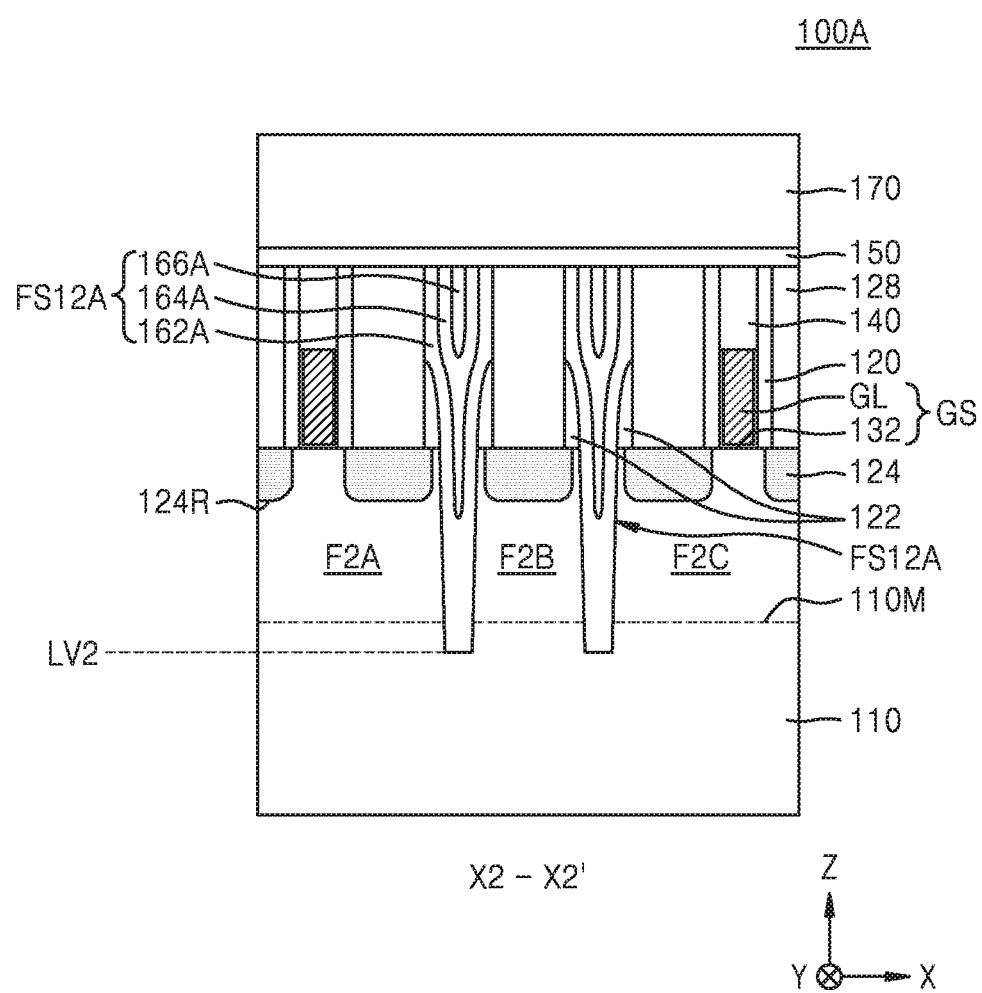
FIG. 3 is a cross-sectional view for explaining an integrated circuit device according to some example embodiments.

FIG. 3 is a cross-sectional view for explaining an integrated circuit device 100A according to some example embodiments and is a cross-sectional view of a portion corresponding to a cross-section taken along line X2-X2' of FIG. 1. In FIG. 3, elements that are the same as those in FIGS. 1 to 2D are designated by the same reference numerals, and a repeated description thereof is omitted below.

Referring to FIG. 3, the integrated circuit device 100A may have substantially the same components as the integrated circuit device 100 illustrated in FIGS. 1 to 2D. However, the integrated circuit device 100A includes a plurality of second fin separation insulating portions FS12A instead of the plurality of second fin separation insulating portions FS12.

The plurality of second fin separation insulating portions FS12A may each have a multiple layer structure in which a first insulating film 162A, a second insulating film 164A, and a third insulating film 166A are stacked in this stated order.

The first insulating film 162A may have a different composition from the first fin separation insulating portion FS11 (refer to FIG. 1). In some example embodiments, the first fin separation insulating portion FS11 may include a silicon oxide film, and the first insulating film 162A may include a silicon nitride film. In some example embodiments, the first insulating film 162A may be formed by atomic layer deposition (ALD) processes.

The second insulating film 164A and the third insulating film 166A may include silicon oxide films formed by different deposition methods from each other. For example, the second insulating film 164A may be a film formed by ALD processes, and the third insulating film 166A may be a film formed by chemical vapor deposition (CVD) processes, e.g. a plasma enhanced chemical vapor deposition process (PECVD).

On the second device region RX2 (refer to FIG. 1), respective portions of the plurality of second fin separation insulating portions FS12A between the plurality of second fin-type active regions F2A, F2B, and F2C may include the first insulating film 162A and the second insulating film 164A, and a portion that is at a vertical level higher than that of the plurality of second fin-type active regions F2A, F2B, and F2C may include the first insulating film 162A, the second insulating film 164A, and the third insulating film 166A. Detailed components of the plurality of second fin separation insulating portions FS12A are substantially the same as those of the plurality of second fin separation insulating portions FS12 described above with reference to FIGS. 1 to 2D.

Figure 4:
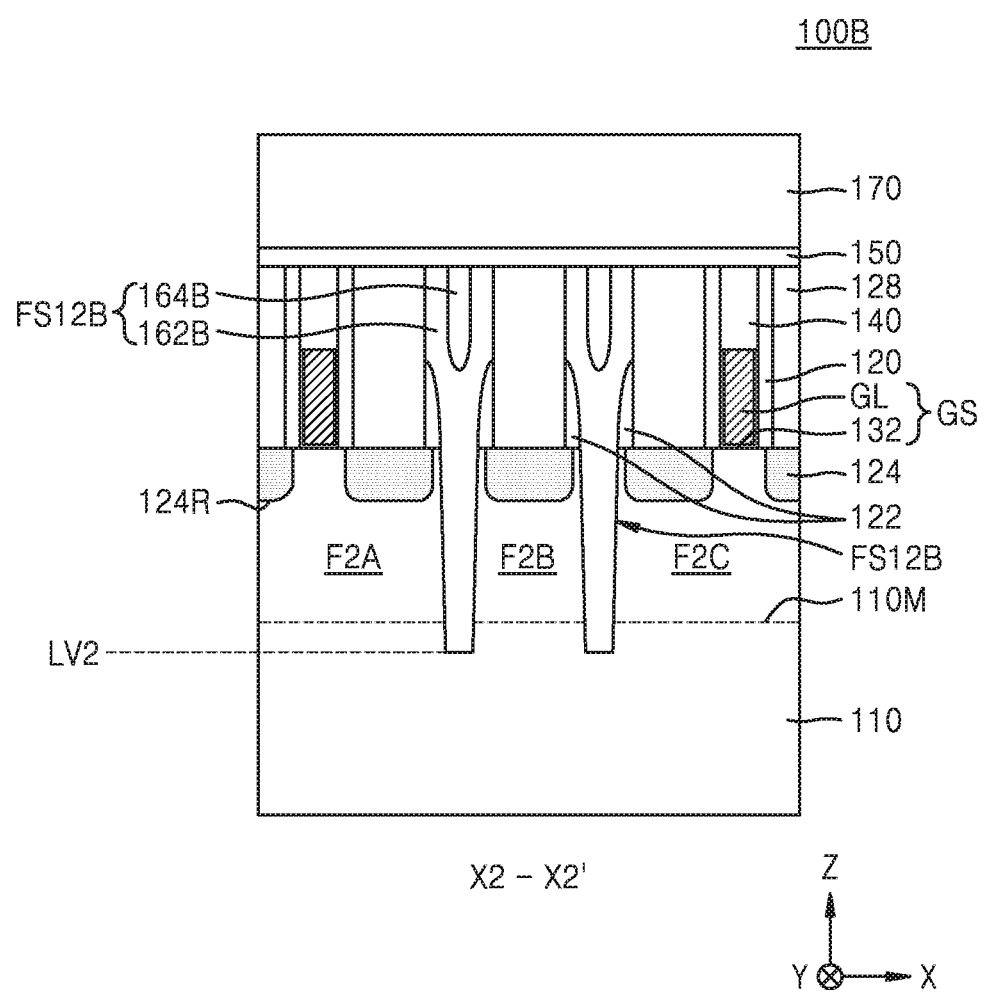
FIG. 4 is a cross-sectional view for explaining an integrated circuit device according to some example embodiments.

FIG. 4 is a cross-sectional view for explaining an integrated circuit device 100B according to some example embodiments and is a cross-sectional view of a portion corresponding to a cross-section taken along line X2-X2' of FIG. 1. In FIG. 4, elements that are the same as those in FIGS. 1 to 2D are designated by the same reference numerals, and a repeated description thereof is omitted below.

Referring to FIG. 4, the integrated circuit device 100B may have substantially the same components as the integrated circuit device 100 illustrated in FIGS. 1 to 2D. However, the integrated circuit device 100B includes a plurality of second fin separation insulating portions FS12B instead of the plurality of second fin separation insulating portions FS12.

The plurality of second fin separation insulating portions FS12B may each have a multiple layer structure in which a first insulating film 162B and a second insulating film 164B are stacked in this stated order.

In the second device region RX2, respective portions of the plurality of second fin separation insulating portions FS12B between the plurality of second fin-type active regions F2A, F2B, and F2C may include the first insulating film 162B, and a portion that is at a vertical level higher than that of the plurality of second fin-type active regions F2A, F2B, and F2C may include the first insulating film 162B and the second insulating film 164B.

In some example embodiments, the first insulating film 162B may include a silicon nitride film, and the second insulating film 164B may include a silicon oxide film. The first insulating film 162B may be a film formed by ALD processes, and the second insulating film 164B may be a film formed by CVD processes, e.g. a PECVD process. Detailed components of the plurality of second fin separation insulating portions FS12B are substantially the same as those of the plurality of second fin separation insulating portions FS12 described above with reference to FIGS. 1 to 2D.

Figure 5:
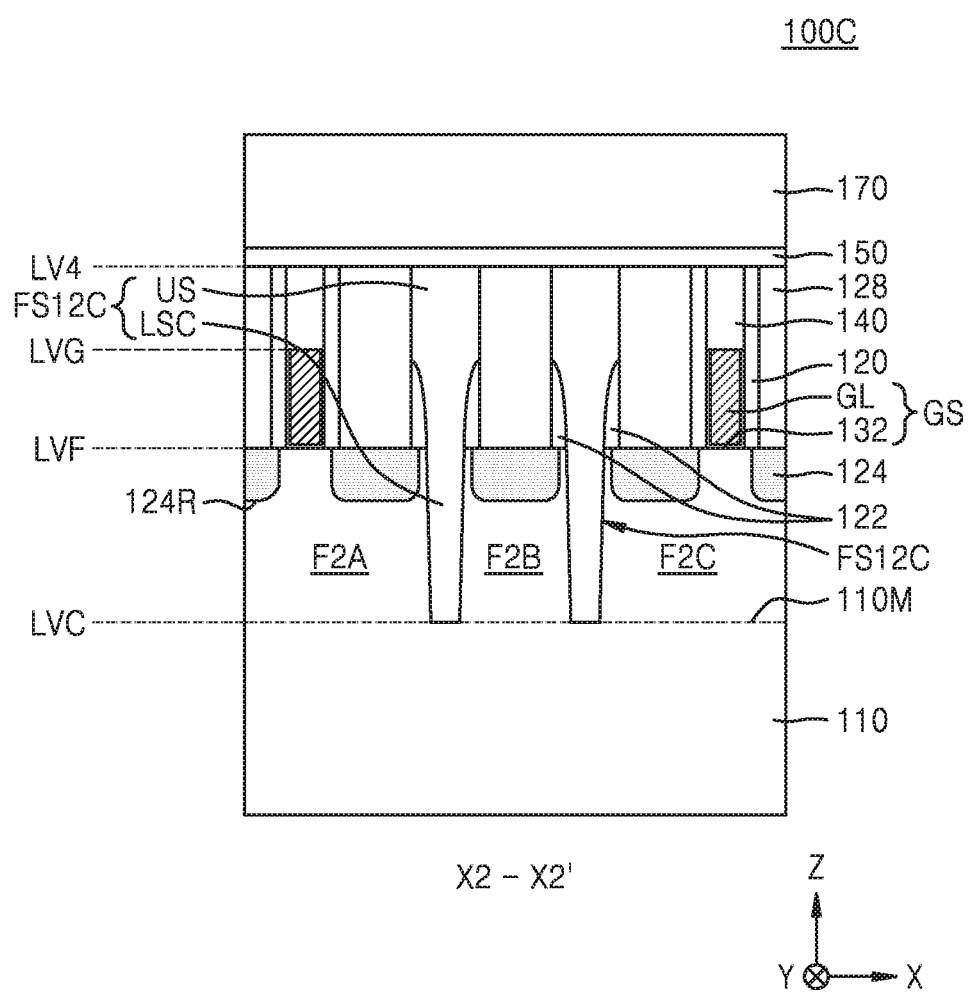
FIG. 5 is a cross-sectional view for explaining an integrated circuit device according to some example embodiments.

FIG. 5 is a cross-sectional view for explaining an integrated circuit device 100C according to some example embodiments and is a cross-sectional view of a portion corresponding to a cross-section taken along line X2-X2' of FIG. 1. In FIG. 5, elements that are the same as those in FIGS. 1 to 2D are designated by the same reference numerals, and a repeated description thereof is omitted below.

Referring to FIG. 5, the integrated circuit device 100C may have substantially the same components as the integrated circuit device 100 illustrated in FIGS. 1 to 2D. However, the integrated circuit device 100C includes a plurality of second fin separation insulating portions FS12C instead of the plurality of second fin separation insulating portions FS12.

A lowermost surface vertical level LVC of the plurality of second fin separation insulating portions FS12C may be substantially the same as the vertical level LV1 (refer to FIGS. 2A and 2B) of the main surface 110M of the substrate 110. In some example embodiments, as illustrated in FIG. 2A, a vertical level of a lowermost surface of the first fin separation insulating portion FS11 may be substantially the same as the vertical level LV1 of the main surface 110M of the substrate 110. In this case, the lowermost surface vertical level LVC of the plurality of second fin separation insulating portions FS12C and the vertical level of the lowermost surface of the first fin separation insulating portion FS11 may be substantially the same as each other.

A second fin separation insulating portion FS12C may include the upper insulating portion US and a lower insulating portion LSC integrally connected to each other. Over the second device region RX2, the lower insulating portion LSC of the second fin separation insulating portion FS12C may be between a pair of second fin-type active regions F2A and F2B or between a pair of second fin-type active regions F2B and F2C. Detailed components of the plurality of second fin separation insulating portions FS12C are substantially the same as those of the plurality of second fin separation insulating portions FS12 described above with reference to FIGS. 1 to 2D.

Figure 6A:
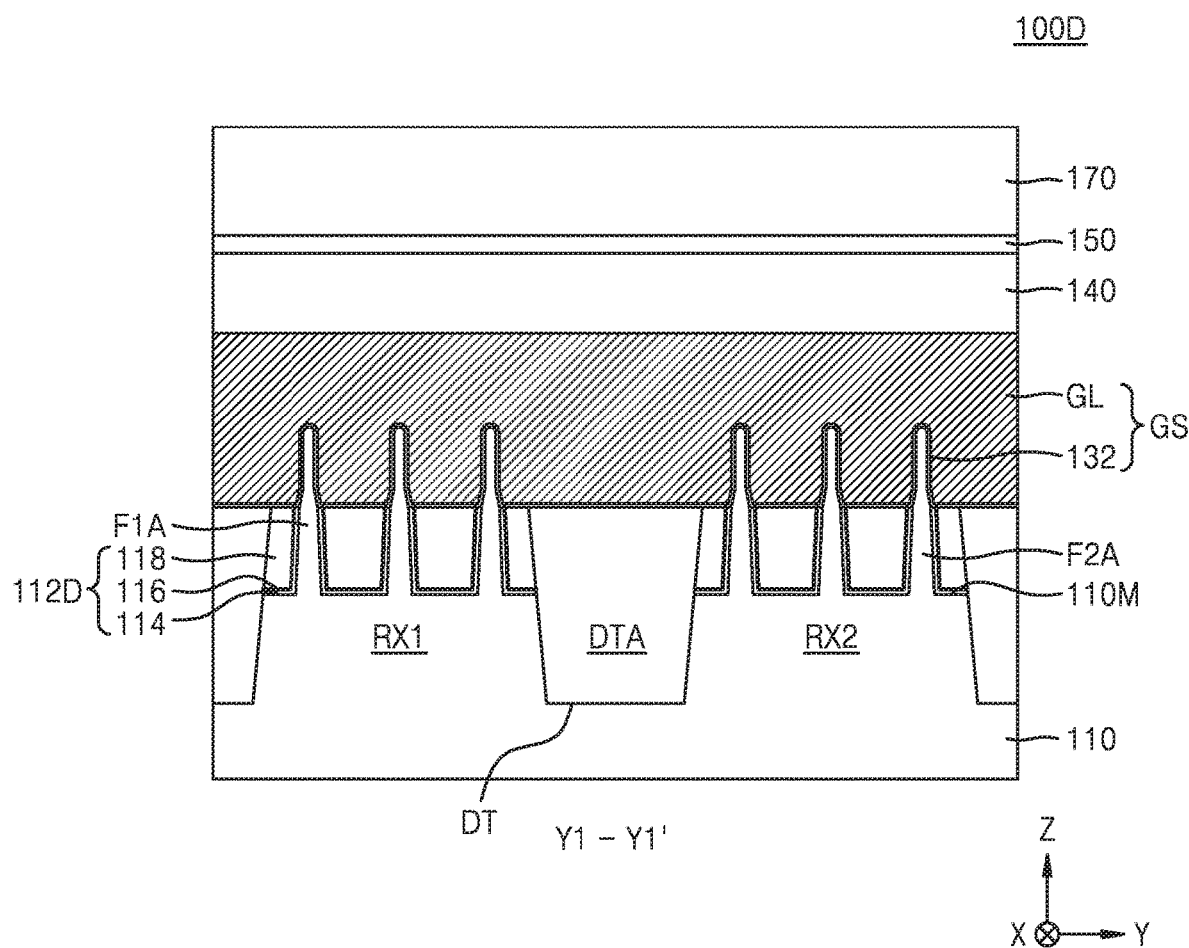
FIGS. 6A and 6B are cross-sectional views for explaining an integrated circuit device according to some example embodiments.
Figure 6B:
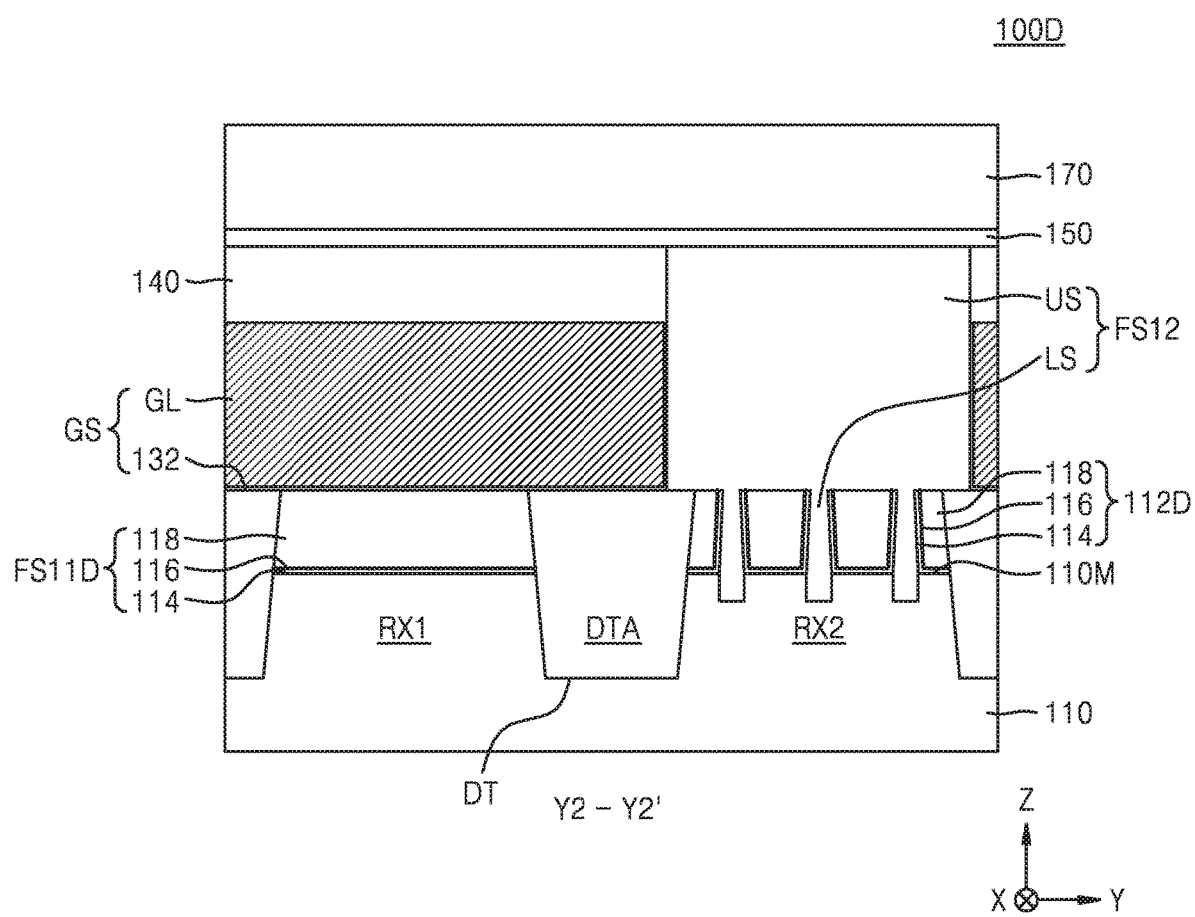

FIGS. 6A and 6B are cross-sectional views for explaining an integrated circuit device 100D according to some example embodiments. FIG. 6A is a cross-sectional view of a portion corresponding to a cross-section taken along line Y1-Y1' of FIG. 1, and FIG. 6B is a cross-sectional view of a portion corresponding to a cross-section taken along line Y2-Y2' of FIG. 1. In FIGS. 6A and 6B, elements that are the same as those in FIGS. 1 to 2D are designated by the same reference numerals, and a repeated description thereof is omitted below.

Referring to FIGS. 6A and 6B, the integrated circuit device 100D may have substantially the same components as the integrated circuit device 100 illustrated in FIGS. 1 to 2D. However, the integrated circuit device 100D includes a device isolation film 112D and a first fin separation insulating portion FS11D instead of the device isolation film 112 and the first fin separation insulating portion FS11.

The device isolation film 112D and the first fin separation insulating portion FS11D may each include a first insulating liner 114, a second insulating liner 116, and a buried insulating film 118 stacked on the substrate 110 in this stated order. The first insulating liner 114 and the second insulating liner 116 may cover respective lower side walls of the plurality of first fin-type active regions F1A and F1B and the plurality of second fin-type active regions F2A, F2B, and F2C. On the second insulating liner 116, the buried insulating film 118 may fill spaces between respective lower side walls of the plurality of first fin-type active regions F1A and F1B and the plurality of second fin-type active regions F2A, F2B, and F2C.

In some example embodiments, the first insulating liner 114 may include a first oxide film. The first oxide film may be obtained through deposition processes or may be obtained by thermally oxidizing respective surfaces of the plurality of first fin-type active regions F1A and F1B and the plurality of second fin-type active regions F2A, F2B, and F2C.

In some example embodiments, the second insulating liner 116 may be used as a stressor. For example, a material that applies tensile stress or compressive stress to respective channel regions of the plurality of first fin-type active regions F1A and F1B and the plurality of second fin-type active regions F2A, F2B, and F2C may be used to form the second insulating liner 116. For example, the second insulating liner 116 may include silicon nitride (SiN), silicon oxynitride (SiON), silicon boronitride (SiBN), silicon carbide (SiC), SiC:H, SiCN, SiCN:H, SiOCN, SiOCN:H, silicon oxycarbide (SiOC), polysilicon, or a combination thereof, but inventive concepts are not limited thereto. In some example embodiments, a portion of the second insulating liner 116 formed over the first device region RX1 and a portion of the second insulating liner 116 formed over the second device region RX2 may include different materials from each other. The materials may be selected from the above-described materials.

In some example embodiments, the buried insulating film 118 may include a second oxide film. The second oxide film may include a film formed by deposition processes or coating processes. For example, the second oxide film may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), and/or tonen silazene (TOSZ), but inventive concepts are not limited thereto.

According to inventive concepts, various fin separation regions may be provided by using various structures and combinations of the first fin separation insulating portion FS11 and the plurality of second fin separation insulating portions FS12 described above with reference to FIGS. 1 to 2D, the plurality of second fin separation insulating portions FS12A illustrated in FIG. 3, the plurality of second fin separation insulating portions FS12B illustrated in FIG. 4, the plurality of second fin separation insulating portions FS12C illustrated in FIG. 5, the first fin separation insulating portion FS11D illustrated in FIGS. 6A and 6B, and first and second fin separation insulating portions variously modified and changed therefrom within the scope of inventive concepts. Accordingly, when transistors including channel regions of different conductive types from each other between the first device region RX1 and the second device region RX2 are included, carrier mobility may be delicately controlled according to a channel type of each of the transistors, and reliability of an integrated circuit device may be improved.

FIGS. 7A to 17D are cross-sectional views according to a process sequence, for explaining a method of manufacturing an integrated circuit device, according to some example embodiments.

Figure 7A:
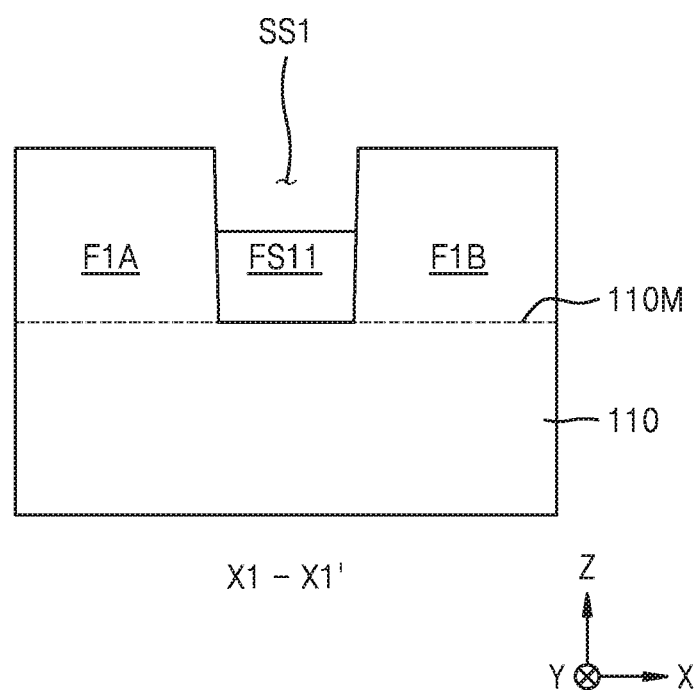
Figure 7B:
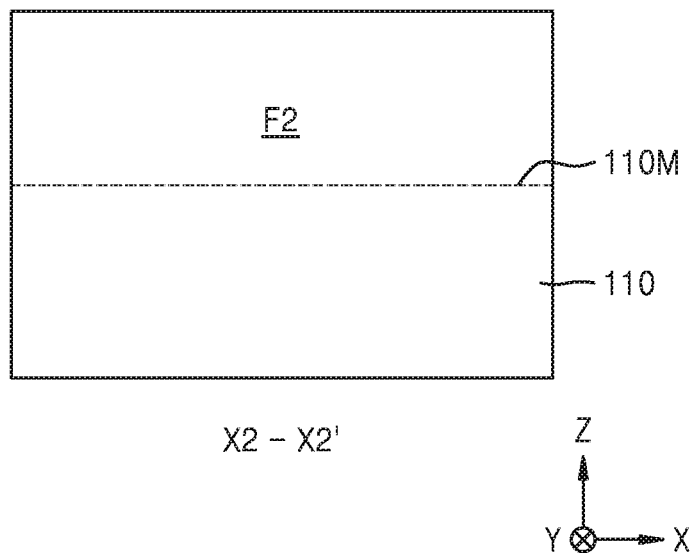
Figure 7C:
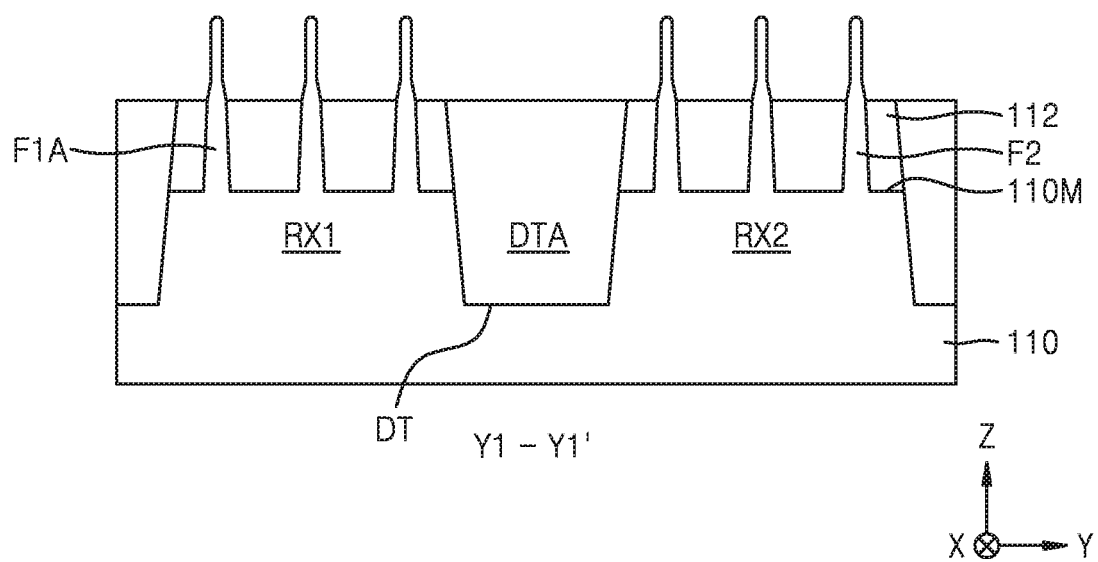
Figure 7D:
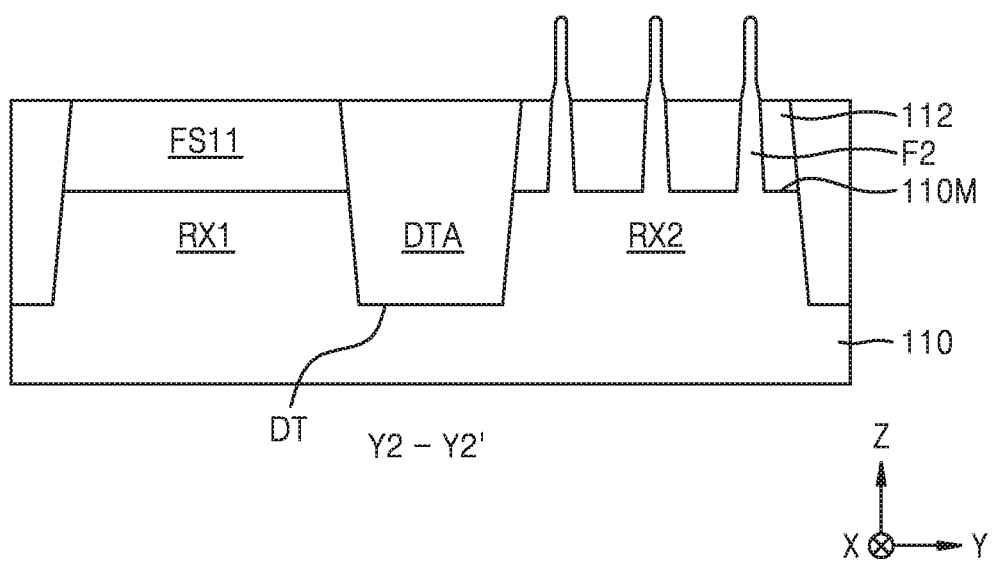
Figure 8A:
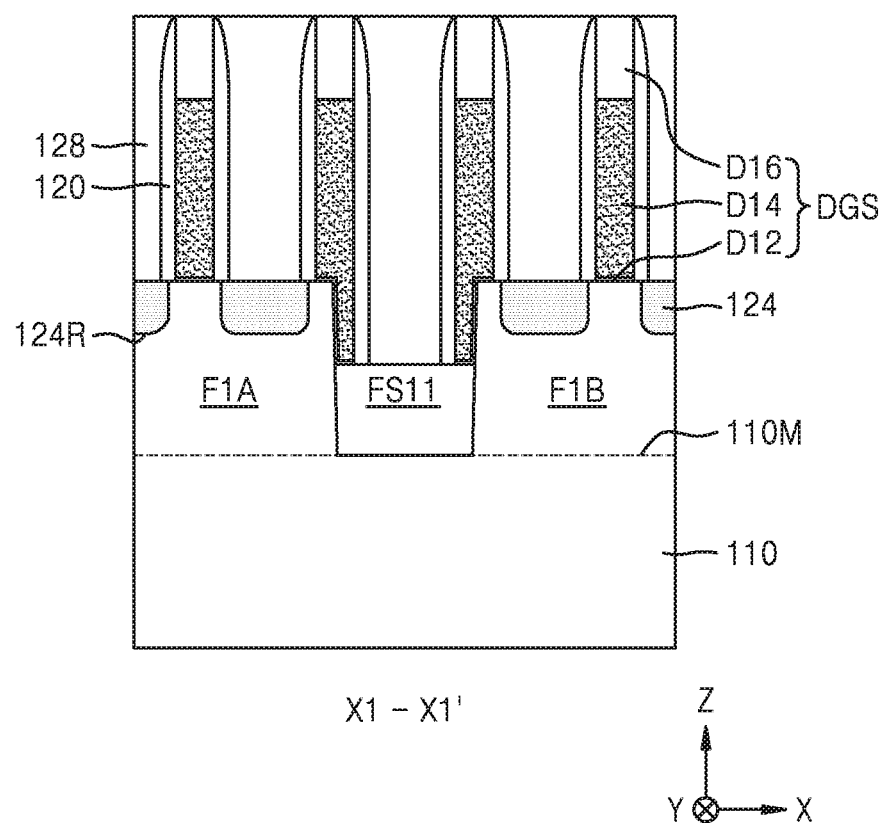
Figure 8B:
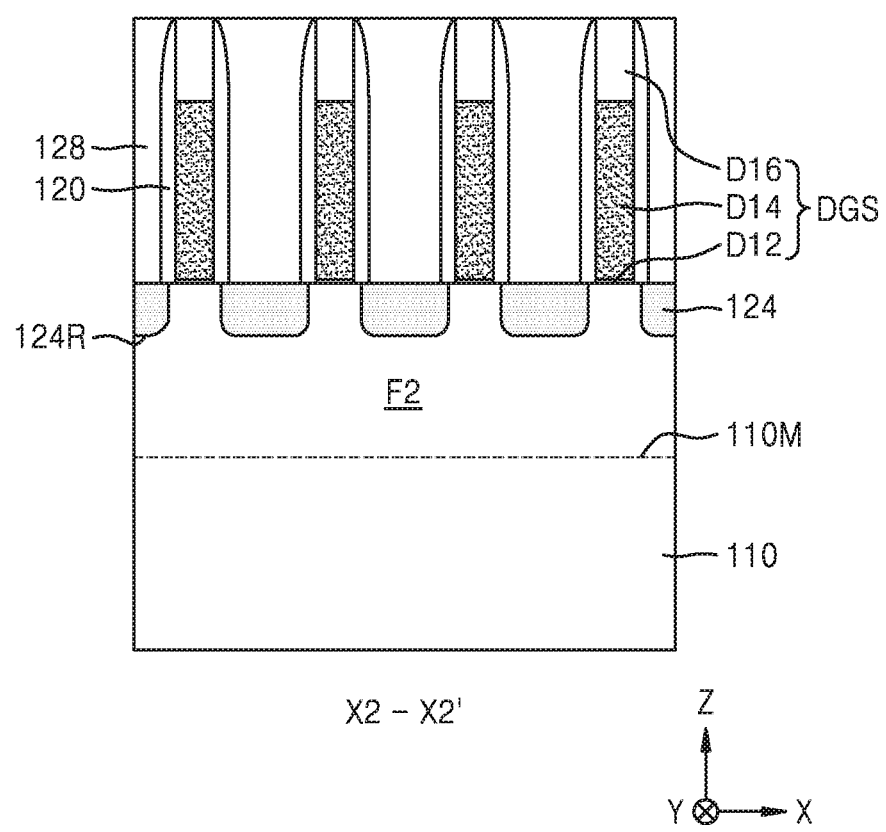
Figure 8C:
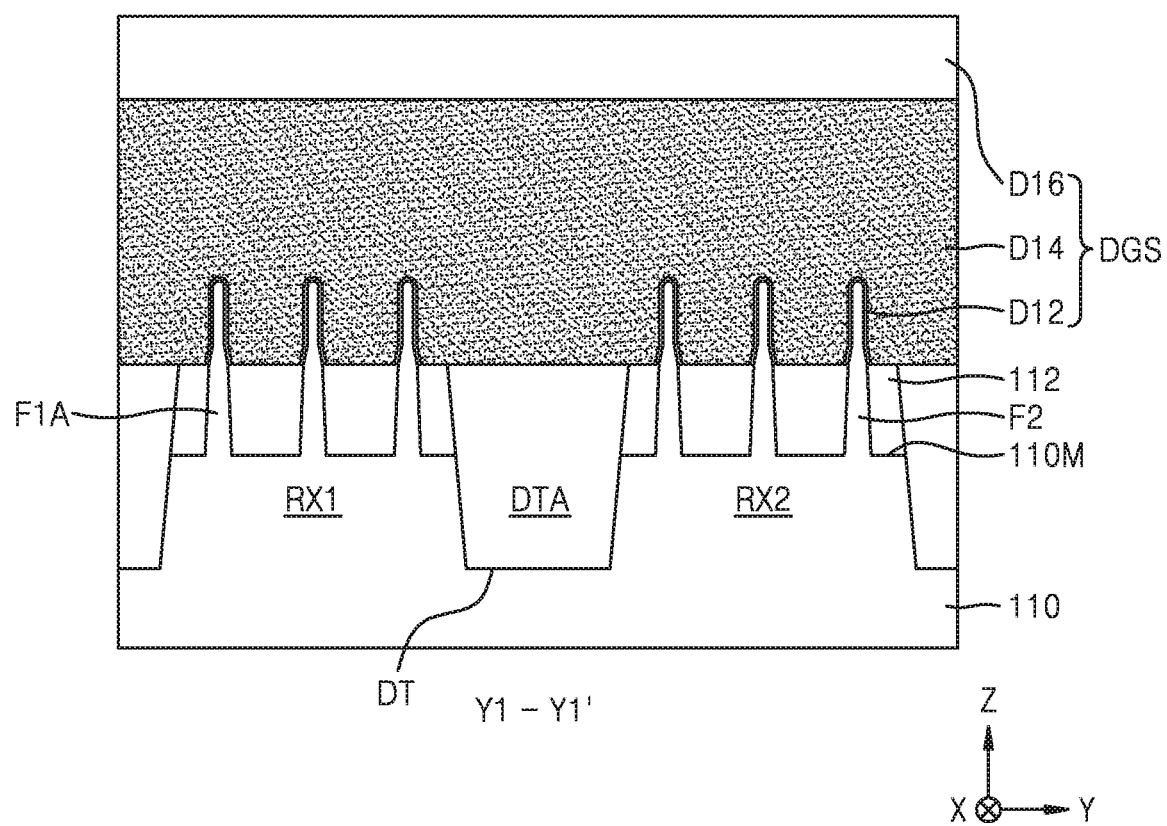
Figure 8D:
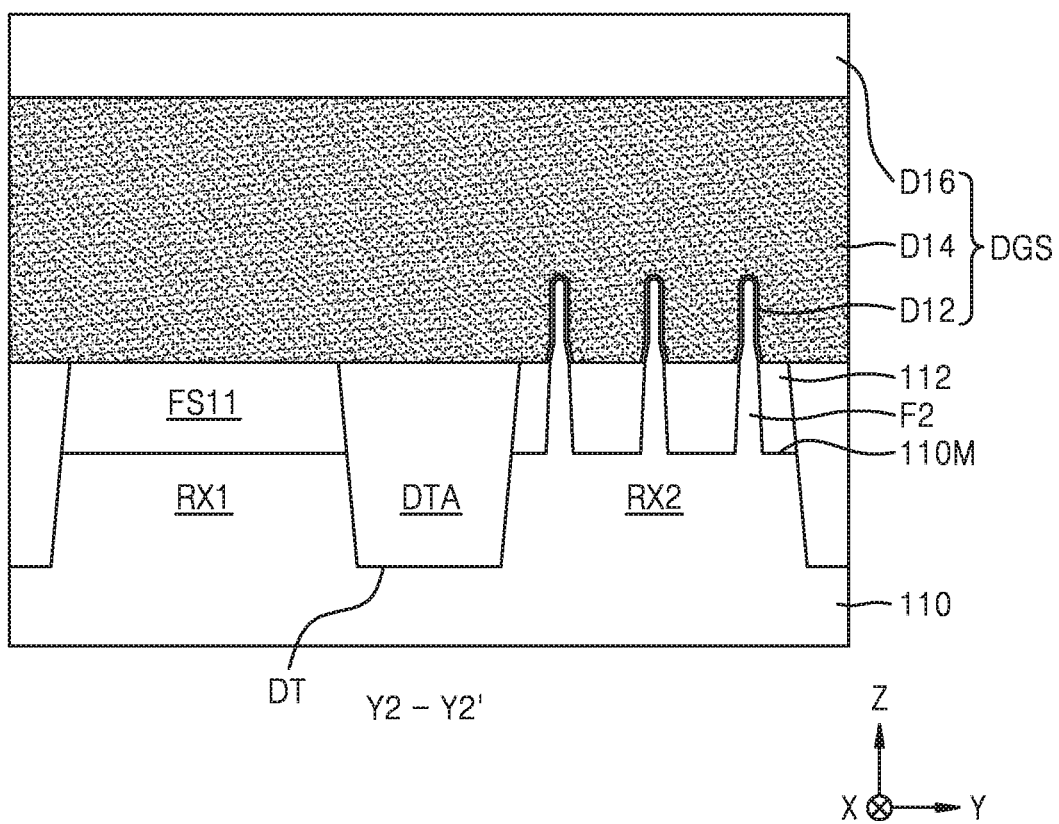
Figure 9A:
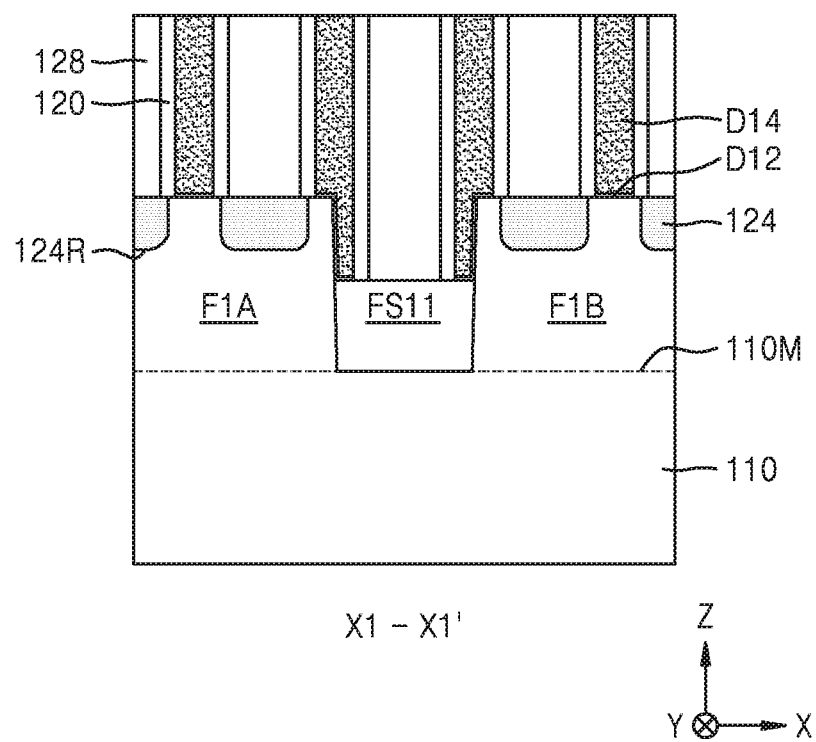
Figure 9B:
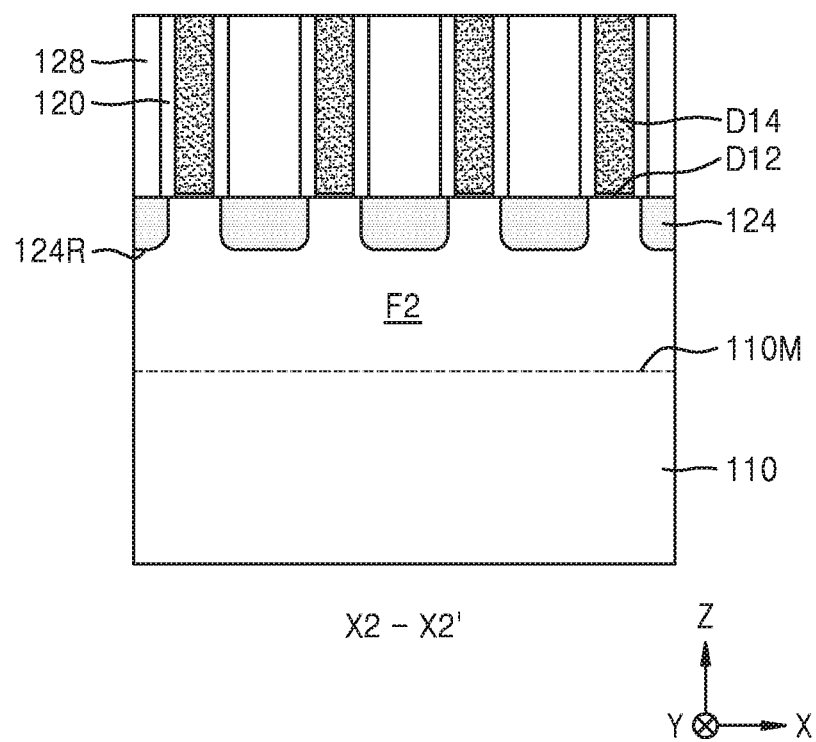
Figure 9C:
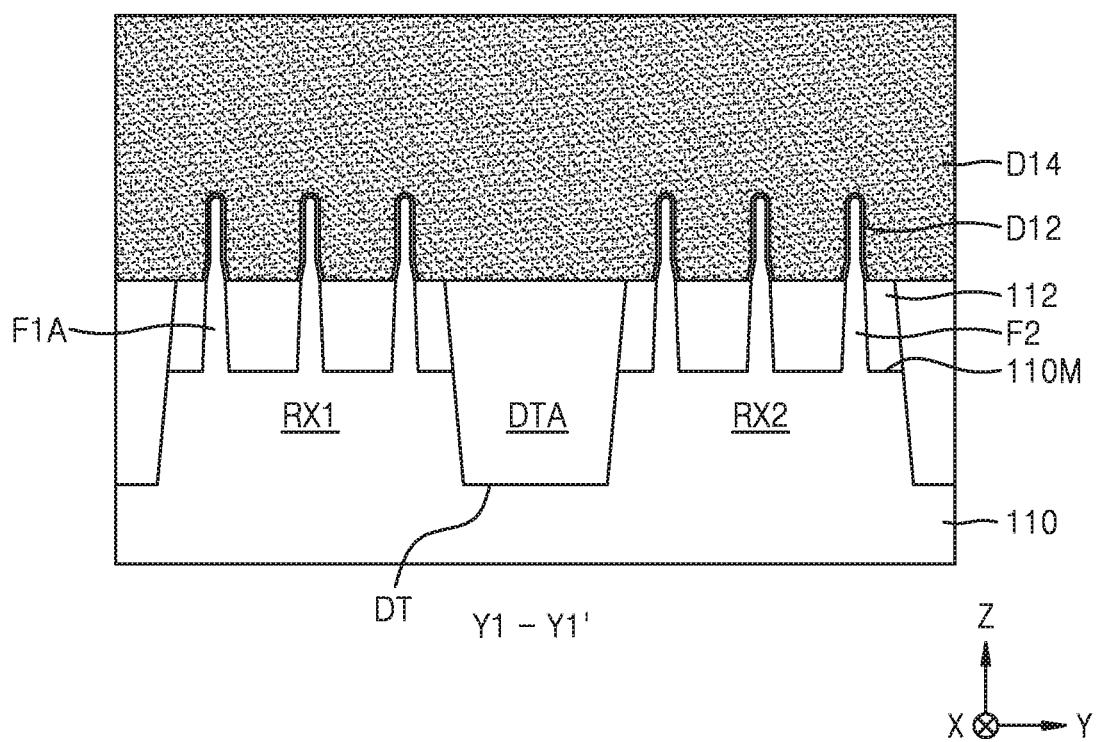
Figure 9D:
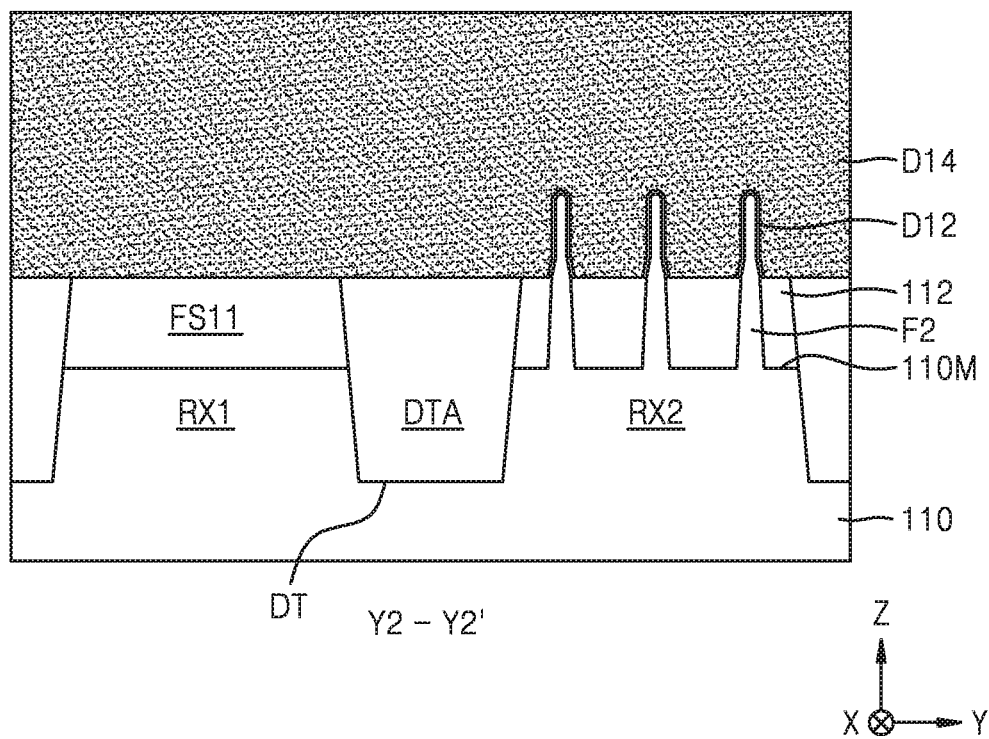
Figure 10A:
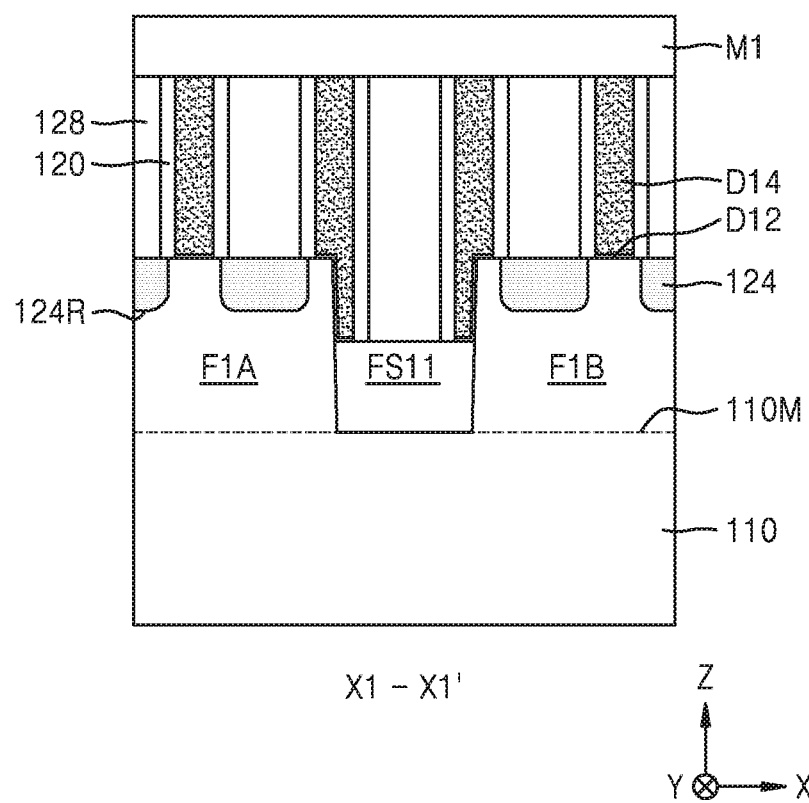
Figure 10B:
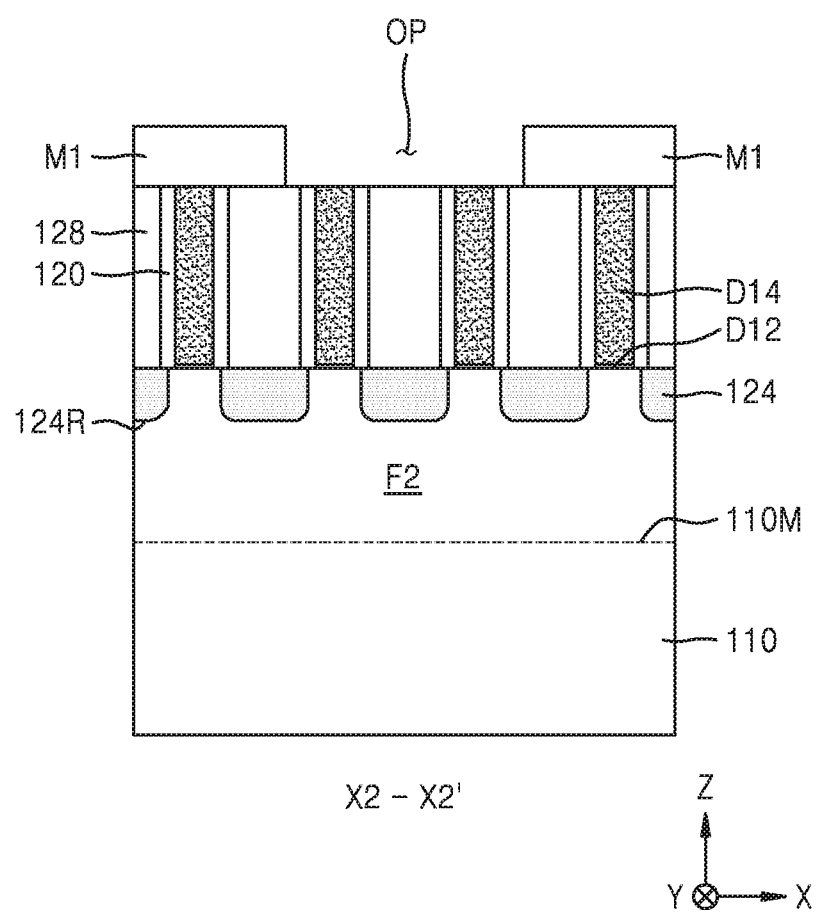
Figure 10C:
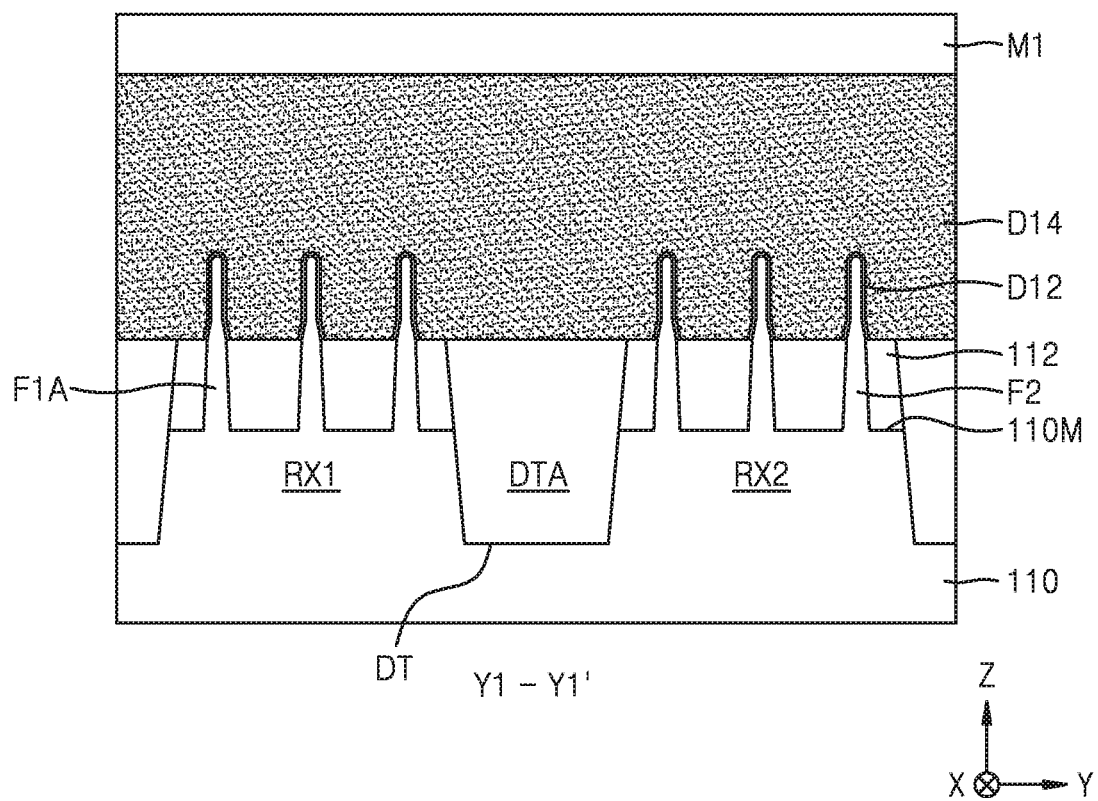
Figure 10D:
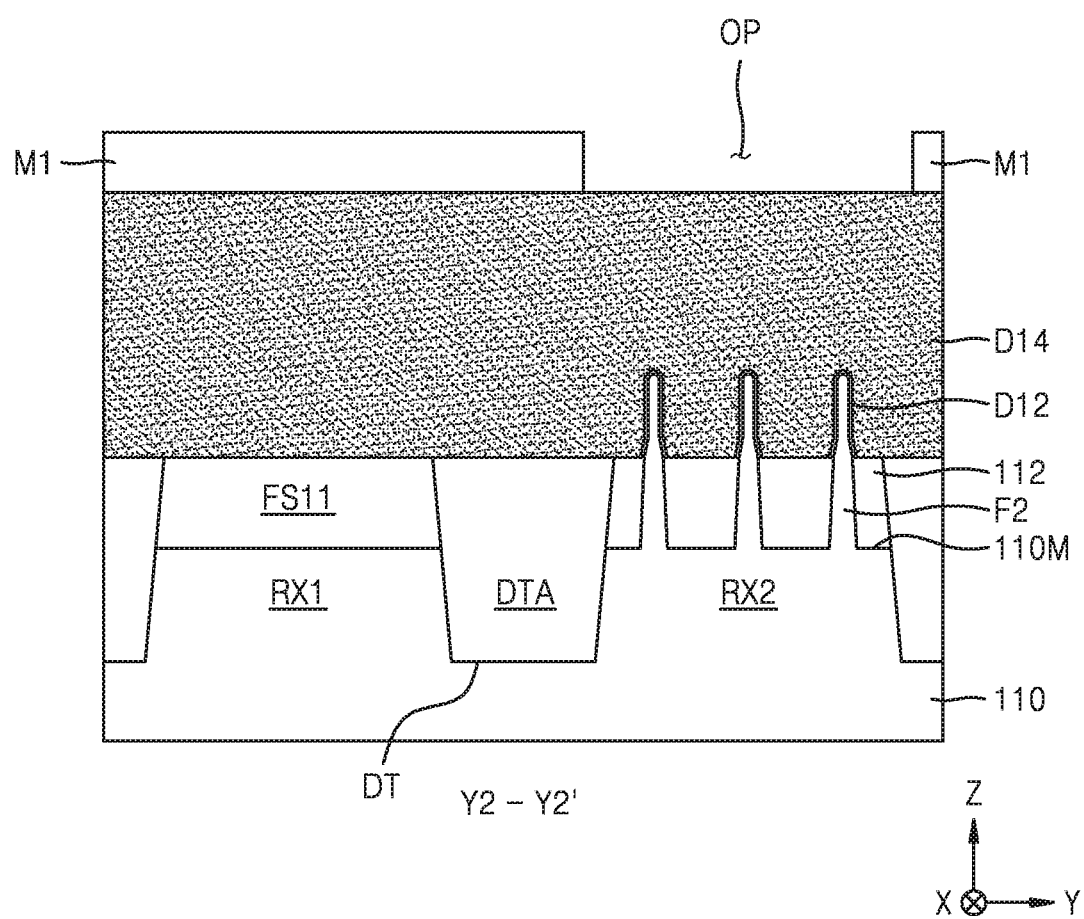
Figure 11A:
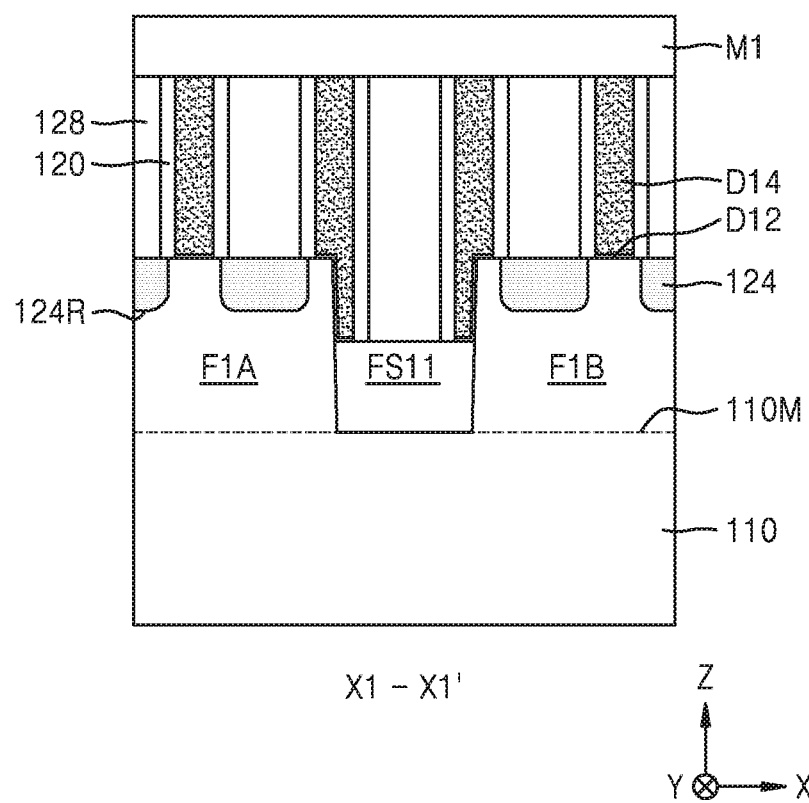
Figure 11B:
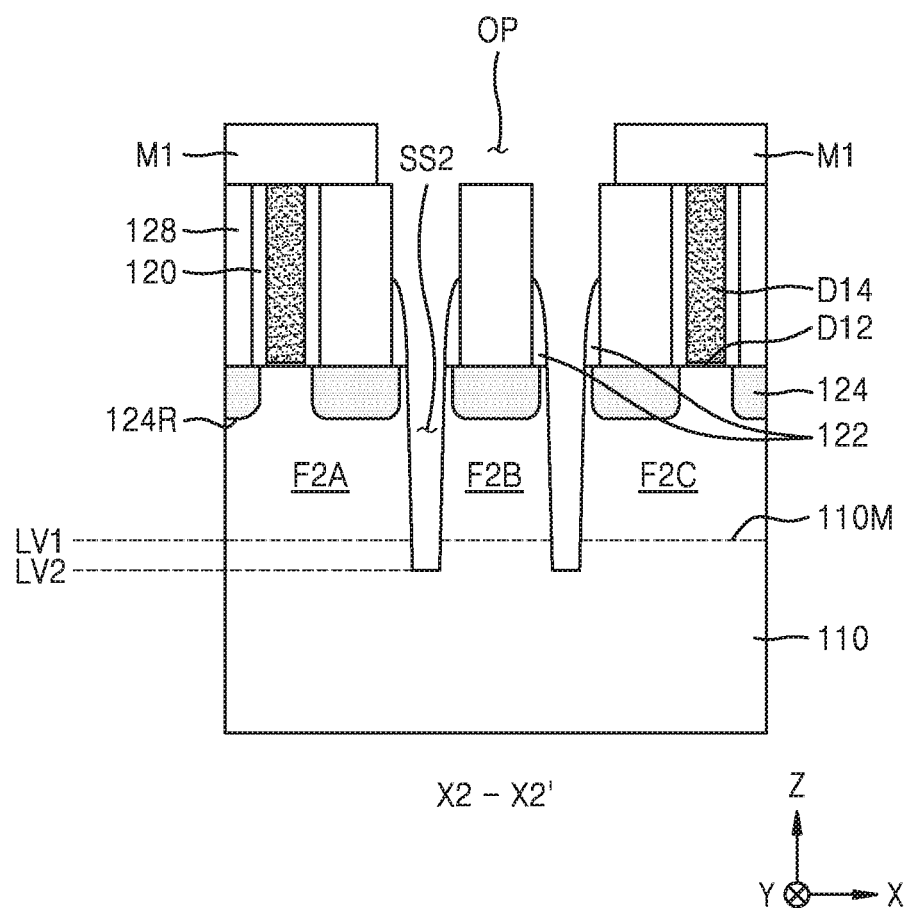
Figure 11C:
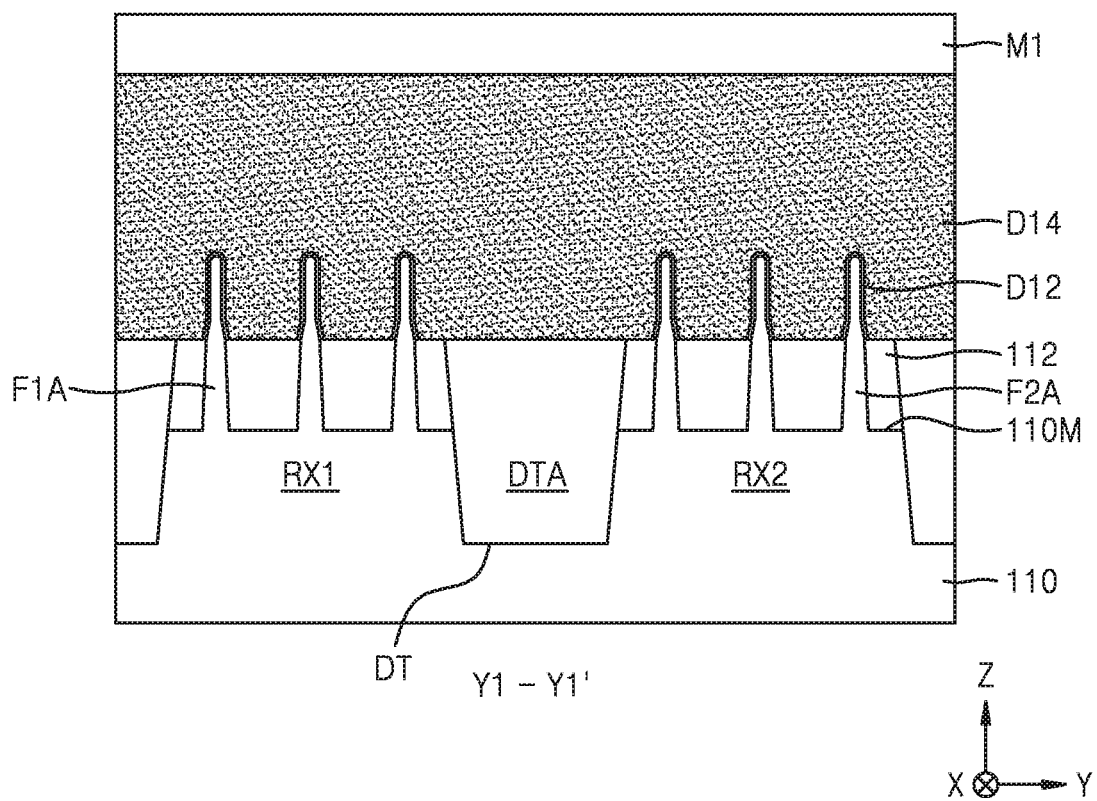
Figure 11D:
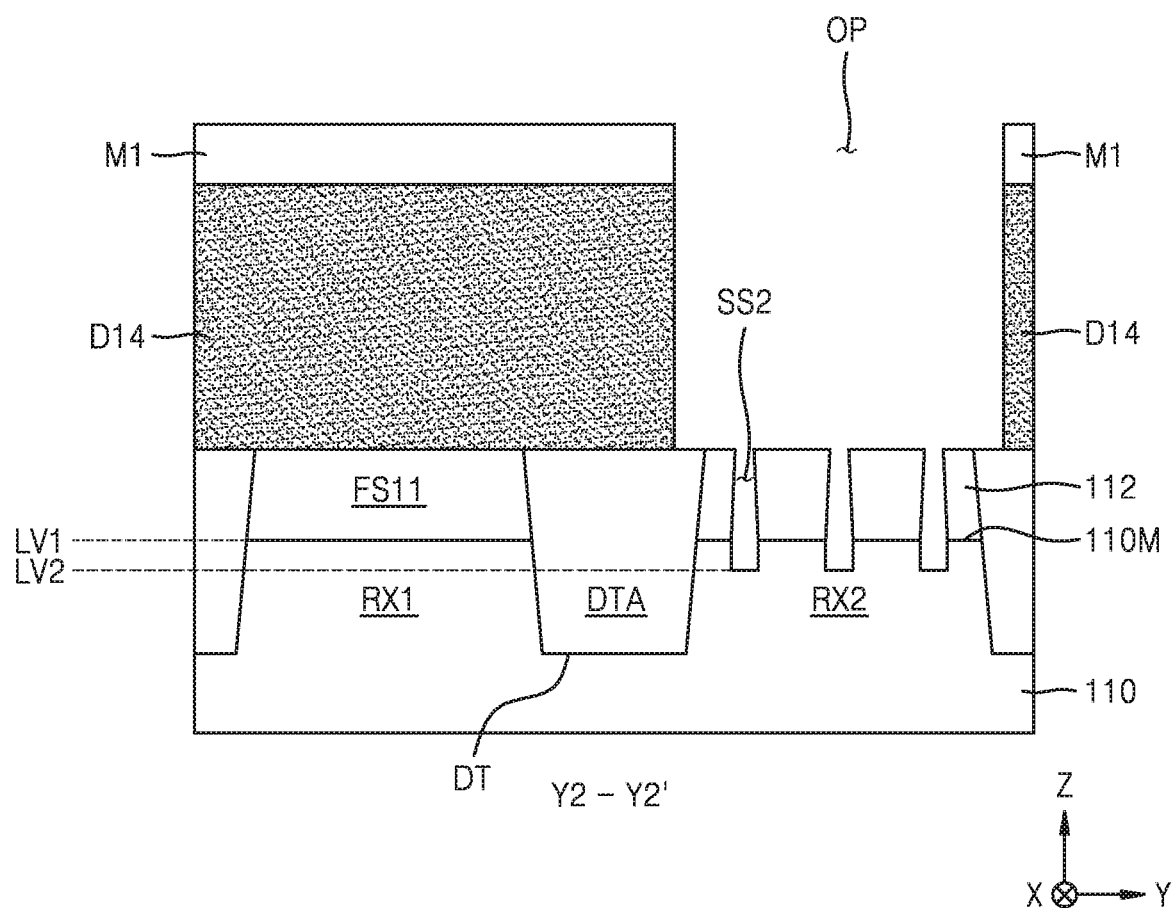
Figure 12A:
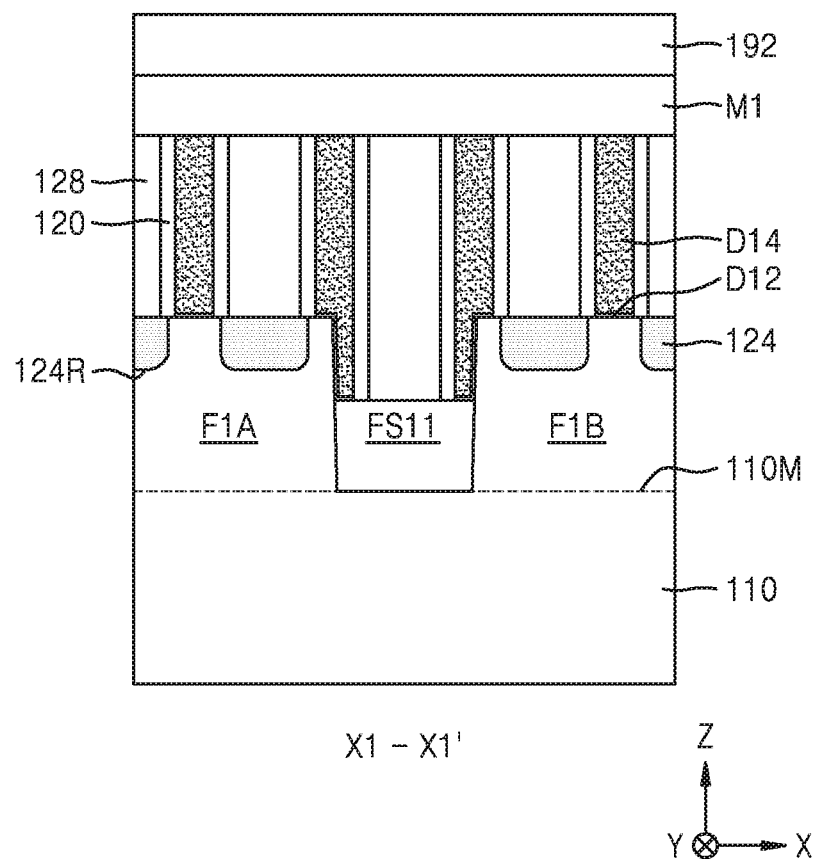
Figure 12B:
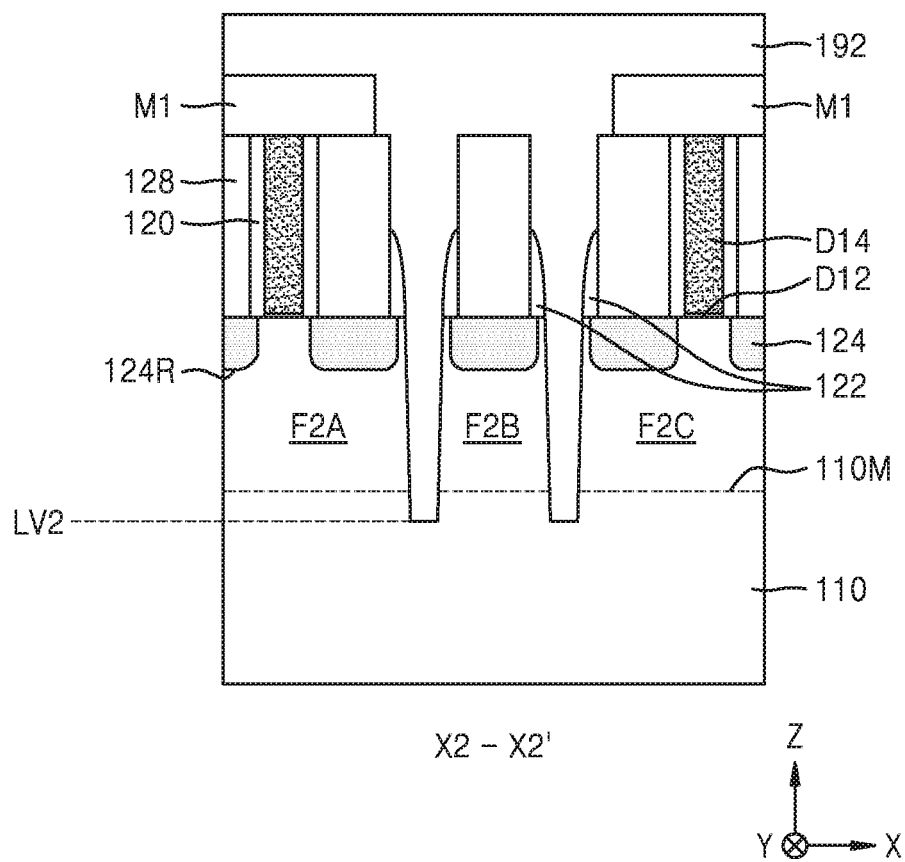
Figure 12C:
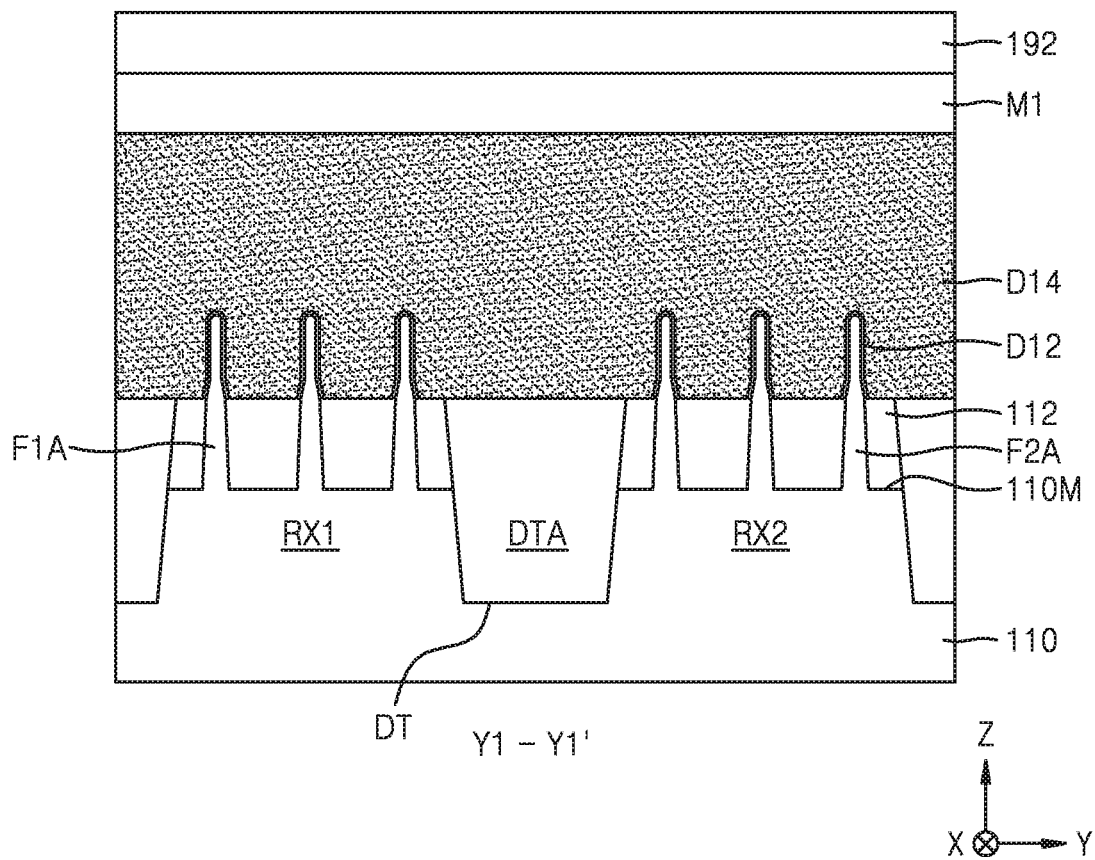
Figure 12D:
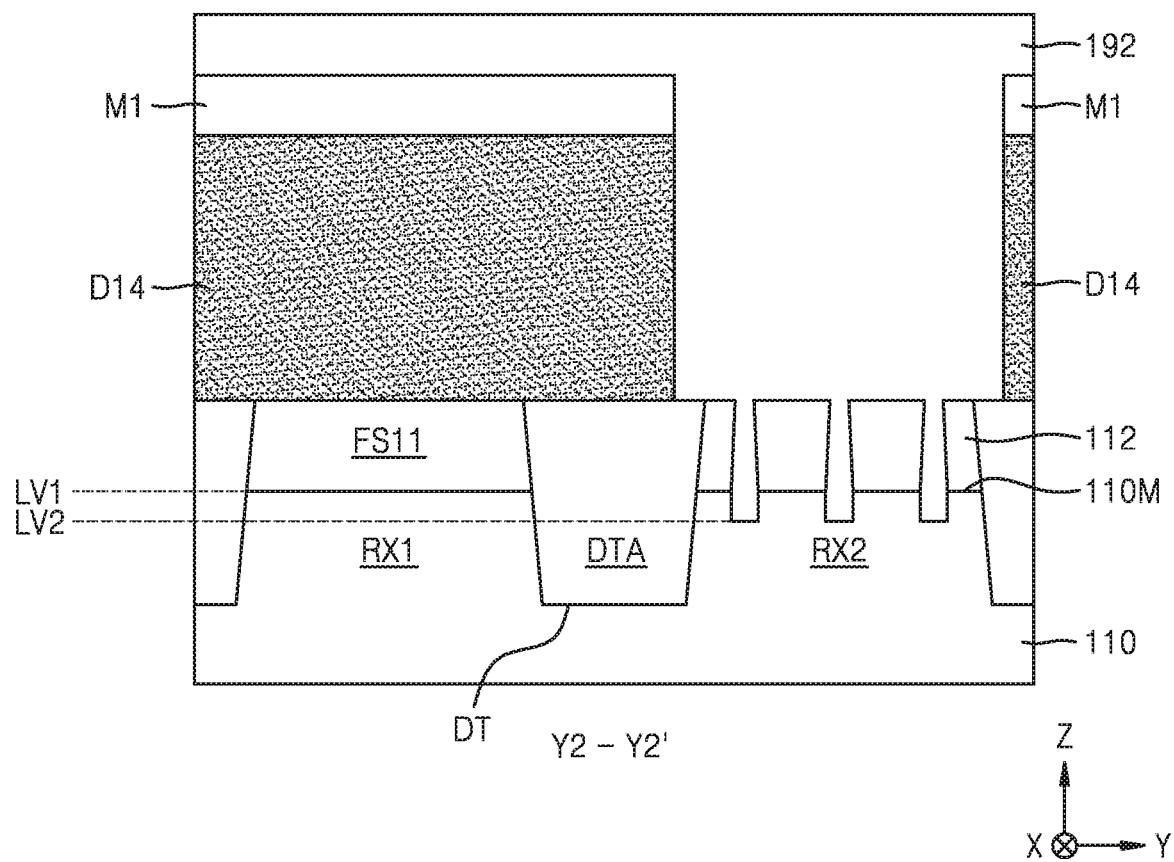
Figure 13A:
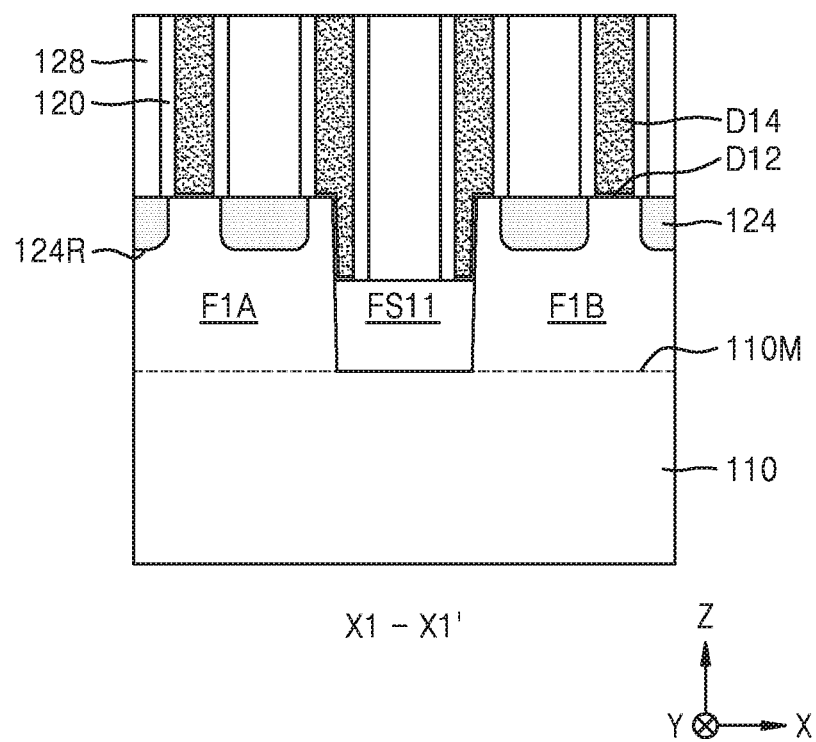
Figure 13B:
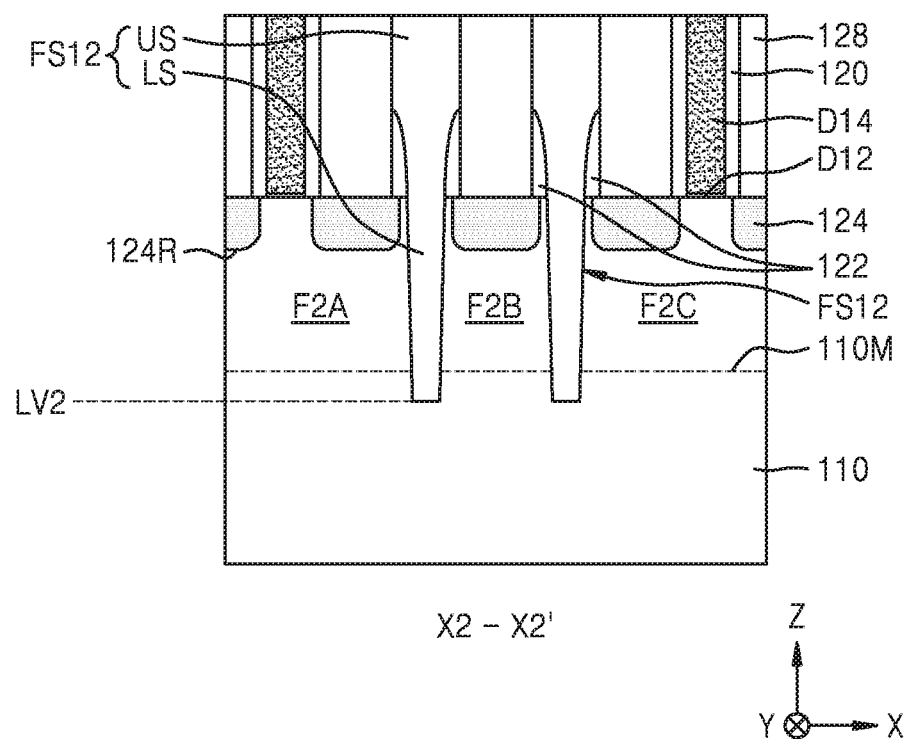
Figure 13C:
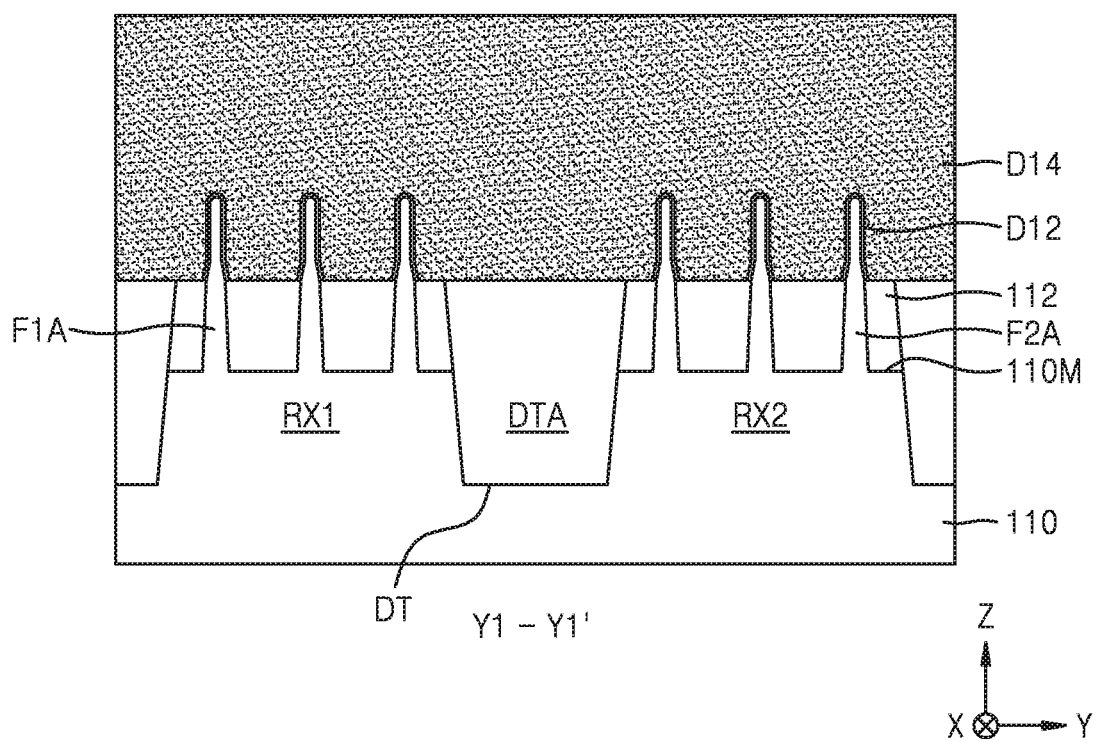
Figure 13D:
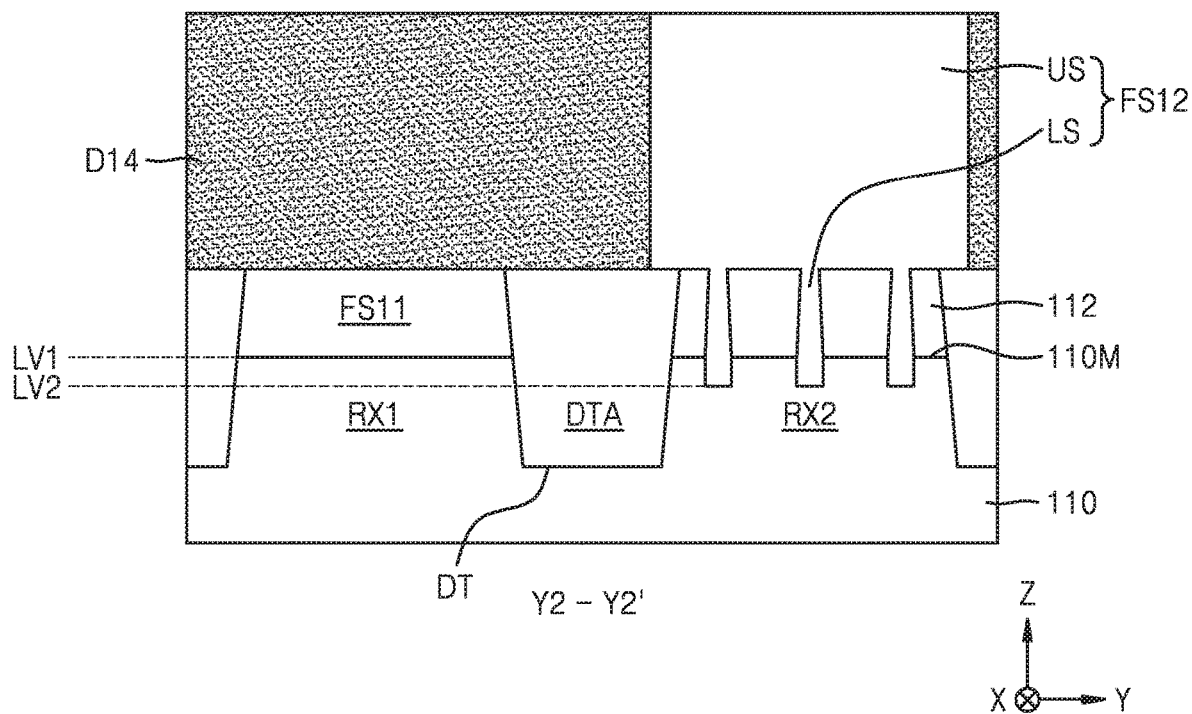
Figure 14A:
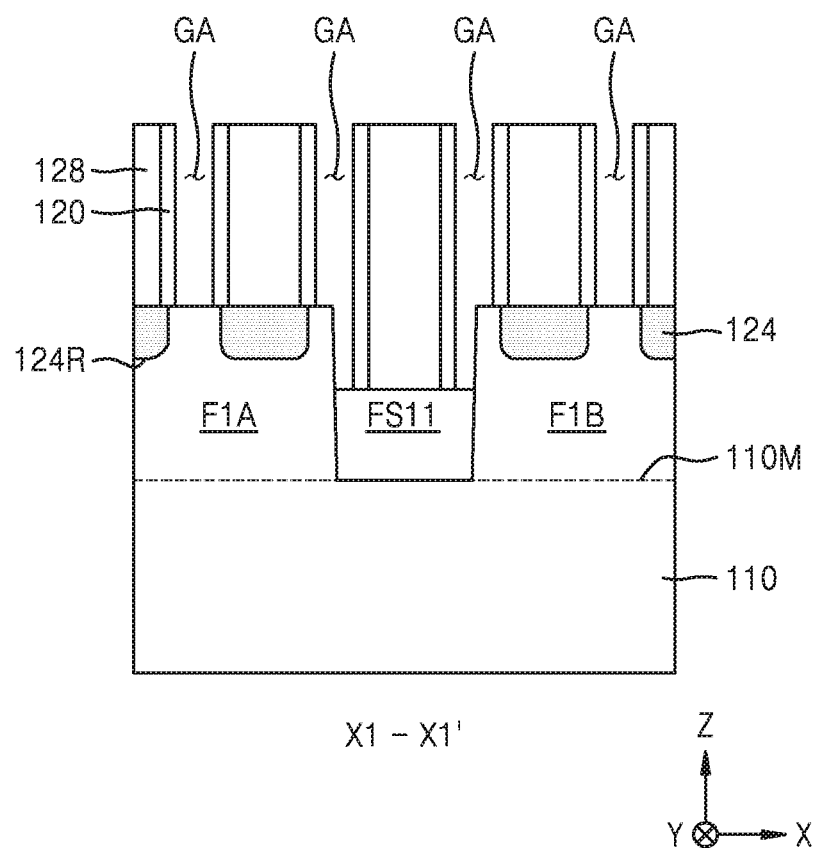
Figure 14B:
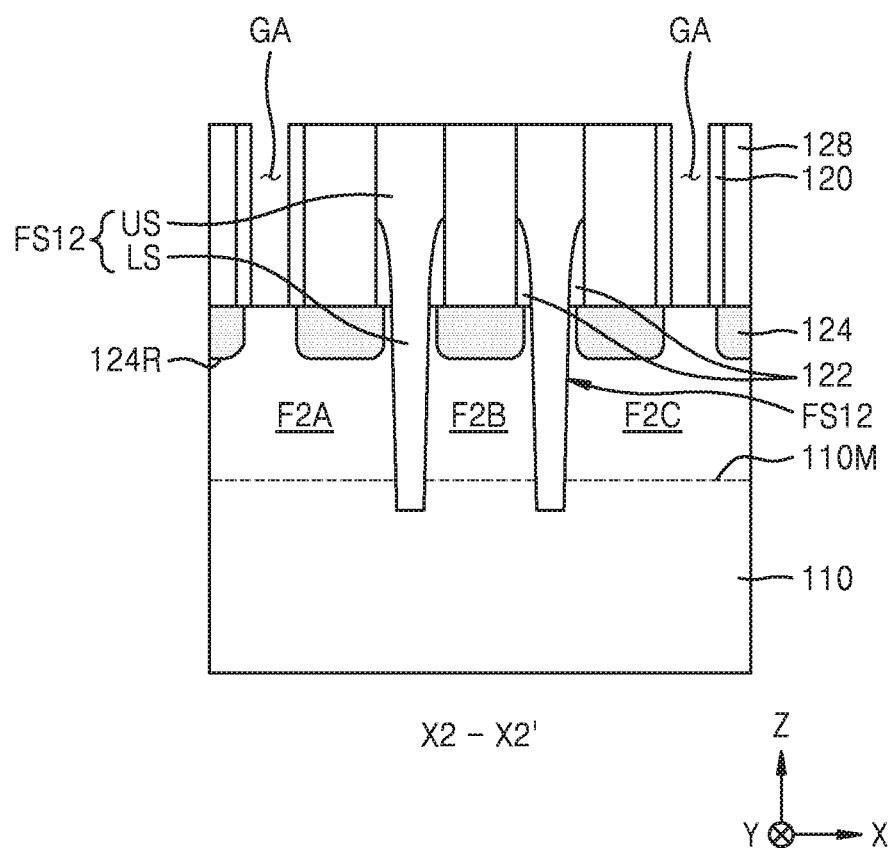
Figure 14C:
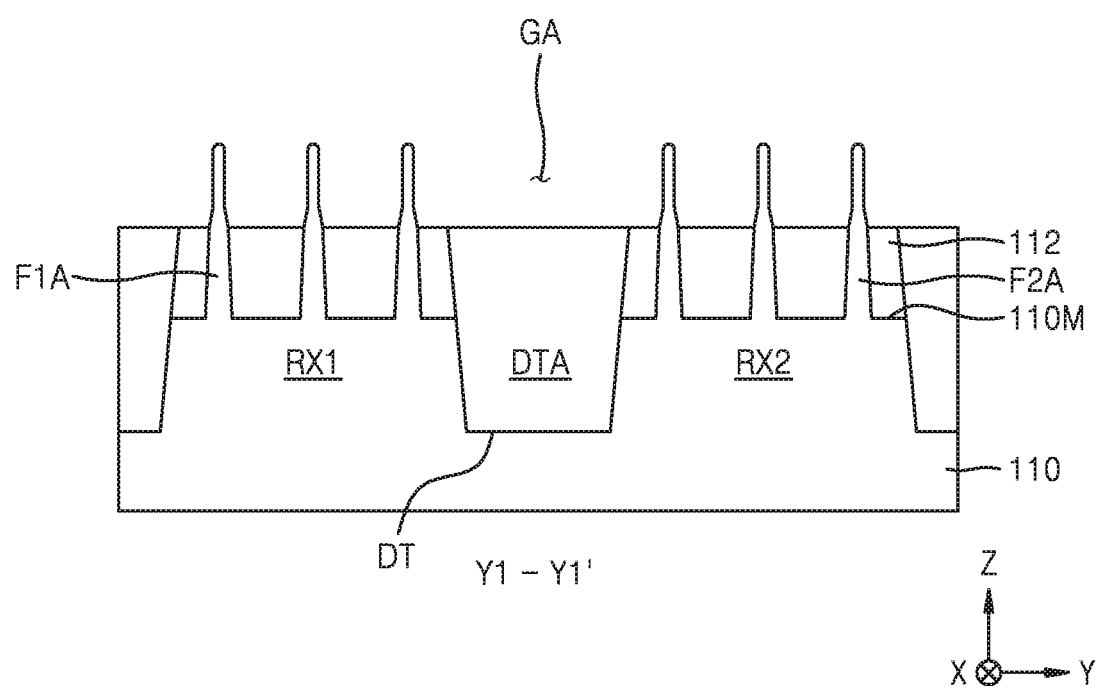
Figure 14D:
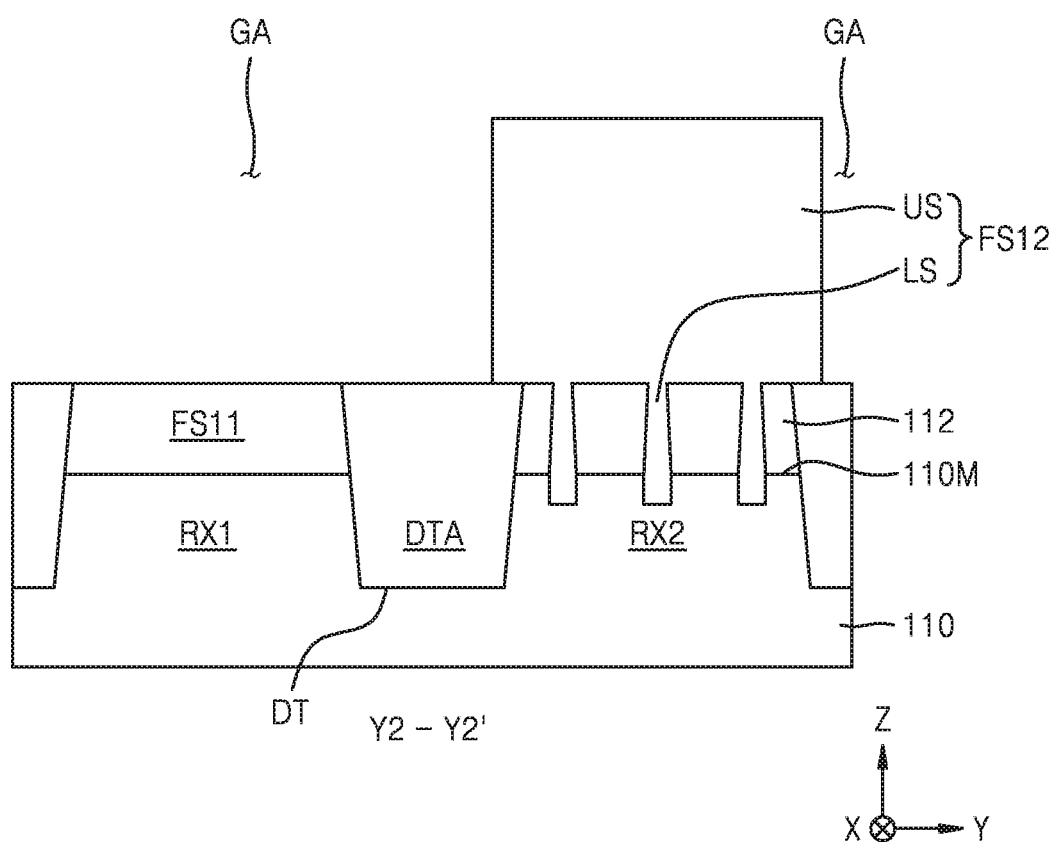
Figure 15A:
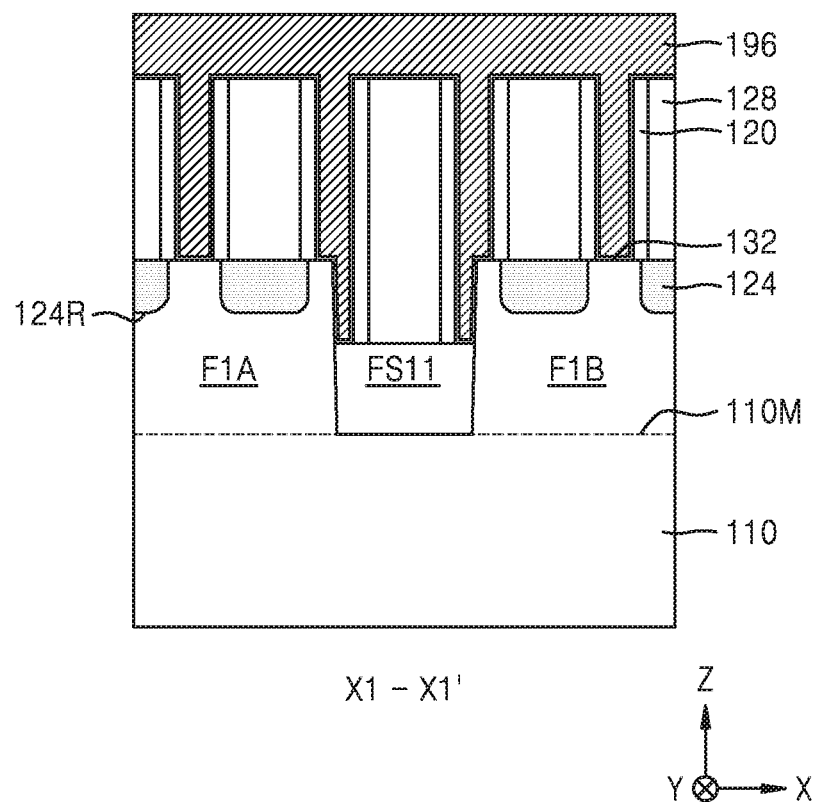
Figure 15B:
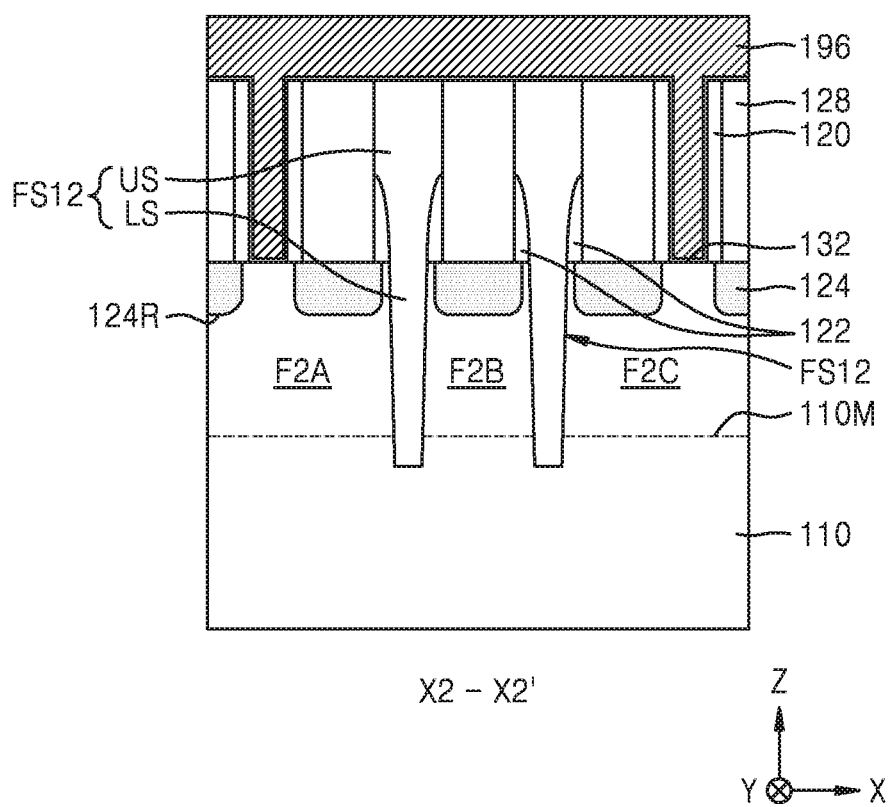
Figure 15C:
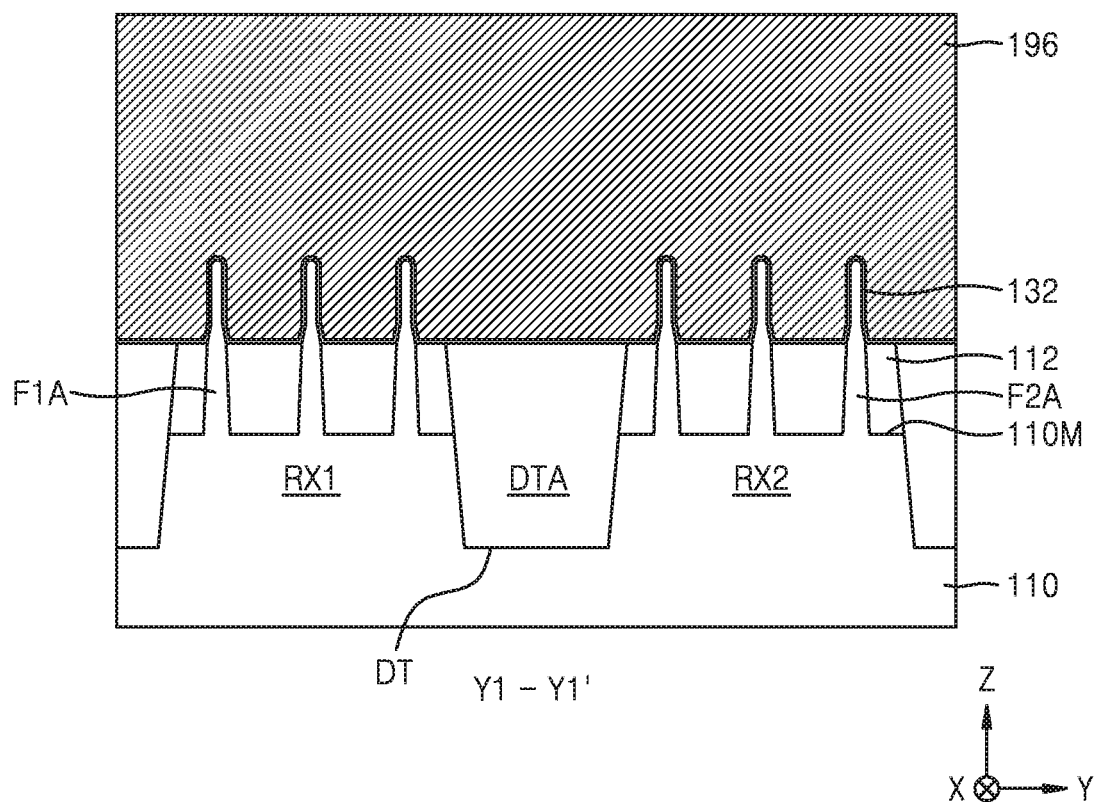
Figure 15D:
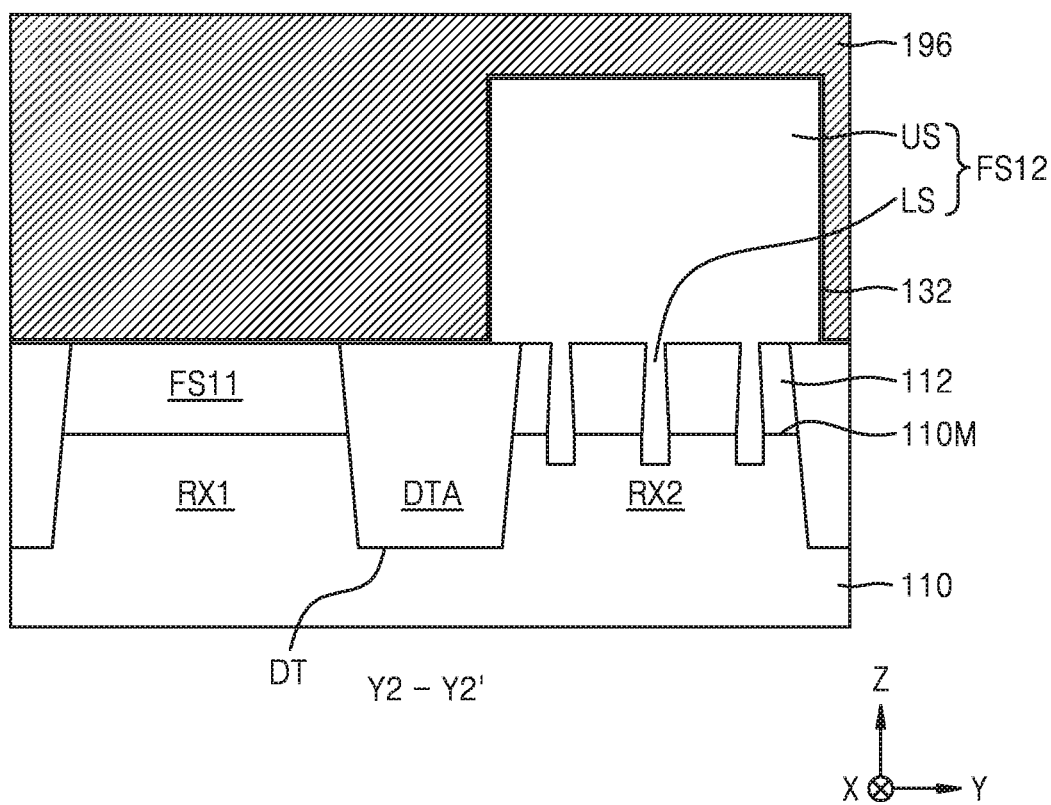
Figure 16A:
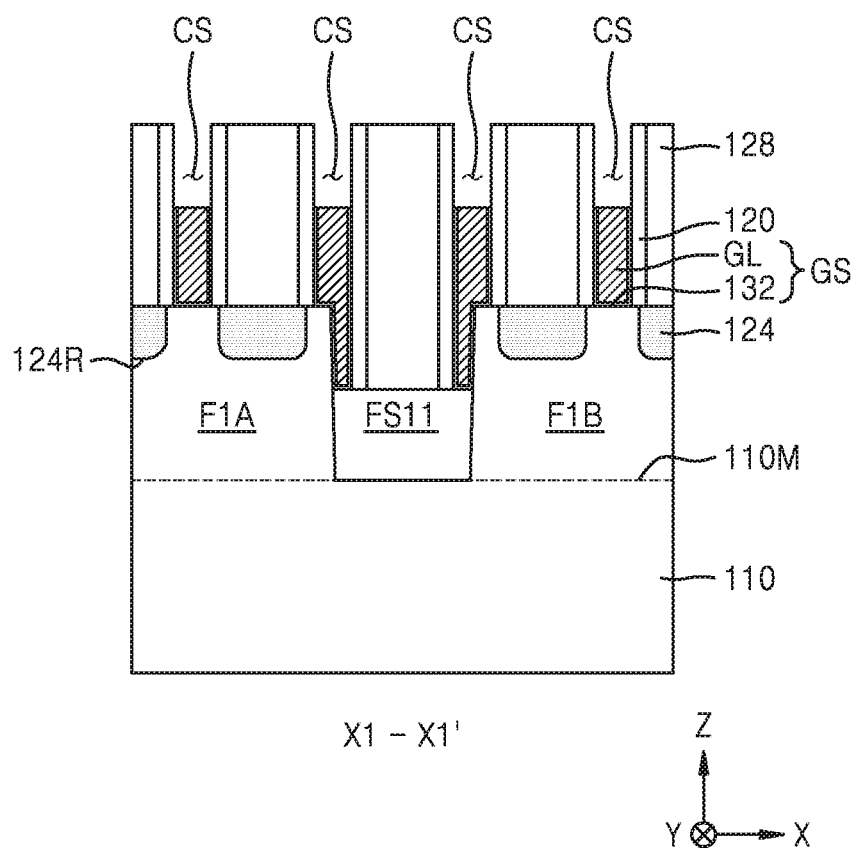
Figure 16B:
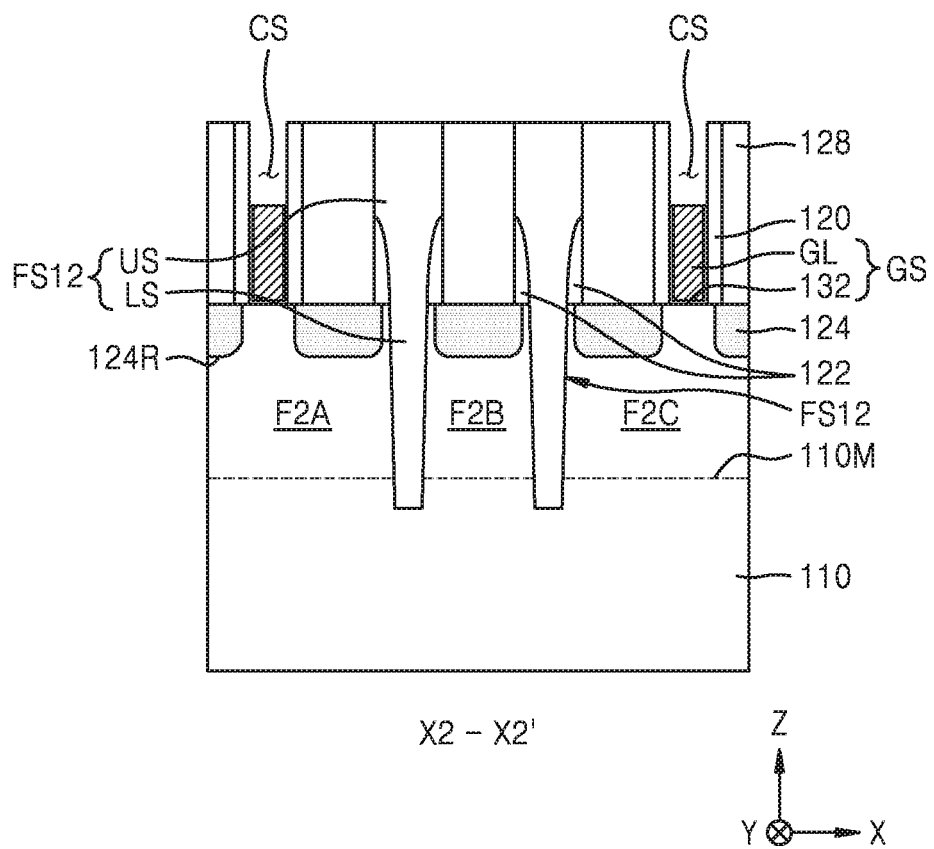
Figure 16C:
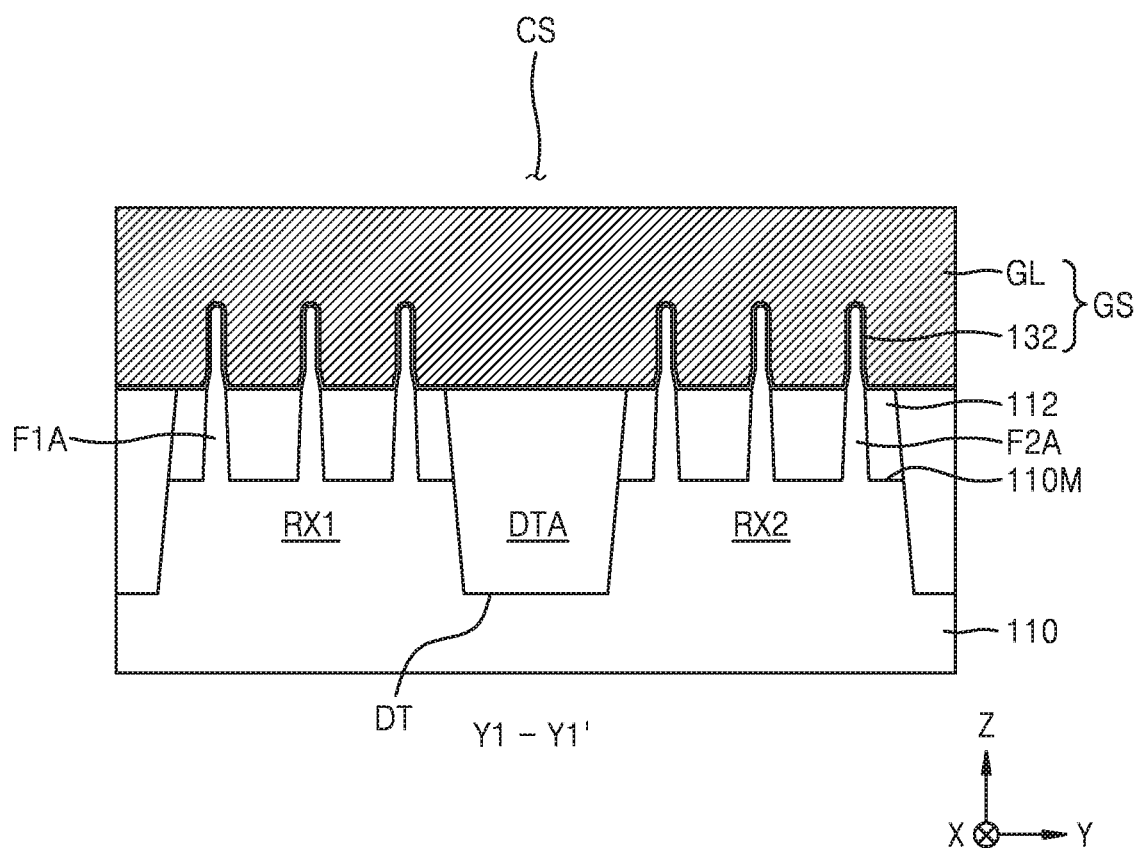
Figure 16D:
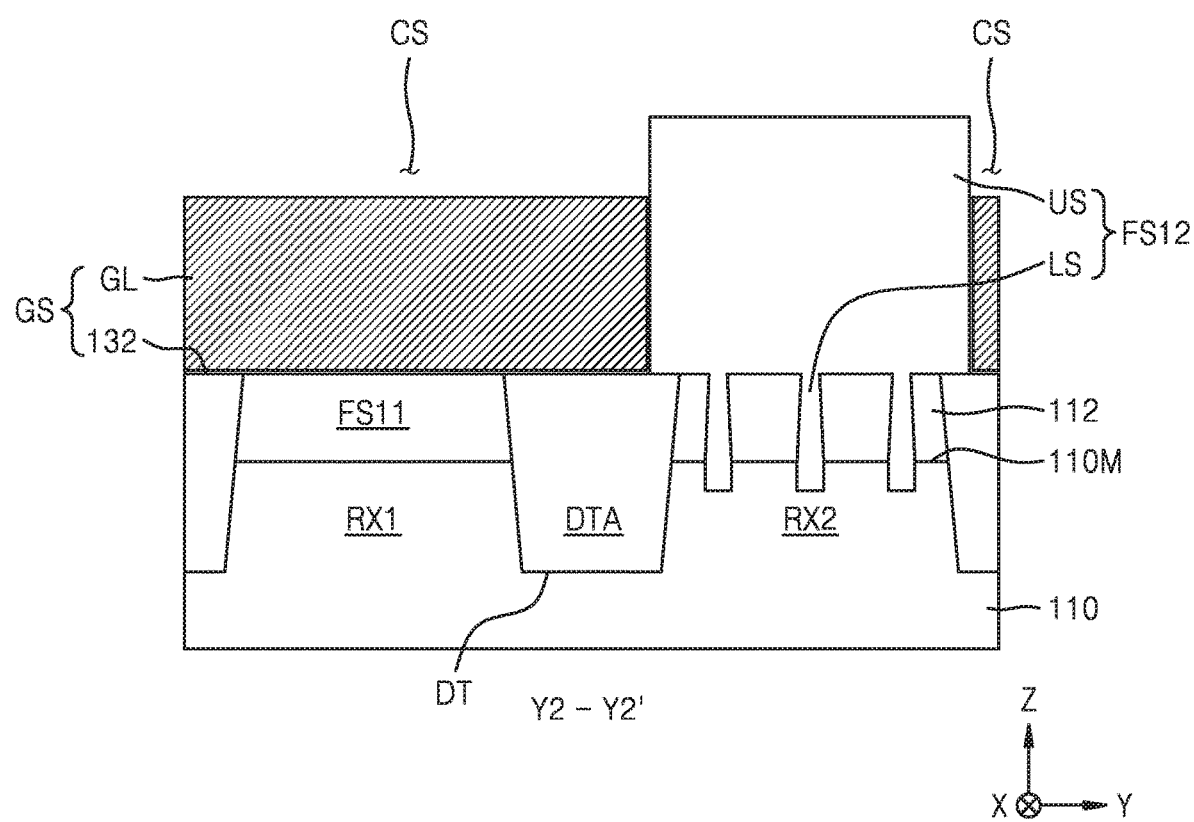
Figure 17A:
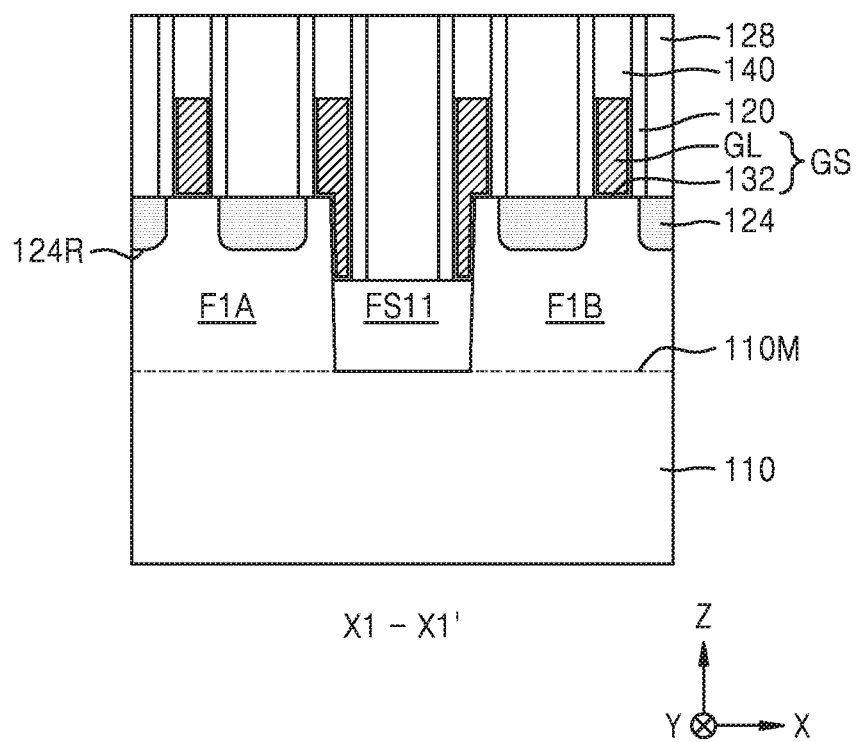
FIG. 17A is a cross-sectional view according to a process sequence of a portion corresponding to a cross-section taken along line X1-X1' of FIG. 1, each of FIGS. 7B, 8B, 9B, 10B, 11B, 12B, 13B, 14B, 15B, 16B.
Figure 17B:
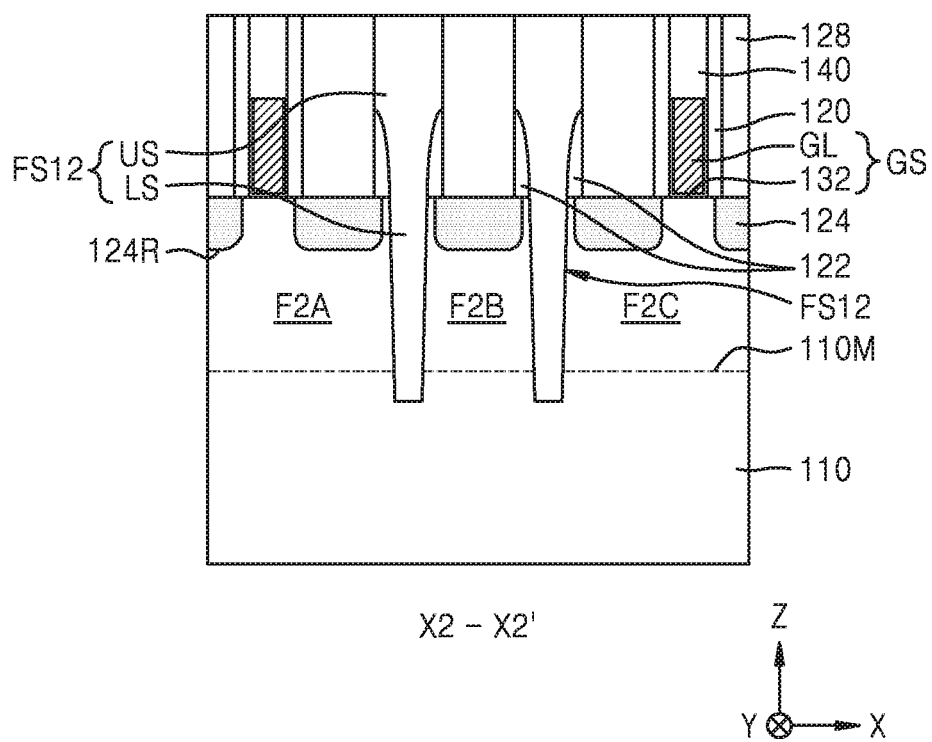
FIG. 17B is a cross-sectional view according to a process sequence of a portion corresponding to a cross-section taken along line X2-X2' of FIG. 1, each of FIGS. 7C, 8C, 9C, 10C, 11C, 12C, 13C, 14C, 15C, 16C.
Figure 17C:
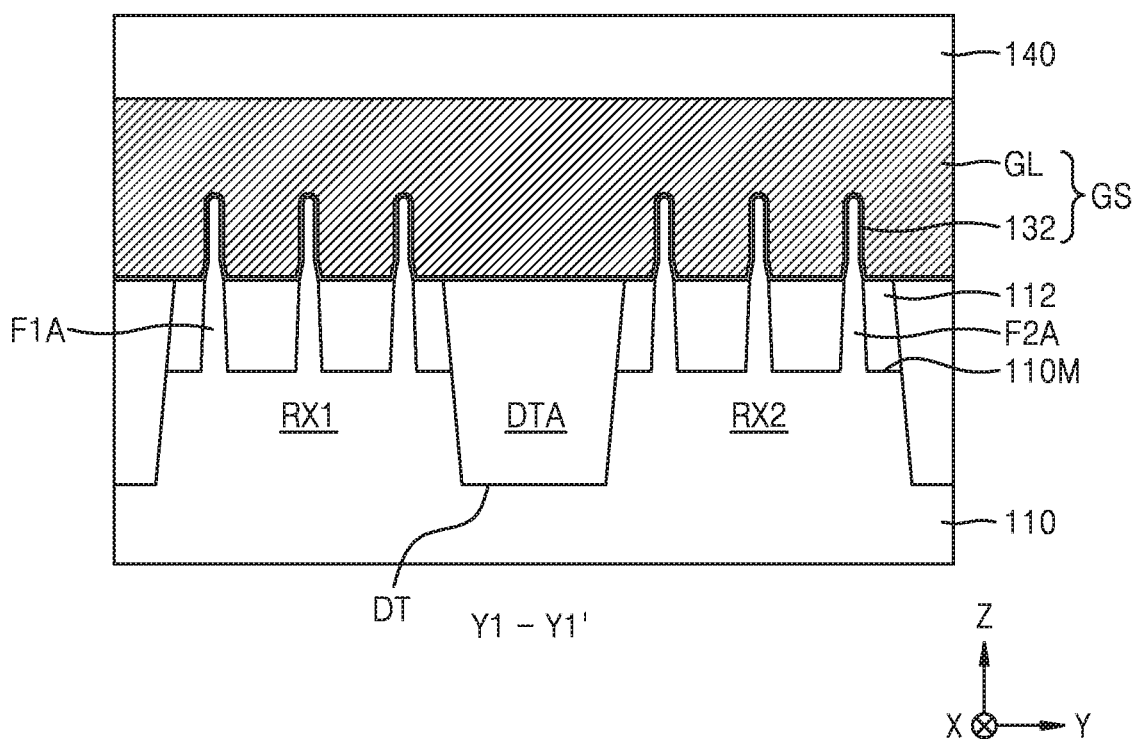
FIG. 17C is a cross-sectional view according to a process sequence of a portion corresponding to a cross-section taken along line Y1-Y1' of FIG. 1, and each of FIGS. 7D, 8D, 9D, 10D, 11D, 12D, 13D, 14D, 15D, 16D.
Figure 17D:
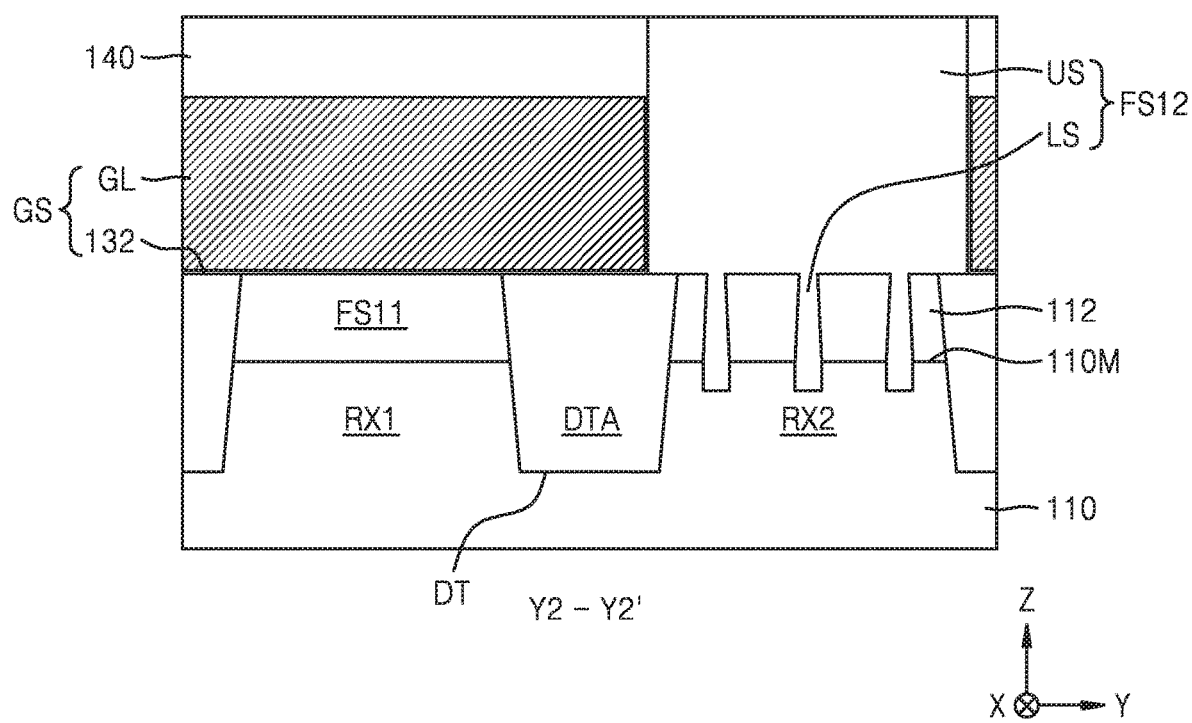

FIGS. 7A, 8A, . . . , and FIG. 17A each illustrate a cross-sectional structure according to a process sequence of a portion corresponding to a cross-section taken along line X1-X1' of FIG. 1. FIGS. 7B, 8B, . . . , and FIG. 17B each illustrate a cross-sectional structure according to a process sequence of a portion corresponding to a cross-section taken along line X2-X2' of FIG. 1. FIGS. 7C, 8C, . . . , and FIG. 17C each illustrate a cross-sectional structure according to a process sequence of a portion corresponding to a cross-section taken along line Y1-Y1' of FIG. 1. FIGS. 7D, 8D, . . . , and FIG. 17D each illustrate a cross-sectional structure according to a process sequence of a portion corresponding to a cross-section taken along line Y2-Y2' of FIG. 1. A method of manufacturing the integrated circuit device 100 illustrated in FIGS. 1 to 2D will now be described with reference to FIGS. 7A to 17D. In FIGS. 7A to 17D, elements that are the same as those in FIGS. 1 to 2D are designated by the same reference numerals, and a repeated description thereof is omitted below.

Referring to FIGS. 7A to 7D, a plurality of fin-type active regions protruding from the main surface 110M of the substrate 110 in an upper direction (the Z direction) and extending mutually parallel in the X direction may be formed by etching some regions of the substrate 110 in the first device region RX1 and the second device region RX2, and the device isolation film 112 covering both side walls of a lower portion of each of the plurality of fin-type active regions may be formed. The deep trench DT defining the first device region RX1 and the second device region RX2 may be formed by etching a portion of the device isolation film 112 and a portion of the substrate 110, and the device isolation region DTA may be formed by filling the deep trench DT with an insulating film. The plurality of fin-type active regions may include the plurality of first fin-type active regions F1A and F1B arranged in the first device region RX1 and a plurality of preliminary second fin-type active regions F2 arranged in the second device region RX2.

As the plurality of first fin-type active regions F1A and F1B are formed in the first device region RX1 on the main surface 110M of the substrate 110, a first fin separation space SS1 may be provided between a pair of first fin-type active regions F1A and F1B. A portion of the device isolation film 112 filling the first fin separation space SS1 over the first device region RX1 may be included in the first fin separation insulating portion FS11.

In the first device region RX1 and the second device region RX2, the plurality of first fin-type active regions F1A and F1B and the plurality of preliminary second fin-type active regions F2 may protrude above an upper surface of the device isolation film 112.

Referring to FIGS. 8A to 8D, a plurality of dummy gate structures DGS extending across the plurality of first fin-type active regions F1A and F1B and the plurality of preliminary second fin-type active regions F2 over the first fin separation insulating portion FS11, the device isolation film 112, and the device isolation region DTA are formed. The plurality of dummy gate structures DGS may each include a dummy gate insulating film D12, a dummy gate line D14, and a dummy gate insulating capping layer D16 stacked on the plurality of first fin-type active regions F1A and F1B and the plurality of preliminary second fin-type active regions F2 in this stated order. The dummy gate insulating film D12 may include silicon oxide. The dummy gate line D14 may include polysilicon. The dummy gate insulating capping layer D16 may include silicon nitride. Some dummy gate structures DGS from among the plurality of dummy gate structures DGS may extend in the Y direction while covering the first fin separation insulating portion FS11.

A first insulating spacer 120 may be formed on both side walls of the dummy gate structure DGS. ALD and/or CVD processes may be used to form the first insulating spacer 120.

The plurality of recesses 124R may be formed by partially etching the plurality of first fin-type active regions F1A and F1B and the plurality of preliminary second fin-type active regions F2 at both sides of the dummy gate structure DGS, and the plurality of source/drain regions 124 may be formed by forming semiconductor layers through epitaxial growth processes from the plurality of recesses 124R. In some example embodiments, the first device region RX1 may be an NMOS transistor region, and the second device region RX2 may be a PMOS transistor region. In this case, the plurality of source/drain regions 124 on the first device region RX1 may include an epitaxially grown Si layer or an epitaxially grown SiC layer, and the plurality of source/drain regions 124 on the second device region RX2 may include a plurality of epitaxially grown SiGe layers.

The inter-gate insulating film 128 covering the first fin separation insulating portion FS11, the device isolation film 112, and the plurality of source/drain regions 124 may be formed between the plurality of dummy gate structures DGS.

Some dummy gate structures DGS from among the plurality of dummy gate structures DGS may include a portion covering an upper surface of the first fin separation insulating portion FS11 on the first device region RX1 and filling a portion of the first fin separation space SS1 (refer to FIG. 7A) between the first fin-type active region F1A and the first fin-type active region F1B.

Referring to FIGS. 9A to 9D, the dummy gate insulating capping layer D16 and surrounding insulating films thereof may be removed from a result of FIGS. 8A to 8D through chemical mechanical polishing (CMP) processes and/or similar processes, and thus, the dummy gate line D14 is exposed and heights of the inter-gate insulating film 128 and the plurality of first insulating spacers 120 are lowered.

Referring to FIGS. 10A to 10D, a mask pattern M1 having an opening OP is formed on a result of FIGS. 9A to 9D.

The mask pattern M1 may include silicon nitride, silicon oxide, or a combination thereof. The mask pattern M1 may be or include a hard-mask pattern. Portions of the dummy gate line D14 corresponding to a region where the plurality of second fin separation insulating portions FS12 (refer to FIG. 1) are to be formed on the second device region RX2 may be exposed through the opening OP of the mask pattern M1.

Referring to FIGS. 11A to 11D, the dummy gate line D14 exposed through the opening OP of the mask pattern M1 is selectively removed by using the mask pattern M1 as an etching mask, and the dummy gate insulating film D12 exposed as a result is removed. Next, a plurality of second fin separation spaces SS2 are formed by etching the plurality of preliminary second fin-type active regions F2 exposed through the opening OP on the second device region RX2 after removal of the dummy gate insulating film D12. As a result of forming the plurality of second fin separation spaces SS2 on the second device region RX2, each preliminary second fin-type active region F2 may be separated into the plurality of second fin-type active regions F2A, F2B, and F2C.

The vertical level LV2 of a lowermost surface of the plurality of second fin separation spaces SS2 may be lower than the vertical level LV1 of the main surface 110M of the substrate 110.

While the dummy gate line D14, the dummy gate insulating film D12, and the plurality of second fin-type active regions F2A, F2B, and F2C are etched to form the plurality of second fin separation spaces SS2, the first insulating spacer 120 exposed together to an etching atmosphere through the opening OP may also be partially consumed, and thus, the plurality of second insulating spacers 122, which is a result of lowering a height of the first insulating spacer 120, may be formed.

As the plurality of second insulating spacers 122 are formed, an upper portion on an entrance side of the plurality of second fin separation spaces SS2 may be relatively wide in the X direction, and a portion of the plurality of second fin separation spaces SS2 confined by the plurality of second fin-type active regions F2A, F2B, and F2C may be relatively narrow in the X direction.

Referring to FIGS. 12A to 12D, an isolation insulating film 192 filling the plurality of second fin separation spaces SS2 and covering an upper surface of the mask pattern M1 is formed by depositing an insulating material on a result of FIGS. 11A to 11D where the plurality of second fin separation spaces SS2 are formed. The isolation insulating film 192 may include a silicon nitride film, a silicon oxide film, or a combination thereof.

Referring to FIGS. 13A to 13D, some films, e.g. unnecessary films, covering the inter-gate insulating film 128 are removed by planarization processes until an upper surface of the inter-gate insulating film 128 is exposed. As a result, the mask pattern M1 (refer to FIGS. 12A to 12D) covering the dummy gate line D14, the first insulating spacer 120, and the inter-gate insulating film 128 over the substrate 110 may be removed, and the plurality of second fin separation insulating portions FS12 having a planar upper surface may be obtained. The plurality of second fin separation insulating portions FS12 may each include the upper insulating portion US and the lower insulating portion LS integrally connected to each other.

Referring to FIGS. 14A to 14D, a plurality of gate structure spaces GA are prepared on the first device region RX1 and the second device region RX2 by removing a plurality of dummy gate lines D14 and a plurality of dummy gate insulating films D12 under the plurality of dummy gate lines D14 from a result of FIGS. 13A to 13D. The first insulating spacer 120, the plurality of first fin-type active regions F1A and F1B, the plurality of second fin-type active regions F2A and F2C, the first fin separation insulating portion FS11, the device isolation film 112, and the device isolation region DTA may be exposed through the plurality of gate structure spaces GA.

Referring to FIGS. 15A to 15D, the gate insulating film 132 and a gate conductive layer 196 are formed in the plurality of gate structure spaces GA (refer to FIGS. 14A to 14D).

In some example embodiments, before the gate insulating film 132 is formed, an interface film (not shown) may be formed on a surface of each of the plurality of first fin-type active regions F1A and F1B and the plurality of second fin-type active regions F2A and F2C exposed through the plurality of gate structure spaces GA. The interface film may be obtained by oxidizing a portion of the plurality of first fin-type active regions F1A and F1B and the plurality of second fin-type active regions F2A and F2C exposed in the plurality of gate structure spaces GA.

The gate insulating film 132 and the gate conductive layer 196 may be formed to cover an upper surface of the inter-gate insulating film 128 while filling a gate structure space GA. The gate insulating film 132 and the gate conductive layer 196 may each be formed by ALD, CVD, physical vapor deposition (PVD), metal organic ALD (MOALD), and/or metal organic CVD (MOCVD) processes.

Referring to FIGS. 16A to 16D, after some portions of the gate insulating film 132 and the gate conductive layer 196 (refer to FIGS. 15A to 15D) are removed to expose an upper surface of the inter-gate insulating film 128, portions of the gate insulating film 132 and the gate conductive layer 196 filling the plurality of gate structure spaces GA (refer to FIGS. 14A to 14D) are partially removed from the top, and thus, a plurality of capping spaces CS are prepared. A portion of the gate conductive layer 196 remaining in the gate structure space GA may be included in the gate line GL.

Referring to FIGS. 17A to 17D, the plurality of gate insulating capping layers 140 filling the plurality of capping spaces CS are formed on a result of FIGS. 16A to 16D.

A capping insulating film that is thick enough to fill the plurality of capping spaces CS may be formed over the substrate 110 to form the gate insulating capping layer 140, and then, some portions of the capping insulating film may be removed to expose an upper surface of each of the inter-gate insulating film 128 and the plurality of second fin separation insulating portions FS12. The gate insulating capping layer 140 may include a silicon nitride film.

Next, the upper insulating capping layer 150 and the interlayer insulating film 170 may be formed on a result of FIGS. 17A to 17D to form the integrated circuit device 100 illustrated in FIGS. 1 to 2D.

The method described above with reference to FIGS. 7A to 17D may be used to manufacture the integrated circuit device 100A illustrated in FIG. 3. However, during the processes described above with reference to FIGS. 12A to 12D, a silicon nitride film for forming the first insulating film 162A, a silicon oxide film for forming the second insulating film 164A, and a silicon oxide film for forming the third insulating film 166A may be formed in this stated order to form the isolation insulating film 192. Next, by using the method described above with reference to FIGS. 13A to 13D, some films, e.g. unnecessary films, covering the inter-gate insulating film 128 may be removed by planarization processes until an upper surface of the inter-gate insulating film 128 is exposed, and thus, the plurality of second fin separation insulating portions FS12A illustrated in FIG. 3 may be formed.

The method described above with reference to FIGS. 7A to 17D may be used to manufacture the integrated circuit device 100B illustrated in FIG. 4. However, during the processes described above with reference to FIGS. 12A to 12D, a silicon nitride film for forming the first insulating film 162B and a silicon oxide film for forming the second insulating film 164B may be formed in this stated order to form the isolation insulating film 192. Next, by using the method described above with reference to FIGS. 13A to 13D, some films, e.g. unnecessary films, covering the inter-gate insulating film 128 may be removed by planarization processes until an upper surface of the inter-gate insulating film 128 is exposed, and thus, the plurality of second fin separation insulating portions FS12B illustrated in FIG. 4 may be formed.

The method described above with reference to FIGS. 7A to 17D may be used to manufacture the integrated circuit device 100C illustrated in FIG. 5. However, as described above with reference to FIGS. 11A to 11D, the plurality of second fin separation spaces SS2 may be formed such that a vertical level of a lowermost surface of the plurality of second fin separation spaces SS2 is substantially the same as the vertical level LV1 of the main surface 110M of the substrate 110. Next, the plurality of second fin separation insulating portions FS12C may be formed in the plurality of second fin separation spaces SS2.

The method described above with reference to FIGS. 7A to 17D may be used to manufacture the integrated circuit device 100D illustrated in FIGS. 6A and 6B. However, during the processes described above with reference to FIGS. 7A to 7D, the first fin separation insulating portion FS11D and the device isolation film 112D each including the first insulating liner 114, the second insulating liner 116, and the buried insulating film 118 as illustrated in FIGS. 6A and 6B may be formed instead of the first fin separation insulating portion FS11 and the device isolation film 112 including the first fin separation insulating portion FS11. Next, the deep trench DT defining the first device region RX1 and the second device region RX2 may be formed by etching a portion of the device isolation film 112D and a portion of the substrate 110, and the device isolation region DTA may be formed by filling the deep trench DT with an insulating film.

Next, the processes described above with reference to FIGS. 8A to 17D may be performed to manufacture the integrated circuit device 100D illustrated in FIGS. 6A and 6B.

According to methods of manufacturing the integrated circuit devices 100, 100A, 100B, 100C, and 100D described above with reference to FIGS. 7A to 17D, carrier mobility in transistors including channel regions of different conductive types from each other in the first device region RX1 and the second device region RX2 may be independently controlled, e.g. delicately controlled, according to conductive types of channel regions by forming, on the first device region RX1, a fin separation region selected from various first fin separation insulating portions FS11 and FS11D and forming, on the second device region RX2, a fin separation region selected from various second fin separation insulating portions FS12, FS12A, FS12B, and FS12C. Accordingly, improved performance may be provided according to a channel type of each transistor in the first device region RX1 and the second device region RX2.

FIGS. 18 to 22 are plan layout diagrams for explaining an integrated circuit device according to some example embodiments. Integrated circuit devices having various structures according to some example embodiments will now be described with reference to FIGS. 18 to 22. In FIGS. 18 to 22, elements that are the same as those in FIG. 1 are designated by the same reference numerals, and a repeated description thereof is omitted below.

Figure 18:
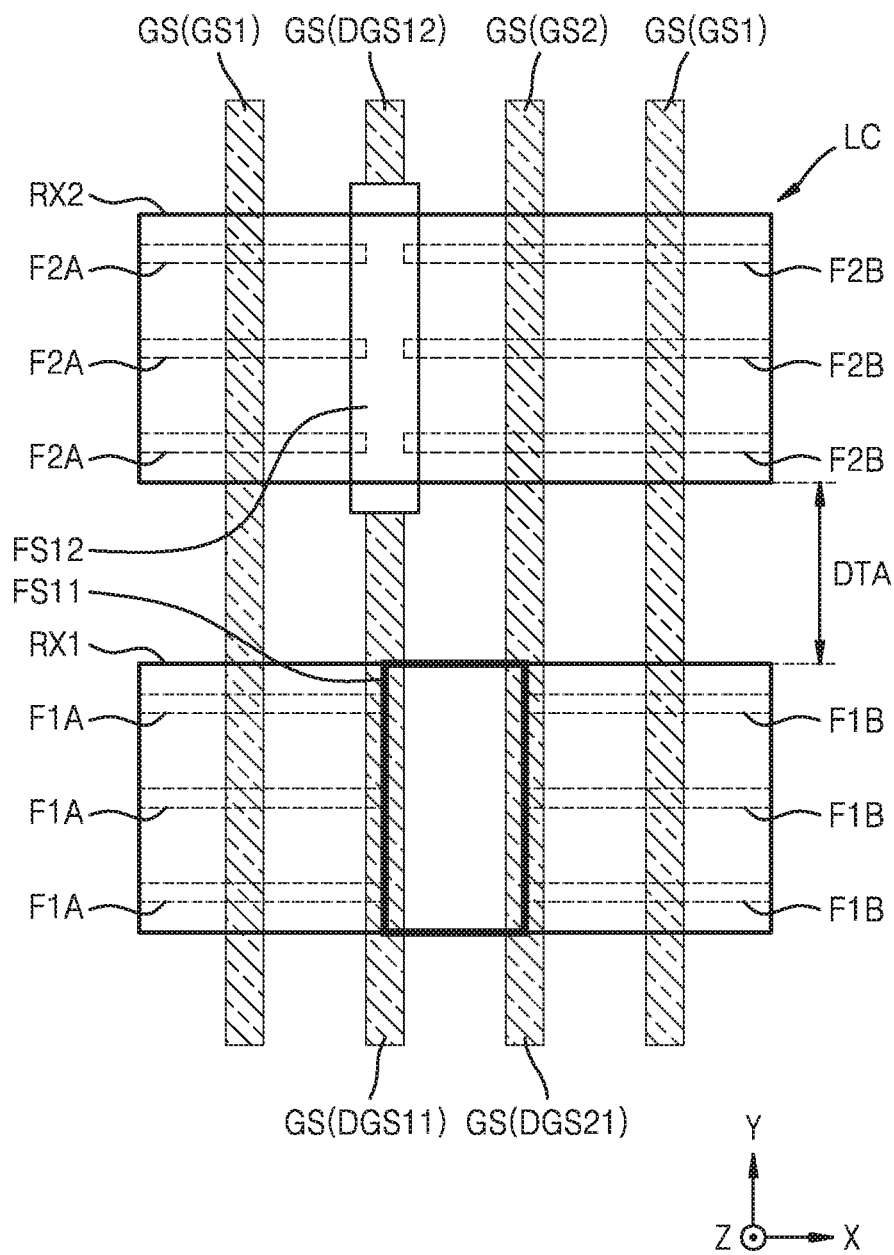
FIGS. 18 to 22 are plan layout diagrams for explaining an integrated circuit device according to some example embodiments, respectively.

An integrated circuit device 200 illustrated in FIG. 18 may have substantially the same components as the integrated circuit device 100 described above with reference to FIGS. 1 to 2D. However, the integrated circuit device 200 includes one second fin separation insulating portion FS12 on the second device region RX2.

In the integrated circuit device 200, the plurality of gate structures GS include one gate structure GS vertically overlapping the first fin separation insulating portion FS11 on the first device region RX1 and apart from the second fin separation insulating portion FS12 on the second device region RX2. The gate structure GS may be included in the dummy gate structure DGS21 on the first device region RX1 and may be included in a normal gate structure GS2 on the second device region RX2.

On the first device region RX1, the first fin separation insulating portion FS11 may face one second fin separation insulating portion FS12 and may vertically overlap two gate structures GS from among the plurality of gate structures GS. Portions of the plurality of gate structures GS vertically overlapping the first fin separation insulating portion FS11 may be included in the dummy gate structures DGS11 and DGS21.

Figure 19:
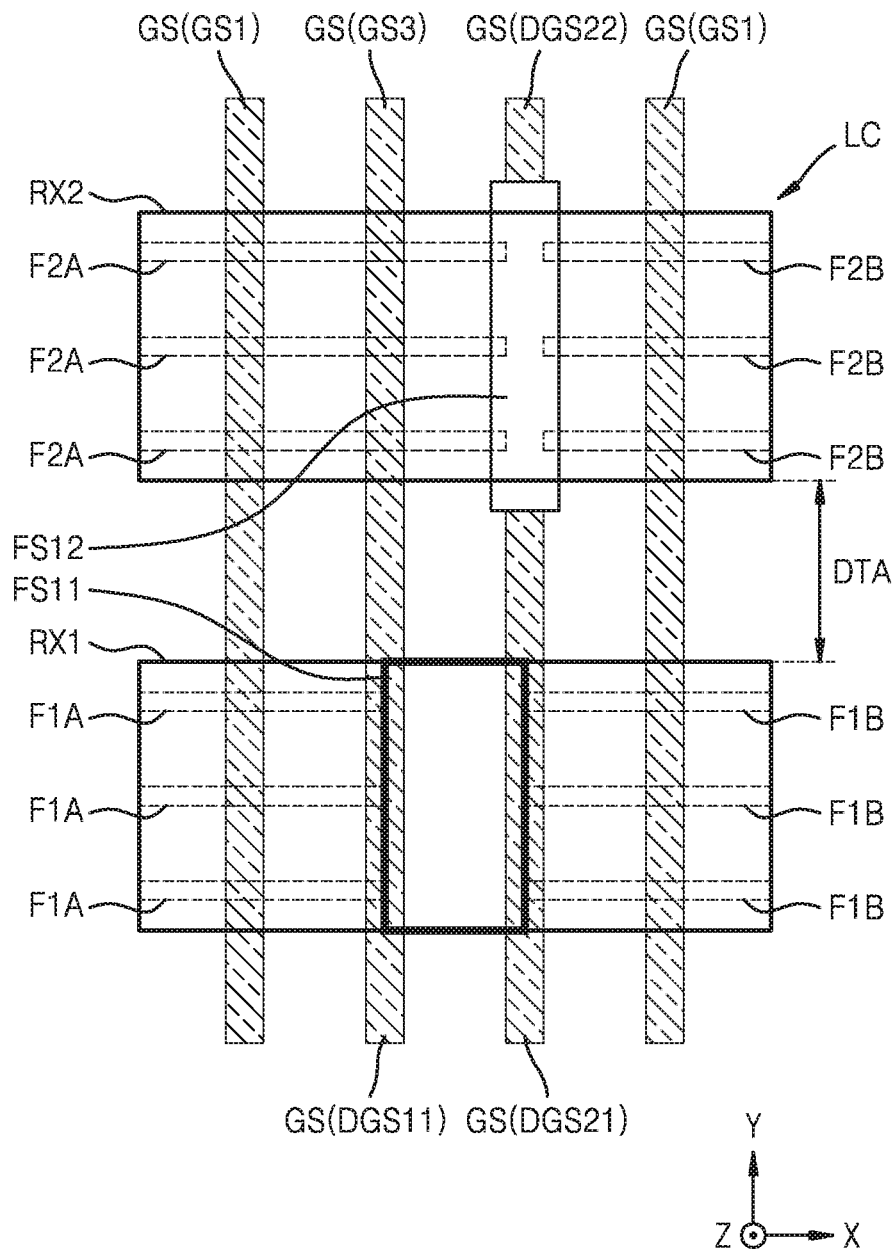

An integrated circuit device 300 illustrated in FIG. 19 may have substantially the same components as the integrated circuit device 200 described above with reference to FIG. 18. However, a position of the second fin separation insulating portion FS12 included in the integrated circuit device 300 is different from that of the second fin separation insulating portion FS12 illustrated in FIG. 18.

In the integrated circuit device 300, the plurality of gate structures GS include one gate structure GS vertically overlapping the first fin separation insulating portion FS11 on the first device region RX1 and apart from the second fin separation insulating portion FS12 on the second device region RX2. The gate structure GS may be included in the dummy gate structure DGS11 on the first device region RX1 and may be included in a normal gate structure GS3 on the second device region RX2.

Figure 20:
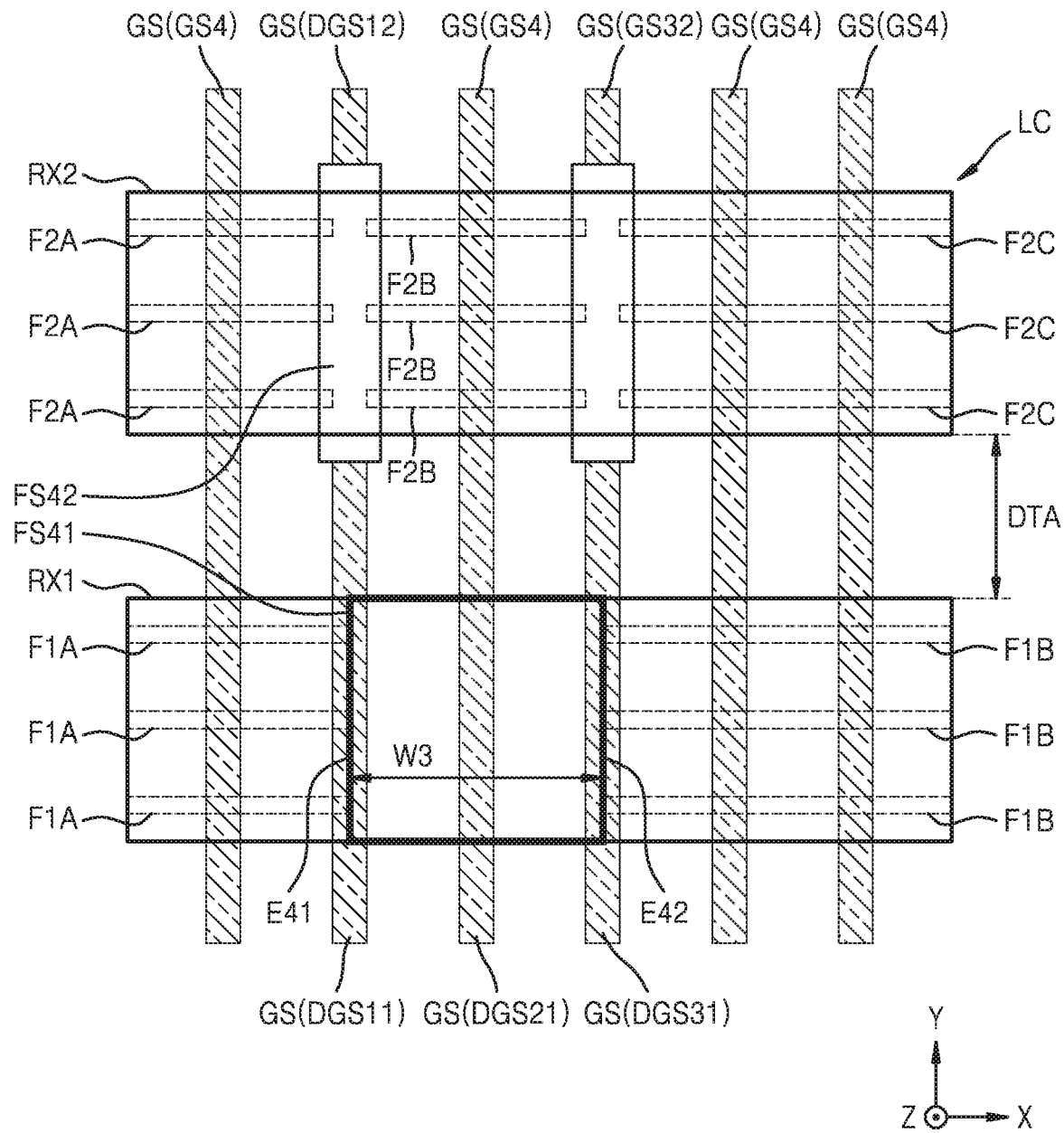

An integrated circuit device 400 illustrated in FIG. 20 may have substantially similar components to the integrated circuit device 100 described above with reference to FIGS. 1 to 2D. However, in the integrated circuit device 400, a first fin separation insulating portion FS41 may be over the first device region RX1. The first fin separation insulating portion FS41 may have a third width W3 that is greater than the first width W1 (refer to FIG. 1) of the first fin separation insulating portion FS11 in the X direction.

The first fin separation insulating portion FS41 may face two second fin separation insulating portions FS42 formed on the second device region RX2 and may vertically overlap three gate structures GS from among the plurality of gate structures GS. The two second fin separation insulating portions FS42 facing the first fin separation insulating portion FS41 may collinearly extend in the Y direction together with two gate structures GS covering both end portions E41 and E42 of the first fin separation insulating portion FS41 opposite to each other in the X direction, respectively.

In the integrated circuit device 400, the plurality of gate structures GS include one gate structure GS vertically overlapping the first fin separation insulating portion FS41 on the first device region RX1 and apart from the second fin separation insulating portion FS42 on the second device region RX2. The gate structure GS may be included in the dummy gate structure DGS21 on the first device region RX1 and may be included in a normal gate structure GS4 on the second device region RX2.

On the first device region RX1, the first fin separation insulating portion FS41 may vertically overlap the three gate structures GS from among the plurality of gate structures GS. Portions of the plurality of gate structures GS vertically overlapping the first fin separation insulating portion FS41 may be included in dummy gate structures DGS11, DGS21, and DGS31.

The plurality of gate structures GS may include one pair of dummy gate structures DGS11 and DGS12 and one pair of dummy gate structures DGS31 and DGS32 each apart from each other in the Y direction with the second fin separation insulating portion FS42 therebetween. The pair of dummy gate structures DGS11 and DGS12 and the pair of dummy gate structures DGS31 and DGS32 may each collinearly extend in the Y direction together with the second fin separation insulating portion FS42.

Figure 21:
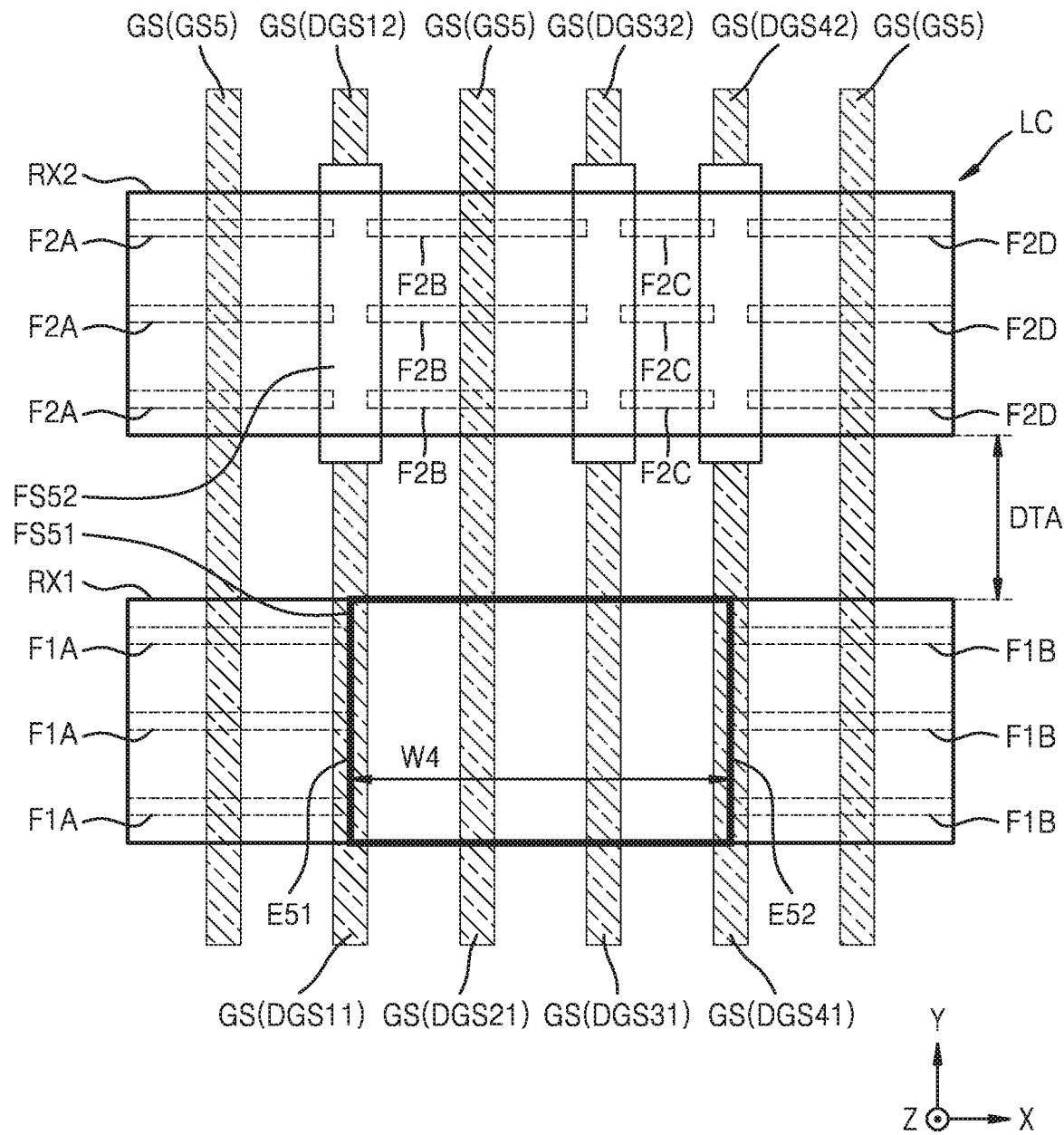

An integrated circuit device 500 illustrated in FIG. 21 may have substantially similar components to the integrated circuit device 400 described above with reference to FIG. 20. However, in the integrated circuit device 500, a first fin separation insulating portion FS51 may be over the first device region RX1, and a plurality of second fin separation insulating portions FS52 may be over the second device region RX2. The first fin separation insulating portion FS51 may have a fourth width W4 that is greater than the third width W3 (refer to FIG. 20) of the first fin separation insulating portion FS41 in the X direction.

The first fin separation insulating portion FS51 may face three second fin separation insulating portions FS52 and may vertically overlap four gate structures GS from among the plurality of gate structures GS. Portions of the plurality of gate structures GS vertically overlapping the first fin separation insulating portion FS51 may be included in dummy gate structures DGS11, DGS21, DGS31, and DGS41.

In the second device region RX2, there are a plurality of second fin-type active regions F2A, F2B, F2C, and F2D protruding from the substrate 110 in the Z direction and apart from one another. The plurality of second fin-type active regions F2A, F2B, F2C, and F2D may include four second fin-type active regions F2A, F2B, F2C, and F2D arranged in a straight line extending in the X direction across the three second fin separation insulating portions FS52.

In the integrated circuit device 500, the plurality of gate structures GS may include a plurality of pairs of dummy gate structures each apart from each other in the Y direction with a second fin separation insulating portion FS52 therebetween. The plurality of pairs of dummy gate structures may include one pair of dummy gate structures DGS11 and DGS12, one pair of dummy gate structures DGS31 and DGS32, and one pair of dummy gate structures DGS41 and DGS42. The plurality of pairs of dummy gate structures may each collinearly extend in the Y direction together with the second fin separation insulating portion FS52.

In the integrated circuit device 500, the plurality of gate structures GS include one gate structure GS vertically overlapping the first fin separation insulating portion FS51 on the first device region RX1 and apart from the second fin separation insulating portions FS52 on the second device region RX2. The gate structure GS may be included in the dummy gate structure DGS21 on the first device region RX1 and may be included in a normal gate structure GS5 on the second device region RX2.

The plurality of second fin separation insulating portions FS52 may include two second fin separation insulating portions FS52 collinearly extending in the Y direction together with gate structures GS covering both end portions E51 and E52 of the first fin separation insulating portion FS51 opposite to each other in the X direction. From among the plurality of second fin separation insulating portions FS52, a second fin separation insulating portion FS52 between the two second fin separation insulating portions FS52 may be omitted. For example, from among the plurality of second fin separation insulating portions FS52 over the second device region RX2, the second fin separation insulating portion FS52 other than the two second fin separation insulating portions FS52 arranged on outermost sides in the X direction may be omitted. In this case, from among the plurality of gate structures GS, the dummy gate structure DGS31 vertically overlapping the first fin separation insulating portion FS51 may continuously extend to an upper portion of the second device region RX2 in the Y direction in a similar way to the normal gate structure GS5.

Detailed components of the first fin separation insulating portion FS51 and the plurality of second fin separation insulating portions FS52 are substantially similar to those of the first fin separation insulating portion FS11 and the plurality of second fin separation insulating portions FS12 described above with reference to FIGS. 1 to 2D.

Figure 22:
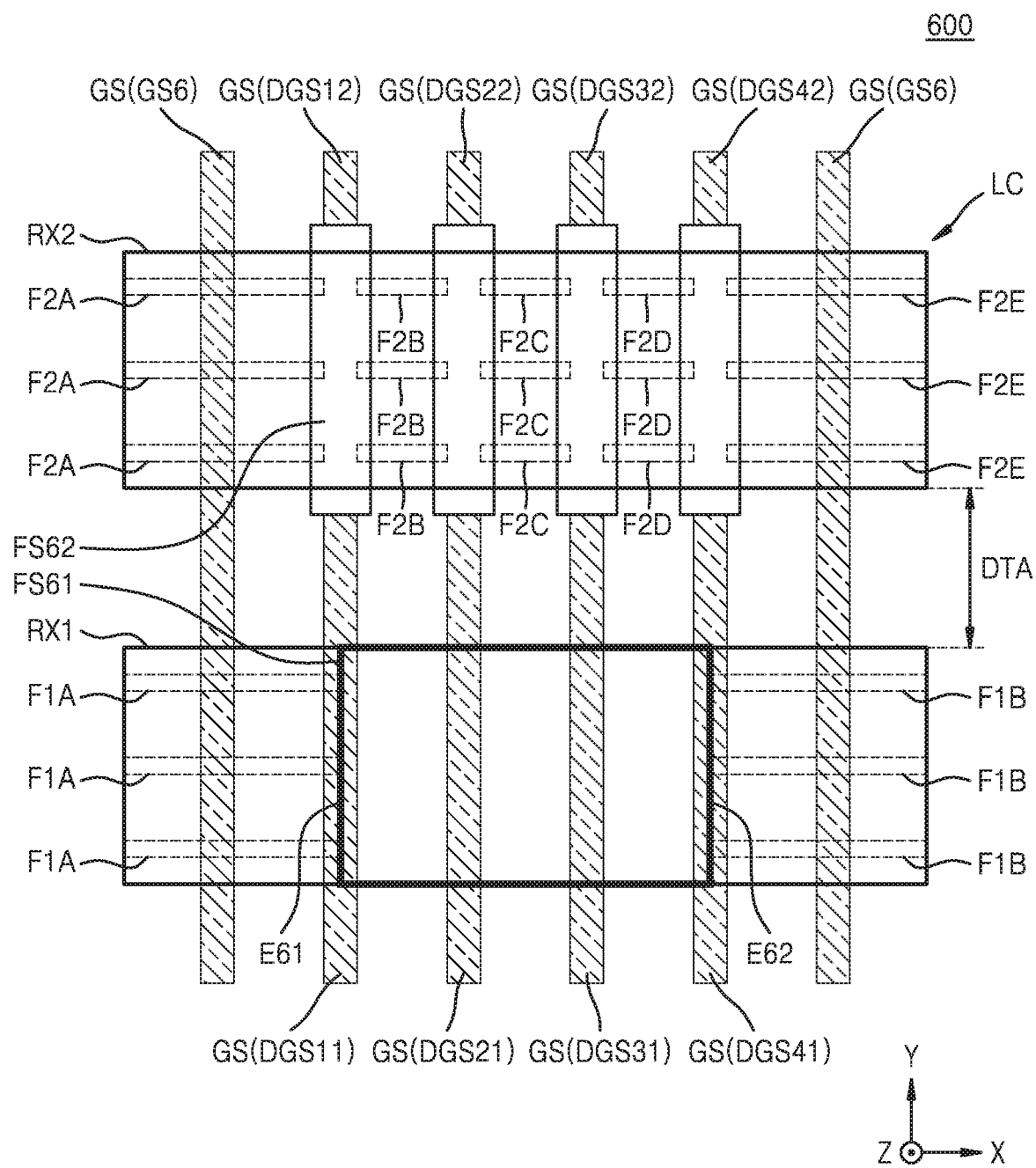

An integrated circuit device 600 illustrated in FIG. 22 may have substantially similar components to the integrated circuit device 500 described above with reference to FIG. 21. However, in the integrated circuit device 600, a first fin separation insulating portion FS61 may be over the first device region RX1, and a plurality of second fin separation insulating portions FS62 may be over the second device region RX2.

The first fin separation insulating portion FS61 may face four second fin separation insulating portions FS62 and may vertically overlap four gate structures GS from among the plurality of gate structures GS.

In the second device region RX2, there are a plurality of second fin-type active regions F2A, F2B, F2C, F2D, and F2E protruding from the substrate 110 in the Z direction and apart from one another. The plurality of second fin-type active regions F2A, F2B, F2C, F2D, and F2E may include five second fin-type active regions F2A, F2B, F2C, F2D, and F2E arranged in a straight line extending in the X direction across the four second fin separation insulating portions FS62.

In the integrated circuit device 600, the plurality of gate structures GS may include a plurality of pairs of dummy gate structures each apart from each other in the Y direction with a second fin separation insulating portion FS62 therebetween. The plurality of pairs of dummy gate structures may include one pair of dummy gate structures DGS11 and DGS12, one pair of dummy gate structures DGS21 and DGS22, one pair of dummy gate structures DGS31 and DGS32, and one pair of dummy gate structures DGS41 and DGS42. The plurality of pairs of dummy gate structures may each collinearly extend in the Y direction together with the second fin separation insulating portion FS62. The plurality of second fin separation insulating portions FS62 may include two second fin separation insulating portions FS62 collinearly extending in the Y direction together with gate structures GS covering both end portions E61 and E62 of the first fin separation insulating portion FS61 opposite to each other in the Y direction. From among the plurality of second fin separation insulating portions FS62, at least one of the plurality of second fin separation insulating portions FS62 between the two second fin separation insulating portions FS62 may be omitted. In this case, at least one of the dummy gate structures DGS21 and DGS31 vertically overlapping the first fin separation insulating portion FS61 may continuously extend to an upper portion of the second device region RX2 in the Y direction in a similar way to the normal gate structure GS5 illustrated in FIG. 21.

Detailed components of the first fin separation insulating portion FS61 and the plurality of second fin separation insulating portions FS62 are substantially similar to those of the first fin separation insulating portion FS11 and the plurality of second fin separation insulating portions FS12 described above with reference to FIGS. 1 to 2D.

The integrated circuit devices 200, 300, 400, 500, and 600 described above with reference to FIGS. 18 to 22 may be manufactured by variously modifying and changing a method of manufacturing an integrated circuit device described above with reference to FIGS. 7A to 17D within the scope of inventive concepts.

Figure 23A:
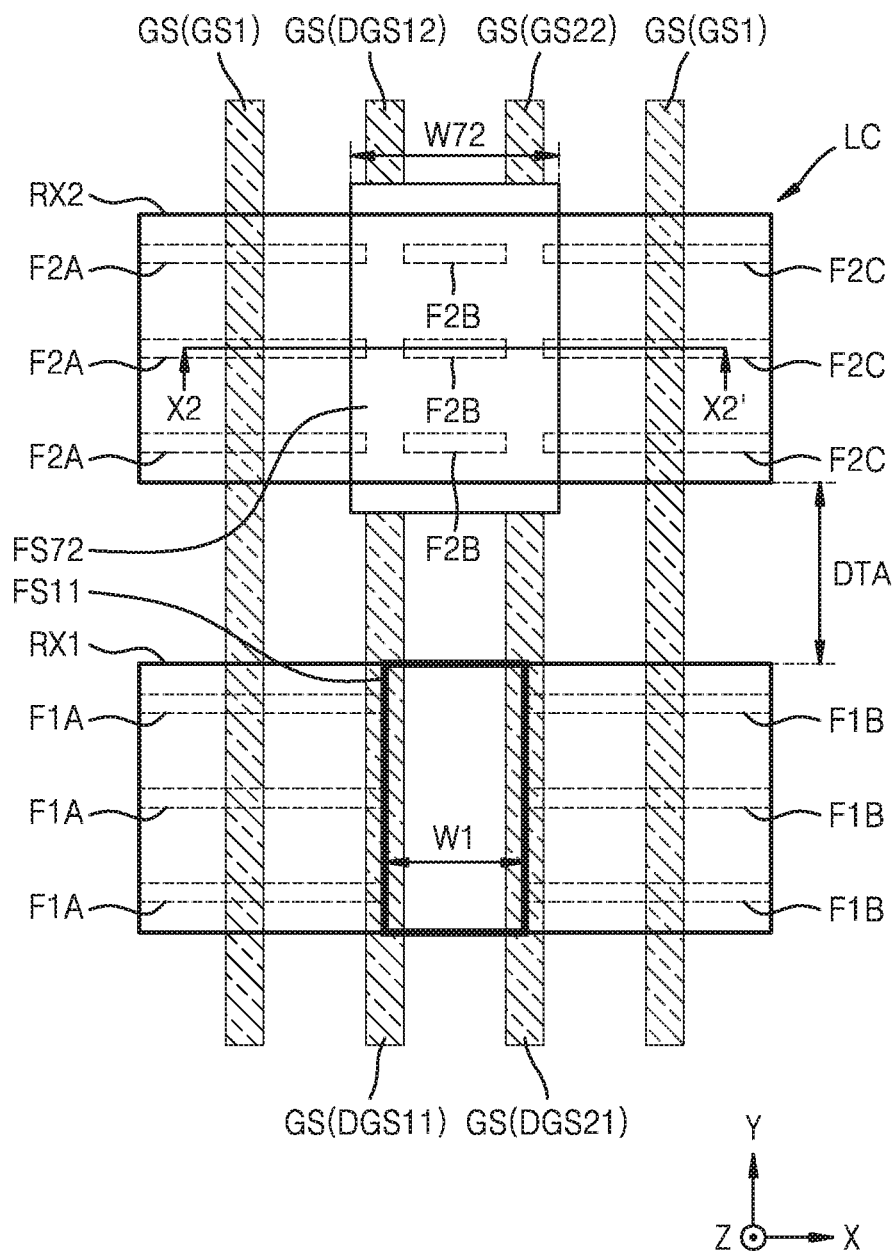
FIG. 23A is a plan layout diagram illustrating major components of an integrated circuit device according to some example embodiments.
Figure 23B:
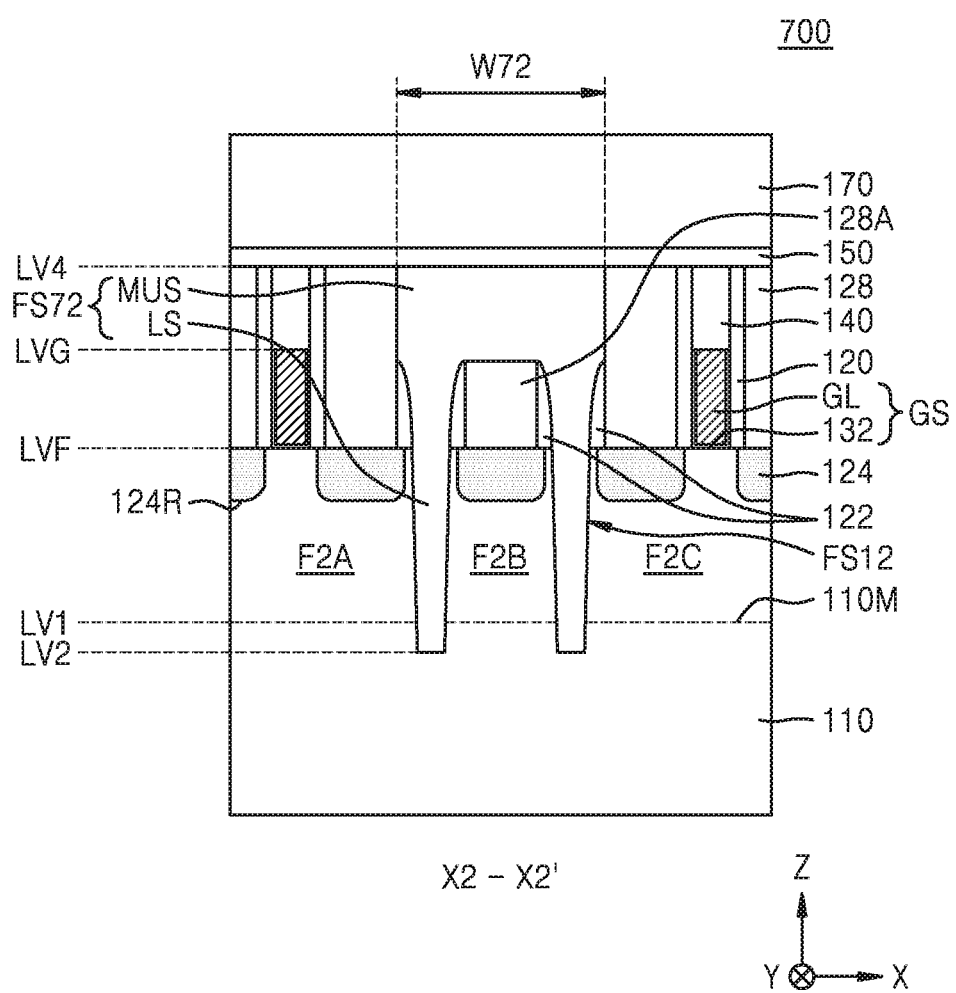
FIG. 23B is a cross-sectional view taken along line X2-X2' of FIG. 23A.

FIGS. 23A and 23B are diagrams for explaining an integrated circuit device 700 according to some example embodiments. FIG. 23A is a plan layout diagram for explaining major components of the integrated circuit device 700, and FIG. 23B is a cross-sectional view taken along line X2-X2' of FIG. 23A. In FIGS. 23A and 23B, elements that are the same as those in FIGS. 1 to 2D are designated by the same reference numerals, and a repeated description thereof is omitted below.

Referring to FIGS. 23A and 23B, the integrated circuit device 700 may have substantially the same components as the integrated circuit device 100 described above with reference to FIGS. 1 to 2D. However, the integrated circuit device 700 includes one second fin separation insulating portion FS72 on the second device region RX2.

The second fin separation insulating portion FS72 may have a width W72 that is greater than the first width W1 of the first fin separation insulating portion FS11 in the X direction.

The second fin separation insulating portion FS72 may include one upper insulating portion MUS and a plurality of lower insulating portions LS integrally connected to the upper insulating portion MUS. The inter-gate insulating film 128 may include a separation insulating portion 128A between two neighboring lower insulating portions LS. The separation insulating portion 128A may have a height lower than another portion of the inter-gate insulating film 128. The upper insulating portion MUS may extend to cover an upper surface of the separation insulating portion 128A of the inter-gate insulating film 128.

To manufacture the integrated circuit device 700 illustrated in FIGS. 23A and 23B, the method described above with reference to FIGS. 7A to 17D may be used. However, during the processes described above with reference to FIGS. 11A to 11D, when the plurality of preliminary second fin-type active regions F2 are etched to form the plurality of second fin separation spaces SS2 after the dummy gate line D14 exposed through the opening OP and the dummy gate insulating film D12 are removed, a horizontal width of the opening OP of the mask pattern M1 may be adjusted to a desired size, and an etching atmosphere having etch selectivity of the inter-gate insulating film 128 properly controlled may be applied. Accordingly, an etching amount of a portion of the inter-gate insulating film 128 exposed through the opening OP may be increased compared to that illustrated in FIGS. 11A to 11D, and thus, a thickness of a portion of the inter-gate insulating film 128 between two neighboring second fin separation spaces SS2 may be decreased to form the separation insulating portion 128A. Next, the processes described above with reference to FIGS. 12A to 17D may be performed to manufacture the integrated circuit device 700 illustrated in FIGS. 23A and 23B.

Figure 24:
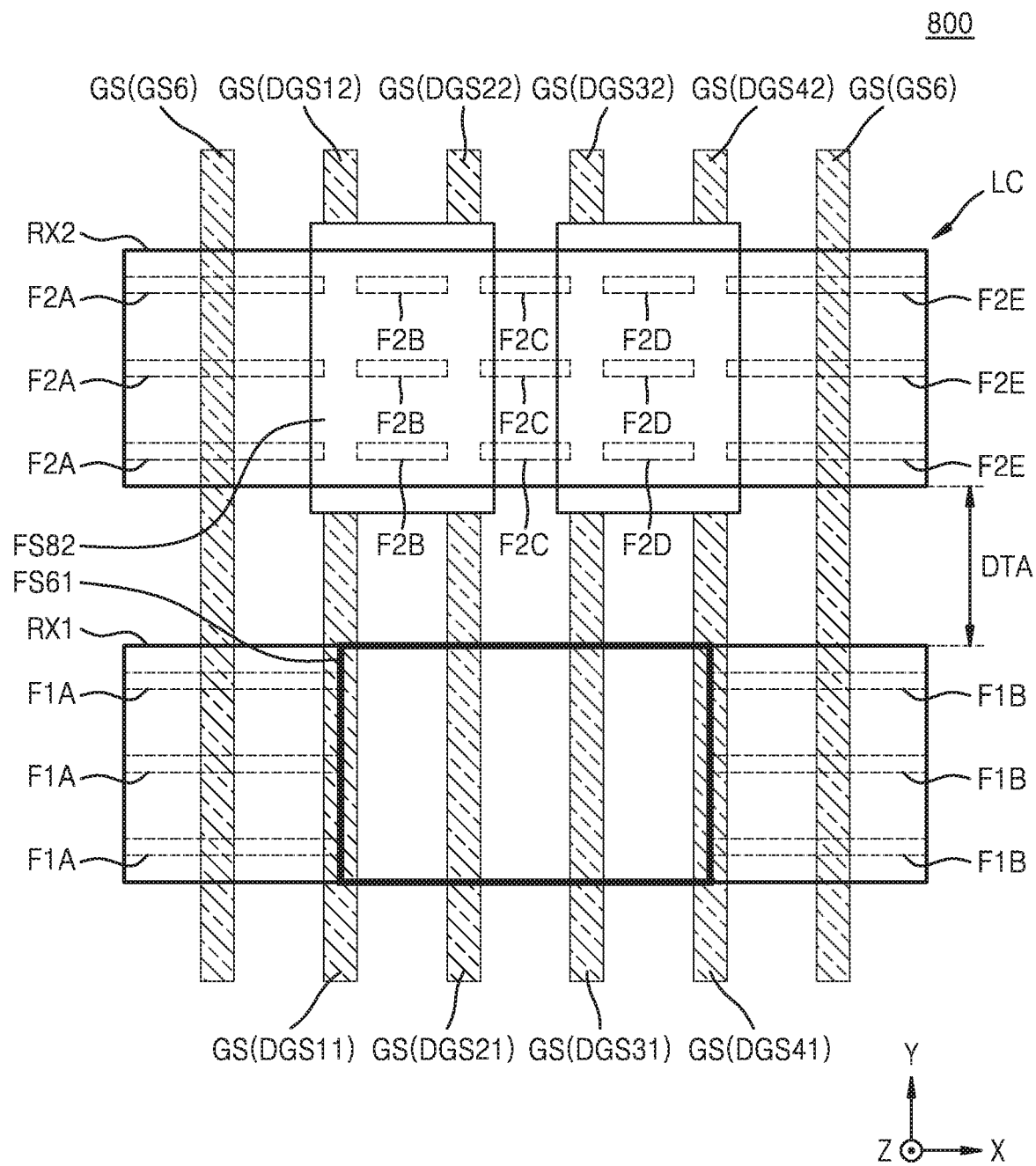
FIGS. 24 and 25 are plan layout diagrams for explaining an integrated circuit device according to some example embodiments, respectively.

FIG. 24 is a plan layout diagram for explaining an integrated circuit device 800 according to some example embodiments. In FIG. 24, elements that are the same as those in FIG. 22 are designated by the same reference numerals, and a repeated description thereof is omitted below.

Referring to FIG. 24, the integrated circuit device 800 may have substantially the same components as the integrated circuit device 600 described above with reference to FIG. 22. However, the integrated circuit device 800 includes a plurality of second fin separation insulating portions FS82 on the second device region RX2.

The plurality of second fin separation insulating portions FS82 may each have a cross-sectional structure that is the same as or similar to that of the second fin separation insulating portion FS72 illustrated in FIG. 23B. In some example embodiments, as illustrated in FIG. 23B, the plurality of second fin separation insulating portions FS82 may each include one upper insulating portion MUS and a plurality of lower insulating portions LS integrally connected to the upper insulating portion MUS. The plurality of second fin separation insulating portions FS82 may be spaced apart from each other in the X direction.

To manufacture the integrated circuit device 800 illustrated in FIG. 24, the manufacturing method illustrated in FIGS. 7A to 17D may be used, and a method changed with reference to the above description of the manufacturing method of FIGS. 23A and 23B may be used.

Figure 25:
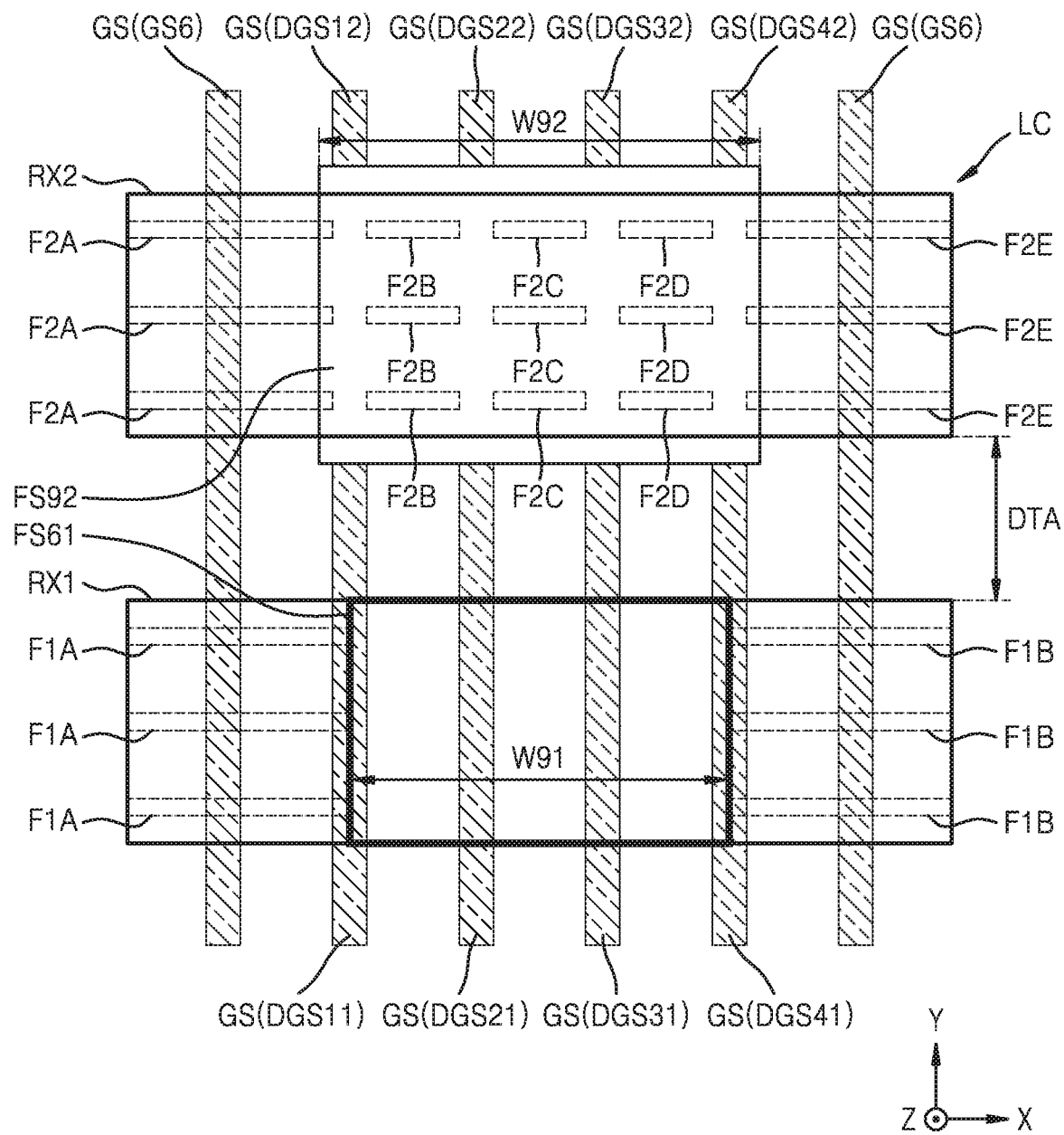

FIG. 25 is a plan layout diagram for explaining an integrated circuit device 900 according to some example embodiments. In FIG. 25, elements that are the same as those in FIG. 22 are designated by the same reference numerals, and a repeated description thereof is omitted below.

Referring to FIG. 25, the integrated circuit device 900 may have substantially the same components as the integrated circuit device 600 described above with reference to FIG. 22. However, the integrated circuit device 900 includes one second fin separation insulating portion FS92 on the second device region RX2.

The second fin separation insulating portion FS92 may have a width W92 that is greater than the width W91 of the first fin separation insulating portion FS61 in the X direction.

In a similar way to a cross-sectional structure of the second fin separation insulating portion FS72 illustrated in FIG. 23B, the second fin separation insulating portion FS92 may include one upper insulating portion and a plurality of lower insulating portions integrally connected to the upper insulating portion. In some example embodiments, the second fin separation insulating portion FS92 may include one upper insulating portion and four lower insulating portions integrally connected to the upper insulating portion, and the four lower insulating portions may each have the structure described above with respect to a lower insulating portion LS illustrated in FIG. 23B.

To manufacture the integrated circuit device 900 illustrated in FIG. 25, the manufacturing method illustrated in FIGS. 7A to 17D may be used, and a method changed with reference to the above description of the manufacturing method of FIGS. 23A and 23B may be used.

In some example embodiments, at least some of the second fin separation insulating portions FS12, FS42, FS52, FS62, FS72, FS82, and FS92 of the integrated circuit devices 200, 300, 400, 500, 600, 700, 800, and 900 illustrated in FIGS. 18 to 25 may have a structure that is the same as or similar to that of the second fin separation insulating portion FS12A illustrated in FIG. 3, the second fin separation insulating portion FS12B illustrated in FIG. 4, or the second fin separation insulating portion FS12C illustrated in FIG. 5. In some example embodiments, at least one of the first fin separation insulating portions FS41, FS51, and FS61 of the integrated circuit devices 400, 500, 600, 700, 800, and 900 illustrated in FIGS. 20 to 25 may have a structure that is the same as or similar to that of the first fin separation insulating portion FS11D illustrated in FIG. 6B.

According to one or more example embodiments, components of the first fin separation region FSA1 arranged on the first device region RX1 and the second fin separation region FSA2 arranged on the second device region RX2 as illustrated in FIG. 1 may be variously modified by combining various components illustrated in FIGS. 3 to 25. Accordingly, improved performance may be provided according to a channel type of each transistor in the first device region RX1 and the second device region RX2, and reliability of an integrated circuit device may be improved.

While inventive concepts has been particularly shown and described with reference to embodiments thereof, it will be understood that various changes in form and details may be made therein without departing from the spirit and scope of the following claims.

What is claimed is:
1. An integrated circuit device comprising:
a substrate comprising a first device region and a second device region;
a first fin separation insulating portion over the first device region;

a pair of first fin-type active regions spaced apart from each other in the first device region, with the first fin separation insulating portion therebetween, a first element of the pair of first fin-type active regions collinearly extending in a first horizontal direction with a second element of the pair of first fin-type active regions;

a first dummy gate structure covering an upper surface of the first fin separation insulating portion to vertically overlap the first fin separation insulating portion, and extending in a second horizontal direction over the first device region, the second horizontal direction crossing the first horizontal direction;

a second fin separation insulating portion spaced apart from the first fin separation insulating portion and arranged over the second device region, and collinearly extending with the first dummy gate structure in the second horizontal direction; and a plurality of second fin-type active regions spaced apart from each other in the second device region with the second fin separation insulating portion therebetween, the plurality of second fin-type active regions collinearly extending in the first horizontal direction, wherein a vertical level of a lowermost surface of the second fin separation insulating portion is lower than a vertical level of a lowermost surface of the first fin separation insulating portion.

2. The integrated circuit device of claim 1, wherein a vertical level of an uppermost surface of the first fin separation insulating portion is lower than a vertical level of an uppermost surface of the pair of first fin-type active regions.

3. The integrated circuit device of claim 1, wherein a vertical level of an uppermost surface of the second fin separation insulating portion is higher than a vertical level of an uppermost surface of the first fin separation insulating portion.

4. The integrated circuit device of claim 1, wherein a vertical level of an uppermost surface of the second fin separation insulating portion is higher than a vertical level of an uppermost surface of the first dummy gate structure.

5. The integrated circuit device of claim 1, wherein the vertical level of the lowermost surface of the second fin separation insulating portion is lower than a vertical level of a lowermost surface of each of the plurality of second fin-type active regions.

6. The integrated circuit device of claim 1, wherein
the first fin separation insulating portion has a first width in the first horizontal direction, and
the second fin separation insulating portion has a second width in the first horizontal direction, the second width being less than the first width.

7. The integrated circuit device of claim 1, wherein, in the first horizontal direction, a width of the second fin separation insulating portion is greater than a width of the first dummy gate structure.

8. The integrated circuit device of claim 1, wherein the first dummy gate structure comprises:
a first portion vertically overlapping the first fin separation insulating portion; and
a second portion vertically overlapping one first fin-type active region from among the pair of first fin-type active regions,
wherein a vertical length of the first portion is greater than a vertical length of the second portion.

9. The integrated circuit device of claim 1, further comprising:
a second dummy gate structure covering the upper surface of the first fin separation insulating portion to vertically overlap the first fin separation insulating portion, and extending in the second horizontal direction over the first device region; and
a third fin separation insulating portion spaced apart from the first fin separation insulating portion and arranged over the second device region, and collinearly extending with the second dummy gate structure in the second horizontal direction.

10. The integrated circuit device of claim 1, further comprising:
a pair of third dummy gate structures spaced apart from each other with the second fin separation insulating portion therebetween and collinearly extending in the second horizontal direction,
wherein one of the pair of third dummy gate structures vertically overlaps the first fin separation insulating portion over the first device region.

11. An integrated circuit device comprising:
a substrate comprising a first device region and a second device region;
a first fin separation insulating portion in the first device region;
a pair of first fin-type active regions spaced apart from each other in the first device region with the first fin separation insulating portion therebetween, one element of the pair of first fin-type active regions collinearly extending in a first horizontal direction with the other element of the pair of first fin-type active regions;
a plurality of dummy gate structures extending parallel to each other in a second horizontal direction over the first fin separation insulating portion, the second horizontal direction crossing the first horizontal direction;
at least one second fin separation insulating portion spaced apart from the first fin separation insulating portion and arranged over the second device region; and
a plurality of second fin-type active regions spaced apart from each other in the second device region with the at least one second fin separation insulating portion therebetween and collinearly extending in the first horizontal direction,
wherein a vertical level of a lowermost surface of the at least one second fin separation insulating portion is equal to or lower than a vertical level of a lowermost surface of the first fin separation insulating portion.

12. The integrated circuit device of claim 11, wherein the at least one second fin separation insulating portion collinearly extends with at least one dummy gate structure selected from the plurality of dummy gate structures.

13. The integrated circuit device of claim 11, wherein a vertical level of a lowermost surface of the plurality of dummy gate structures is lower than a vertical level of an uppermost surface of the pair of first fin-type active regions.

14. The integrated circuit device of claim 11, wherein the at least one second fin separation insulating portion comprises:
an upper insulating portion at the second device region, the upper insulating portion extending in the second horizontal direction; and
a plurality of lower insulating portions integrally connected to the upper insulating portion, the plurality of lower insulating portions protruding from the upper insulating portion toward the substrate.

15. The integrated circuit device of claim 11, further comprising:
- a gate structure over the first device region and the second device region, the gate structure extending parallel to the plurality of dummy gate structures,
- wherein a vertical level of an uppermost surface of the at least one second fin separation insulating portion is higher than a vertical level of an uppermost surface of the gate structure, and the vertical level of the lowermost surface of the at least one second fin separation insulating portion is lower than the vertical level of the lowermost surface of the first fin separation insulating portion.

16. The integrated circuit device of claim 11, wherein the first fin separation insulating portion has a first width in the first horizontal direction, and
- a plurality of second fin separation regions are arranged on a region of the second device region, and a sum of widths of the plurality of second fin separation regions in the first direction is less than or equal to the first width.

17. An integrated circuit device comprising:
- a substrate comprising a first device region and a second device region spaced apart from each other;
- a device isolation region between the first device region and the second device region;
- a first fin separation insulating portion over the first device region;
- a plurality of pairs of first fin-type active regions in the first device region, each of the plurality of pairs of first fin-type active regions including a first member and a second member, each of the plurality of pairs of first fin-type active regions vertically protruding from the substrate at the first device region, and each of the plurality of pairs of first fin-type active regions having the first member spaced apart from second member with the first fin separation insulating portion therebetween, each of the plurality of pairs having the first member collinearly extending with the second member in a first horizontal direction;
- a plurality of second fin separation insulating portions extending in a second horizontal direction over the second device region and spaced apart from each other, wherein the second horizontal direction crosses the first horizontal direction; and
- a plurality of second fin-type active regions vertically protruding from the substrate at the second device region and arranged in a straight line extending in the first horizontal direction across the plurality of second fin separation insulating portions,
- wherein a vertical level of a lowermost surface of the plurality of second fin separation insulating portions is lower than a vertical level of a lowermost surface of the first fin separation insulating portion.

18. The integrated circuit device of claim 17, further comprising:
- a plurality of dummy gate structures over the first fin separation insulating portion extending parallel to each other in the second horizontal direction; and
- a gate structure spaced apart from the first fin separation insulating portion in the first horizontal direction and extending parallel to the plurality of dummy gate structures over the first device region,
- wherein a vertical level of an uppermost surface of the plurality of second fin separation insulating portions is higher than a vertical level of an uppermost surface of the gate structure, and the vertical level of the lowermost surface of the plurality of second fin separation insulating portions is lower than the vertical level of the lowermost surface of the first fin separation insulating portion.

19. The integrated circuit device of claim 18, wherein each of the plurality of second fin separation insulating portions contacts one dummy gate structure selected from the plurality of dummy gate structures.

20. The integrated circuit device of claim 18, wherein the first fin separation insulating portion vertically overlaps at least three dummy gate structures from among the plurality of dummy gate structures.

* * * * *